(12) United States Patent
Hwang et al.

(10) Patent No.: US 11,088,157 B2
(45) Date of Patent: Aug. 10, 2021

(54) THREE-DIMENSIONAL SEMICONDUCTOR DEVICE HAVING STEPPED GATE ELECTRODES

(71) Applicant: SAMSUNG ELECTRONICS CO., LTD., Suwon-si (KR)

(72) Inventors: Sung Min Hwang, Hwaseong-si (KR); Joon Sung Lim, Seongnam-si (KR); Bum Kyu Kang, Suwon-si (KR); Jae Ho Ahn, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1 day.

(21) Appl. No.: 16/543,535

(22) Filed: Aug. 17, 2019

(65) Prior Publication Data
US 2020/0135749 A1    Apr. 30, 2020

(30) Foreign Application Priority Data

Oct. 25, 2018  (KR) .................. 10-2018-0128403

(51) Int. Cl.
*H01L 27/11556*  (2017.01)
*H01L 23/535*  (2006.01)
*G11C 16/04*  (2006.01)

(52) U.S. Cl.
CPC ...... *H01L 27/11556* (2013.01); *H01L 23/535* (2013.01); *G11C 16/0483* (2013.01)

(58) Field of Classification Search
CPC . H01L 23/535; H01L 23/528; H01L 23/5226; H01L 27/11565; H01L 27/11575; H01L 27/11556; H01L 27/11582; H01L 27/11524; H01L 27/1157; H01L 27/11578
See application file for complete search history.

(56) References Cited

U.S. PATENT DOCUMENTS

| | | |
|---|---|---|
| 9,419,009 B1 | 8/2016 | Oh et al. |
| 9,515,084 B2 | 12/2016 | Oh et al. |
| 9,853,051 B1 | 12/2017 | Lee |
| 2012/0061744 A1 | 3/2012 | Hwang et al. |
| 2014/0197546 A1 | 7/2014 | Hwang et al. |
| 2017/0317088 A1 | 11/2017 | Lee |
| 2018/0026047 A1 | 1/2018 | Park et al. |
| 2018/0261618 A1 | 9/2018 | Lee et al. |
| 2018/0301372 A1 | 10/2018 | Noh |
| 2019/0019807 A1* | 1/2019 | Gu ................ H01L 27/11524 |

OTHER PUBLICATIONS

Indian Office Action dated Mar. 18, 2021 cited in Indian Application No. 201924031459.

\* cited by examiner

*Primary Examiner* — Kyoung Lee
*Assistant Examiner* — Christina A Sylvia
(74) *Attorney, Agent, or Firm* — Volentine, Whitt & Francos, PLLC

(57) ABSTRACT

A three-dimensional semiconductor device includes a first gate group on a lower structure and a second gate group on the first gate group. The first gate group includes first pad regions that are: (1) lowered in a first direction that is parallel to an upper surface of the lower structure and (2) raised in a second direction that is parallel to an upper surface of the lower structure and perpendicular to the first direction. The second gate group includes second pad regions that are sequentially raised in the first direction and raised in the second direction.

20 Claims, 51 Drawing Sheets

THREE-DIMENSIONAL SEMICONDUCTOR DEVICE HAVING STEPPED GATE ELECTRODES

CROSS-REFERENCE TO RELATED APPLICATION

This application claims benefit of priority to Korean Patent Application No. 10-2018-0128403 filed on Oct. 25, 2018 in the Korean Intellectual Property Office, the disclosure of which is incorporated herein by reference in its entirety.

BACKGROUND

1. Field

The present disclosure relates to a semiconductor device, and more particularly to a three-dimensional semiconductor device including a stacked structure having a stepped structure.

2. Description of Related Art

In order to increase the price competitiveness of products, there is a growing demand for improvements in the degree of integration of three-dimensional semiconductor devices. In order to improve the degree of integration of three-dimensional semiconductor devices, semiconductor devices having a three-dimensional structure in which gates are stacked on a substrate in a vertical direction have been developed.

SUMMARY

An aspect of the present disclosure is to provide a three-dimensional semiconductor device capable of improving the degree of integration thereof.

A three-dimensional semiconductor device according to an aspect of the present disclosure is provided. The three-dimensional semiconductor device includes a lower structure; a stacked structure disposed in a first region and a second region on the lower structure, the stacked structure including gate patterns stacked in a vertical direction, perpendicular to an upper surface of the lower structure, the gate patterns including pad regions disposed in a stepped structure in the second region; and vertical channel structures disposed on the lower structure in the vertical direction and having a side surface facing the gate patterns. The stacked structure includes a first stacked region, a second stacked region and a third stacked region that are sequentially arranged in the second region in a first direction, the first stacked region including a first stepped region, having a stepped structure changing in a unit of a first height, the second stacked region including a second stepped region, having a stepped structure, lowered in a unit of a second height, greater than the first height in the first direction, the third stacked region includes an upwardly stepped region and a downwardly stepped region, the upwardly stepped region of the third stacked region has a stepped structure raising in a unit of the second height in the first direction, and the downwardly stepped region of the third stacked region has a stepped structure lowered in a unit of the second height in the first direction.

A three-dimensional semiconductor device according to an aspect of the present disclosure is provided. The three-dimensional semiconductor device includes a lower structure; a stacked structure disposed on the lower structure, and including gate patterns stacked in a vertical direction, perpendicular to an upper surface of the lower structure; and vertical channel structures disposed on the lower structure and having a side surface facing the gate patterns. The stacked structure includes an upwardly stepped region in which pad regions that are raised in a first direction are positioned, and a downwardly stepped region in which pad regions lowered in the first direction are positioned, the upwardly stepped region and the downwardly stepped region are sequentially arranged in the first direction, the upwardly stepped region comprises a first upwardly stepped region and a second upwardly stepped region, positioned on different height levels and are sequentially arranged in a second direction, the downwardly stepped region includes a first downwardly stepped region and a second downwardly stepped region, positioned on different height levels and are sequentially arranged in the second direction, and the second direction is parallel to an upper surface of the lower structure and perpendicular to the first direction.

A three-dimensional semiconductor device according to an aspect of the present disclosure is provided. The three-dimensional semiconductor device includes a first gate group on a lower structure; and a second gate group on the first gate group. The first gate group includes first pad regions lowered in a first direction, parallel to an upper surface of the lower structure and that are raised in a second direction, parallel to an upper surface of the lower structure and perpendicular to the first direction, and the second gate group includes second pad regions that are sequentially raised in the first direction and are raised in the second direction.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present disclosure will be described with reference to the accompanying drawings.

Figure 1A:
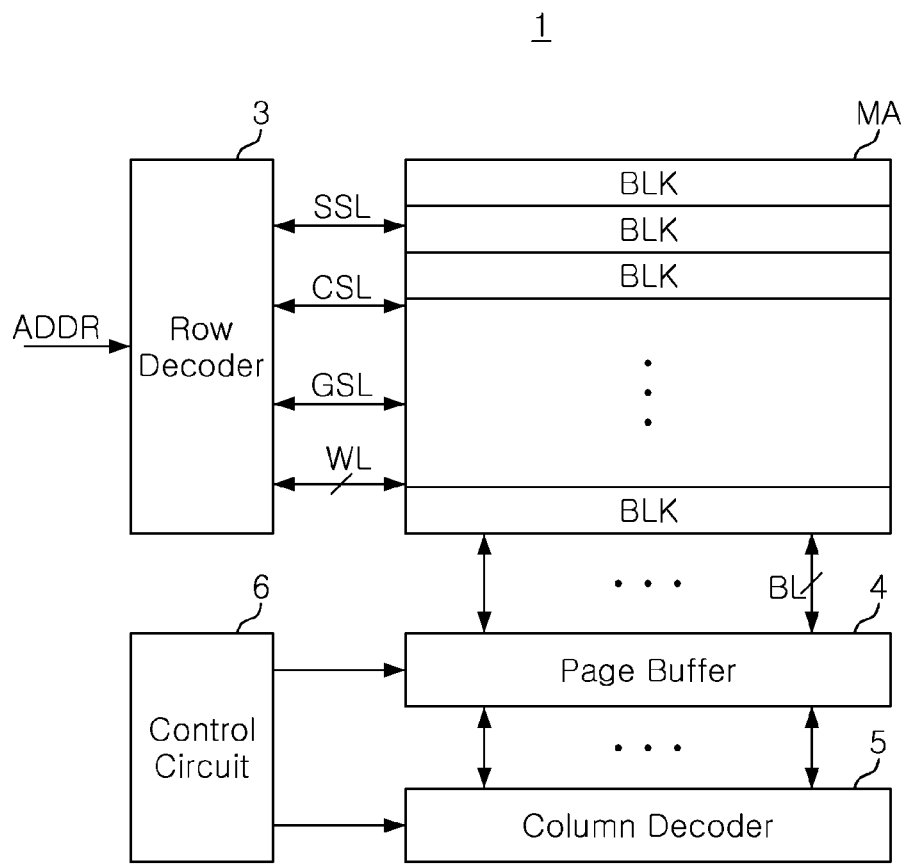
FIG. 1A is a schematic block diagram of a three-dimensional semiconductor device according to an example embodiment.

An exemplary embodiment of a three-dimensional semiconductor device according to an embodiment of the present disclosure will be described with reference to FIG. 1A. FIG. 1A is a schematic block diagram of a three-dimensional semiconductor device according to an embodiment of the present disclosure.

Referring to FIG. 1A, a three-dimensional semiconductor device 1 according to an embodiment of the present disclosure may include a memory array area MA, a row decoder 3, a page buffer 4, a column decoder 5, and a control circuit 6. The memory array area MA may include memory blocks BLK.

The memory array area MA may include memory cells arranged in a plurality of rows and columns. The memory cells included in the memory array area MA may include word lines WL, at least one common source line CSL, string select lines SSL, at least one ground select line GSL, and the like, and may be electrically connected to the page buffer 4 and the column decoder 5 through the bit lines BL.

In one embodiment, among the memory cells, the memory cells arranged in the same row may be connected to the same word line WL, and the memory cells arranged in the same column may be connected to the same bit line BL.

The row decoder 3 may be commonly connected to the memory blocks BLK, and may provide a driving signal to the word lines WL of the memory blocks BLK selected according to a block selection signal. For example, the row decoder 3 may receive address information ADDR from an external source and decode the received address information ADDR, to determine a voltage supplied to at least a portion of the word lines WL, the common source line CSL, the string select lines SSL, and the ground select line GSL, electrically connected to the memory blocks BLK.

The page buffer 4 may be electrically connected to the memory array area MA through the bit lines BL. The page buffer 4 may be connected to a bit line BL selected according to an address decoded from the column decoder 5. The page buffer 4 may temporarily store data to be stored in the memory cells, or sense data stored in the memory cells, according to an operating mode. For example, the page buffer 4 may operate as a writing driver circuit in a program operating mode, and as a sense amplifier circuit in a read operating mode. The page buffer 4 may receive power (e.g., voltage or current) from the control logic, and may provide the same to a selected bit line BL.

The column decoder 5 may provide a data transmission path between the page buffer 4 and an external device (for example, a memory controller). The column decoder 5 may decode an externally input address to select any one of the bit lines BL.

The column decoder 5 may be commonly connected to the memory blocks BLK and may provide data information to the bit lines BL of the selected memory block BLK according to a block selection signal.

The control circuit 6 may control the overall operation of the three-dimensional semiconductor device 1. The control circuit 6 may receive a control signal and an external voltage and may operate according to the received control signal. The control circuit 6 may include a voltage generator that generates voltages necessary for internal operations (e.g., program voltage, read voltage, erase voltage, etc.) using an external voltage. The control circuit 6 may control read, write, and/or erase operations in response to control signals.

Figure 1B:
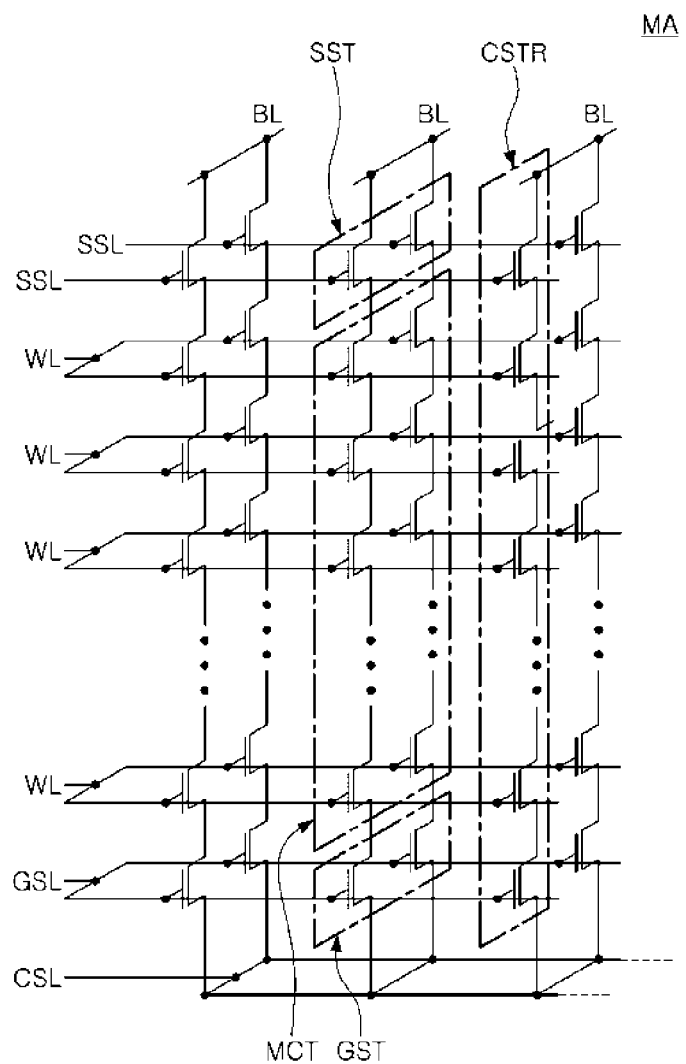
FIG. 1B is a circuit diagram conceptually illustrating a memory array region of a three-dimensional semiconductor device according to an example embodiment.

An exemplary embodiment of a circuit arranged in the memory array region (MA in FIG. 1A) of the three-dimensional semiconductor device 1 described in FIG. 1A will be described with reference to FIG. 1B. FIG. 1B is a circuit diagram conceptually illustrating a memory array region (MA in FIG. 1A) of a three-dimensional semiconductor device according to an embodiment of the present disclosure.

Referring to FIGS. 1A and 1B, a three-dimensional semiconductor device according to an embodiment of the present disclosure may include a common source line CSL, bit lines BL, and a plurality of cell strings CSTR arranged between the common source line CSL and the bit lines BL. The common source line CSL, the bit lines BL, and the plurality of cell strings CSTR may be arranged in a memory array area MA.

The plurality of cell strings CSTR may be connected to each of the bit lines BL in parallel. The plurality of cell strings CSTR may be connected to the common source line CSL in common. Each of the plurality of cell strings CSTR may include a lower selection transistor GST, memory cells MCT and an upper selection transistor SST, which may be connected in series.

The memory cells MCT may be connected between the lower selection transistor GST and the upper selection transistor SST in series. Each of the memory cells MCT may include data storage regions, which may store information.

The upper selection transistor SST may be electrically connected to the bit lines BL, and the lower selection transistor GST may be electrically connected to the common source line CSL.

The upper selection transistors SST may be arranged in plural and may be controlled by string select lines SSL. The memory cells MCT may be controlled by a plurality of word lines WL.

The lower selection transistor GST may be controlled by a ground select line GSL. The common source line CSL may be connected to a source of the lower select transistor GST in common.

In an exemplary embodiment, the upper selection transistor SST may be a string select transistor, and the lower selection transistor GST may be a ground select transistor.

Figure 2:
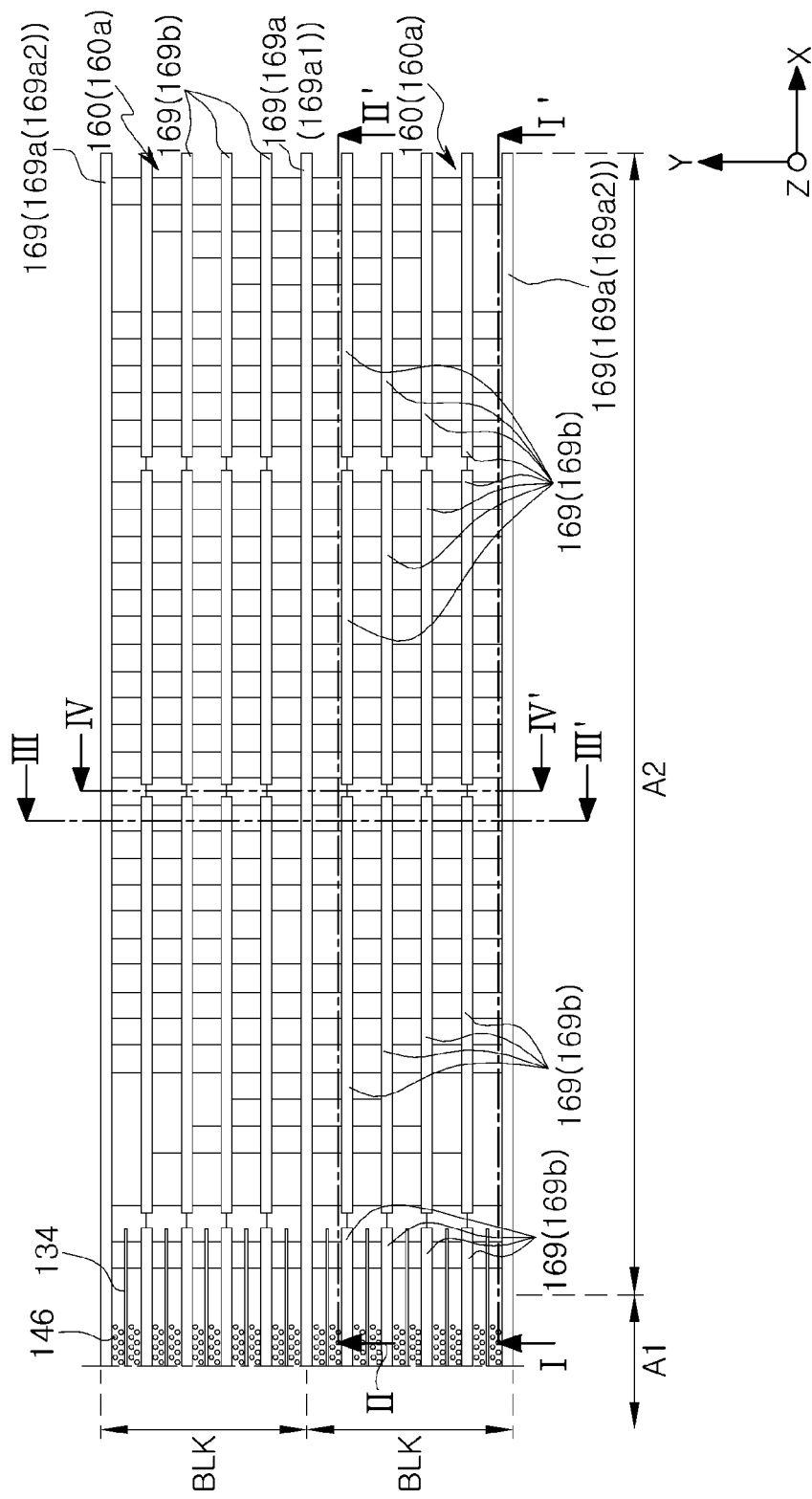
FIGS. 2 to 5B and FIGS. 6A to 9 are views illustrating an exemplary embodiment of a three-dimensional semiconductor device according to an example embodiment.
Figure 3A:
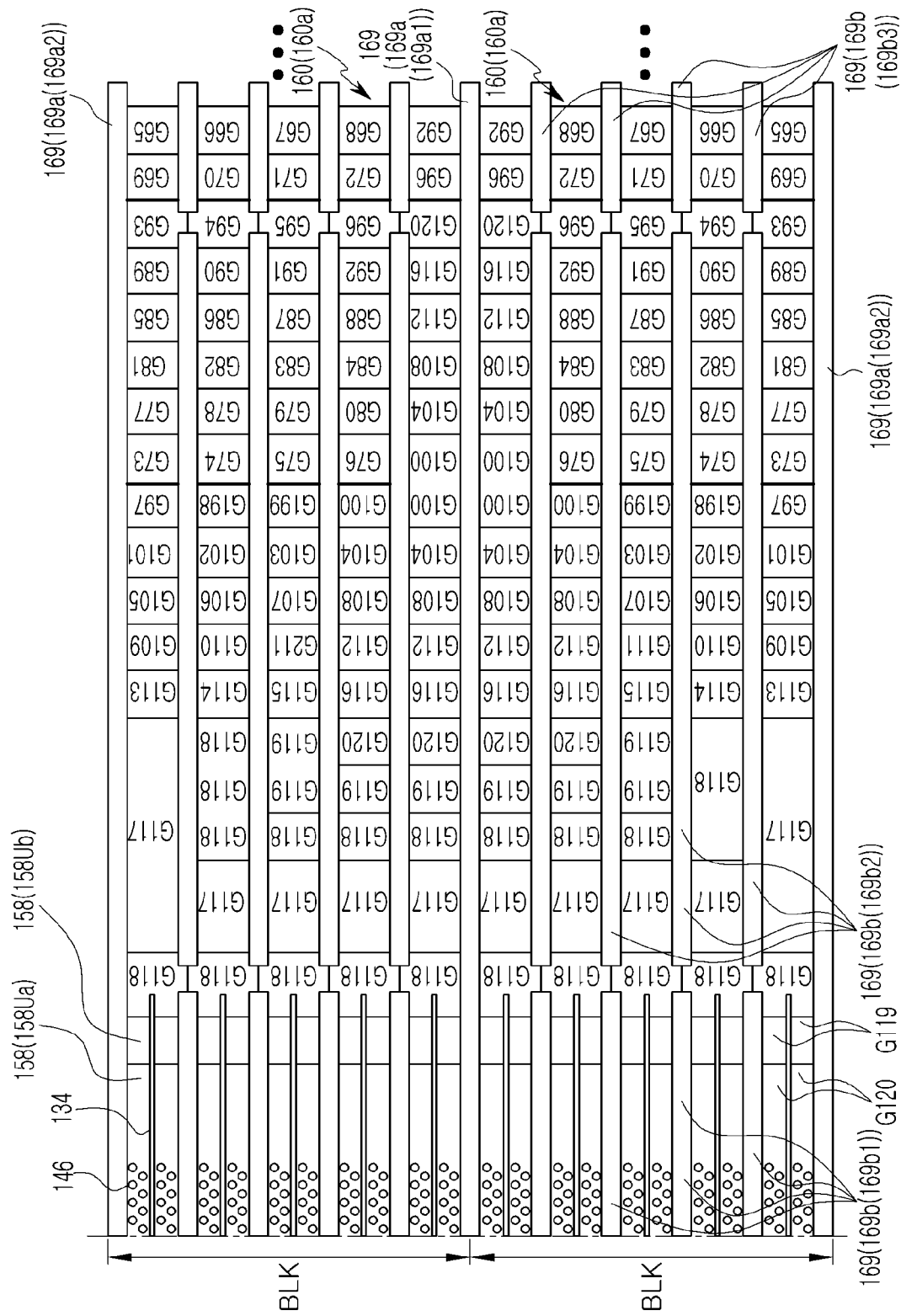
Figure 3B:
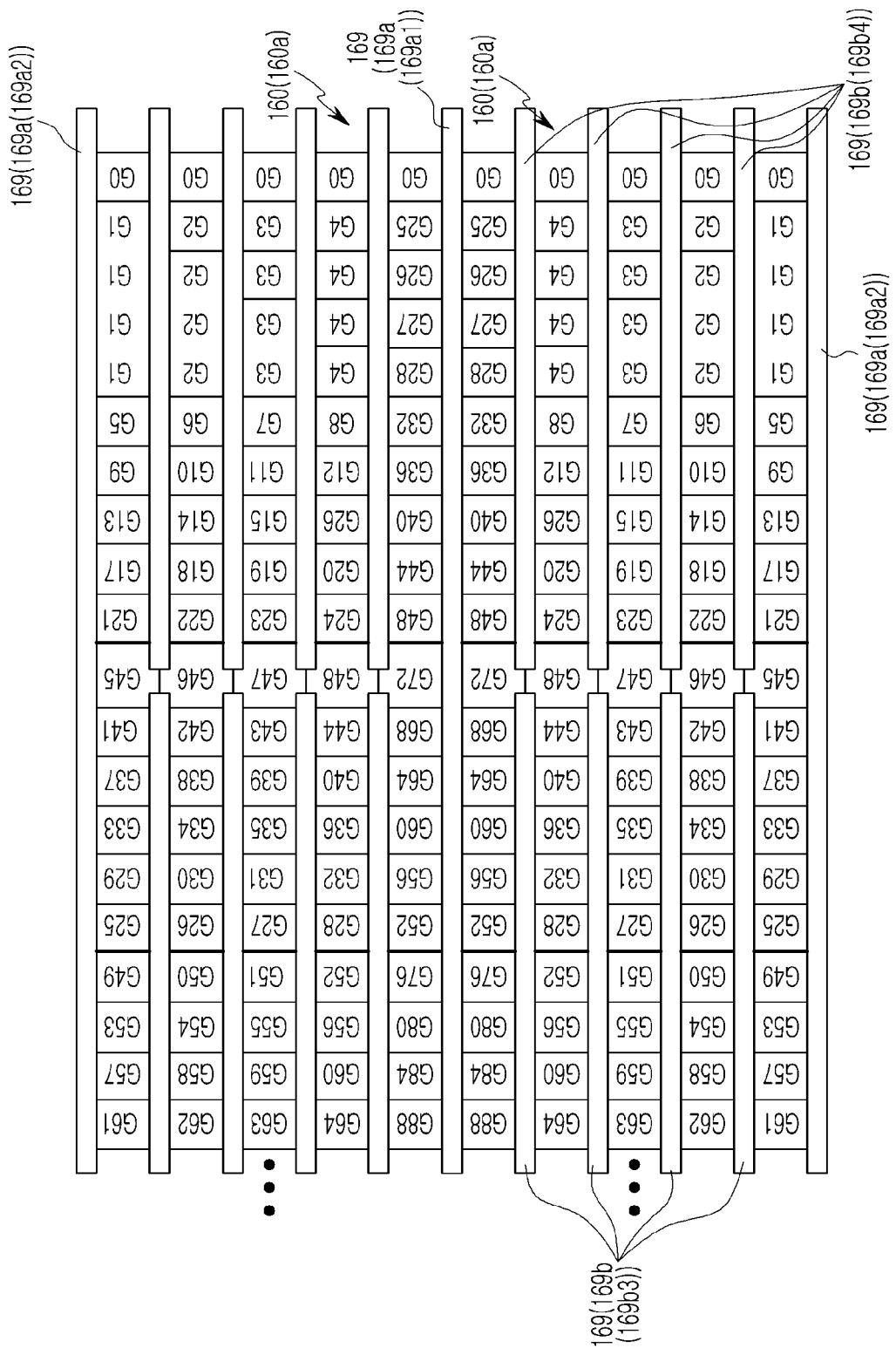
Figure 4A:
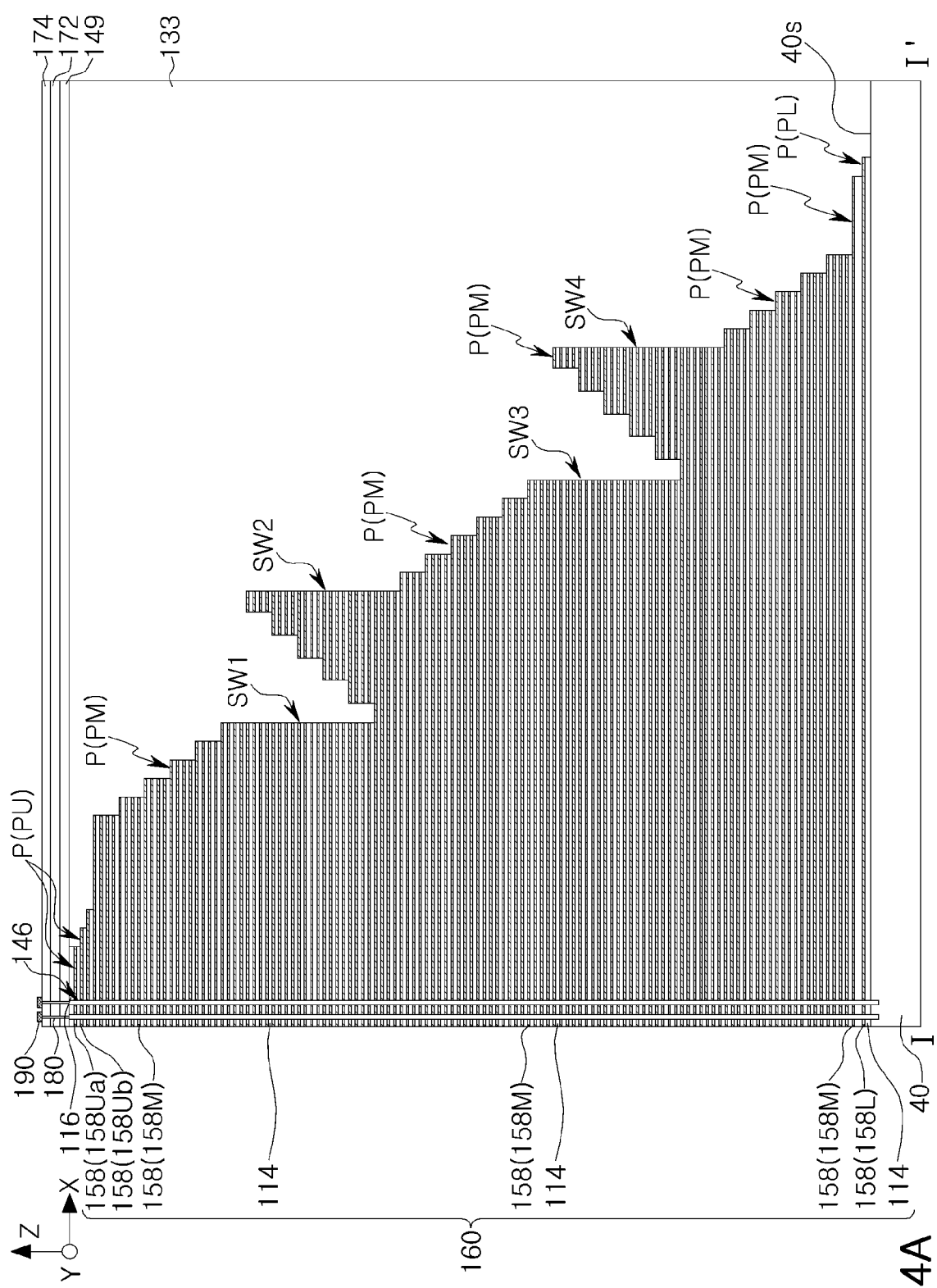
Figure 4B:
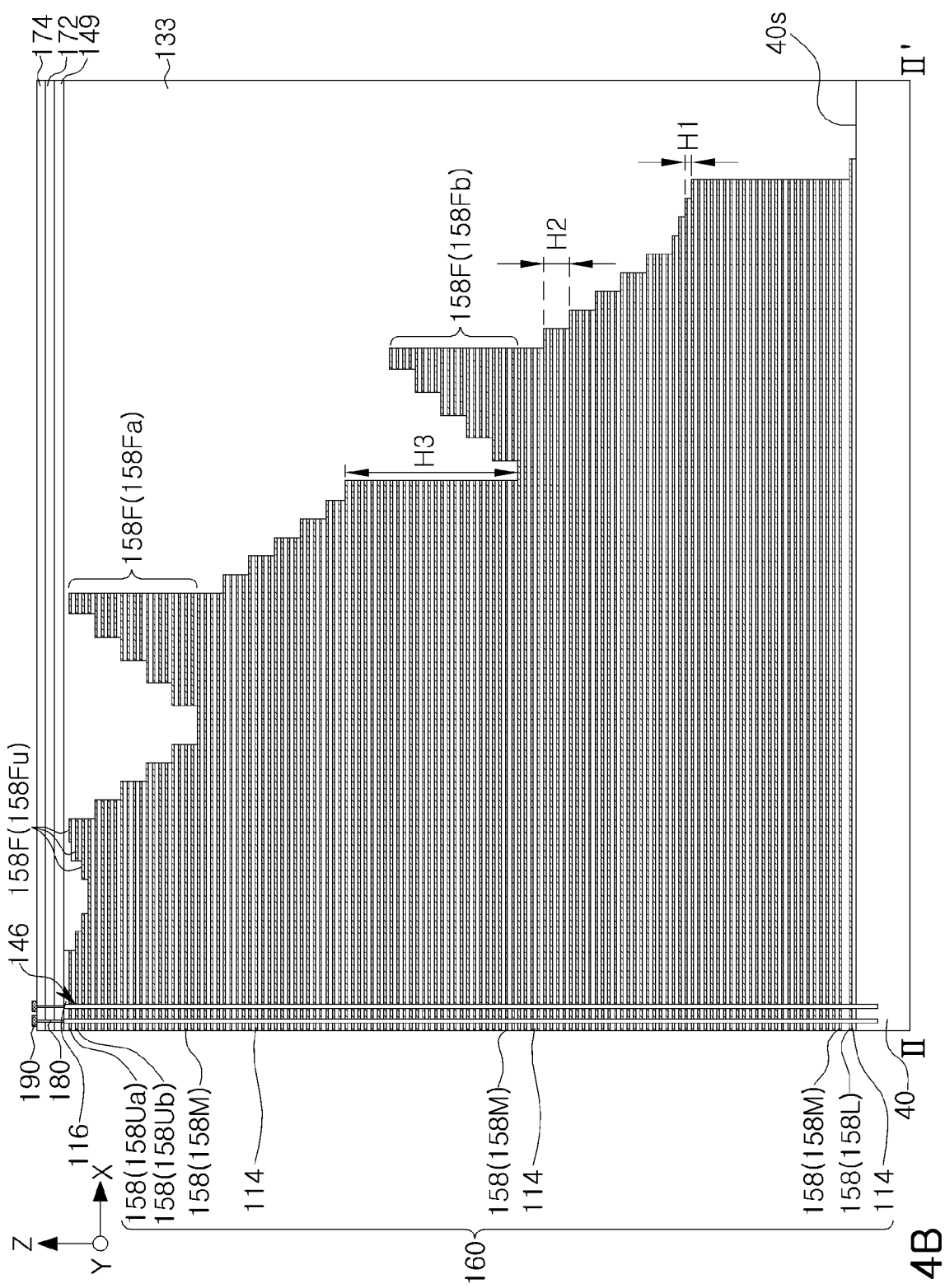
Figure 4C:
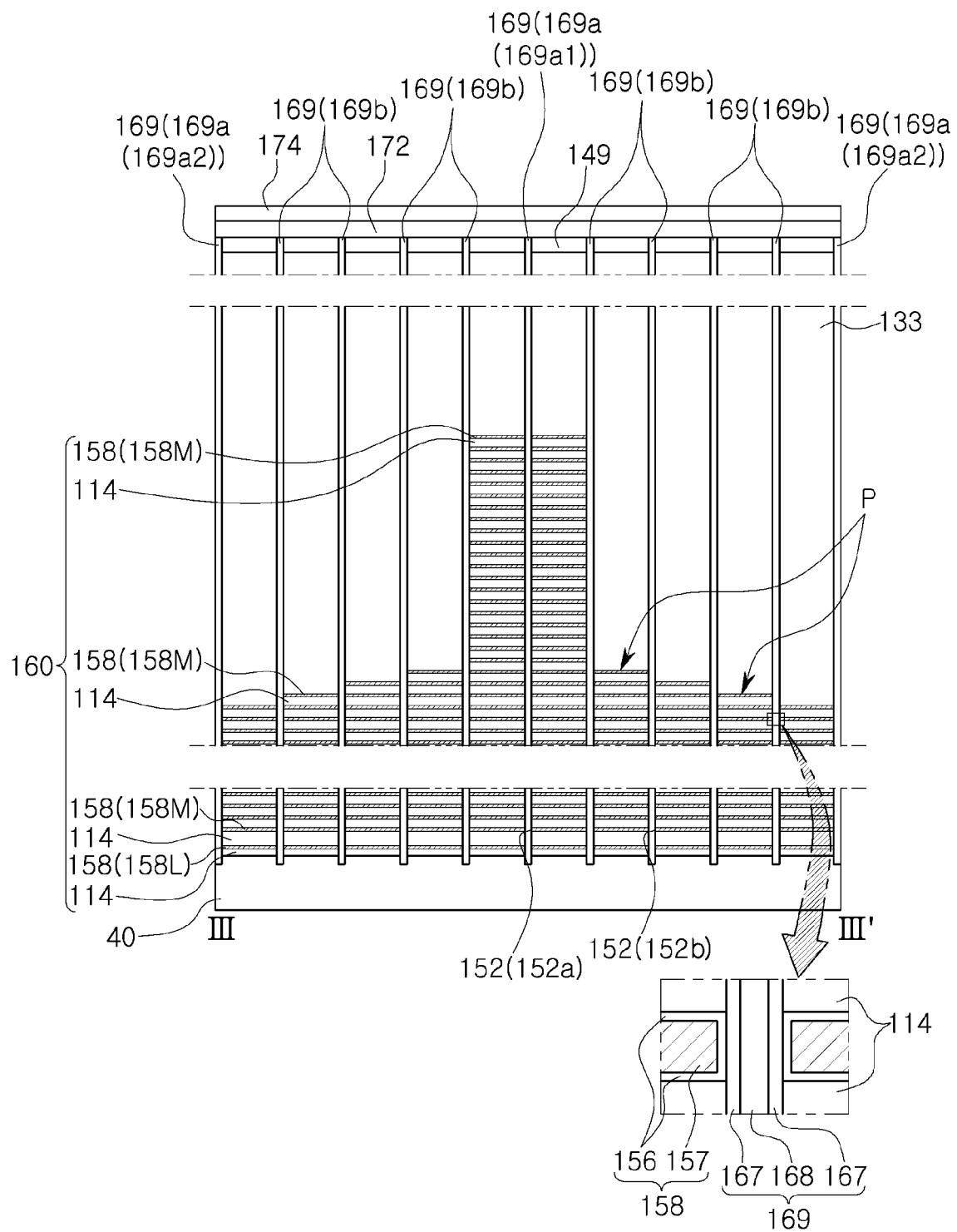
Figure 4D:
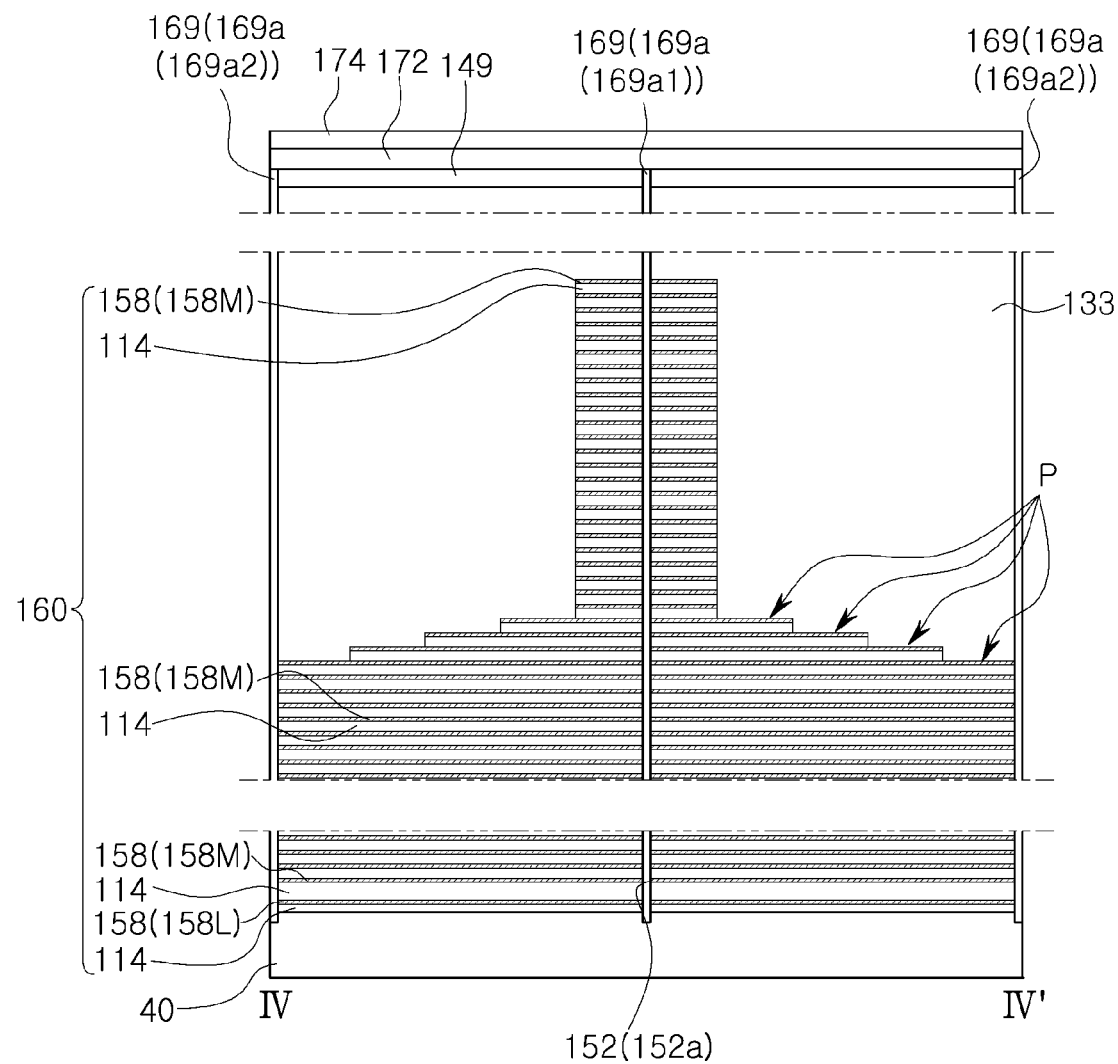

Next, an exemplary embodiment of a three-dimensional semiconductor device according to an embodiment of the present disclosure will be described with reference to FIGS. 2, 3A, 3B, and 4A to 4D. In FIGS. 2 to 4D, FIG. 2 is a conceptual plan view illustrating a three-dimensional semiconductor device according to an embodiment of the present disclosure, FIGS. 3A and 3B are plan views illustrating a portion of FIG. 2, FIG. 4A is a cross-sectional view illustrating a region taken along line I-I' in FIG. 2, FIG. 4B is a cross-sectional view illustrating a region taken along line II-II' in FIG. 2, FIG. 4C is a cross-sectional view illustrating a region taken along line III-III' in FIG. 2, and FIG. 4D is a cross-sectional view illustrating a region taken along line IV-IV' in FIG. 2.

Referring to FIGS. 2 to 4D, a stacked structure 160 including gate patterns 158 may be disposed on a lower structure 40. The lower structure 40 may include a semiconductor substrate. The stacked structure 160 may be disposed in a first region A1 and a second region A2 adjacent to the first region A1 on the lower structure 40. The gate patterns 158 may be stacked to be spaced apart from each other in a vertical direction Z, perpendicular to an upper surface 40s of the lower structure 40.

The stacked structure 160 may further include interlayer insulation layers 114 which are alternately and repeatedly stacked, together with the gate patterns 158. The interlayer insulation layers 114 may be formed of silicon oxide.

In the gate patterns 158, a portion thereof may constitute the above-described ground select lines (GSL in FIGS. 1A and 1B), a portion thereof may constitute the above-described word lines (WL in FIGS. 1A and 1B), a portion thereof may constitute the above-described string select lines (SSL in FIGS. 1A and 1B), and a portion thereof may be dummy gate patterns and floating gate patterns.

The gate patterns 158 may include lower gate patterns 158L, intermediate gate patterns 158M, upper gate patterns 158Ua and 158Ub, arranged in the first region A1 and extending into the second region A2, and floating gate patterns 158F, spaced apart from the first region A1 and disposed in the second region A2.

The intermediate gate patterns 158M may be disposed on the lower gate pattern 158L, and the upper gate patterns 158Ua and 158Ub may be disposed on the intermediate gate patterns 158M. The floating gate patterns 158F in the second region A2 may be disposed on the intermediate gate patterns 158M, may be spaced apart from other gate patterns 158L, 158M, 158Ua, and 158Ub, and may be electrically insulated.

The floating gate patterns 158F may include upper floating gate patterns 158Fu having a stepped shape that are raised in a unit of a first height H1, first floating gate patterns 158Fa positioned on a lower height level than the upper floating gate patterns 158Fu and having a stepped structure that are raised in a unit of a second height H2 greater than the first height H1, and second floating gate patterns 158Fb positioned on a lower height level than the first floating gate patterns 158Fa and having a stepped structure that are raised in a unit of the second height H2.

In the exemplary embodiment, the lower gate pattern 158L may constitute the ground select line (GSL in FIGS. 1A and 1B) described above, and a portion of the intermediate gate patterns 158M may constitute the word lines (WL in FIGS. 1A and 1B), and the upper gate patterns 158Ua and 158Ub may constitute the string select lines (SSL in FIGS. 1A and 1B).

Among the intermediate gate patterns 158M, an intermediate gate pattern adjacent to the lower gate pattern 158L may be a dummy gate, an intermediate gate pattern adjacent to the upper gate patterns 158Ua and 158Ub may be a dummy gate, and remaining intermediate gate patterns may be the word lines (WL in FIGS. 1A and 1B). The upper gate patterns 158Ua and 158Ub may include a first upper gate pattern 158Ua and a second upper gate pattern 158Ub in a position lower than a position of the first upper gate pattern 158Ua.

The gate patterns 158 may have pad regions P disposed in a stepped structure in the second region A2. In the second region A2, the pad regions P may be regions of the gate patterns 158 not overlapping other gate patterns positioned at a relatively upper portion, or regions of the gate patterns 158 without other gate patterns at an upper portion thereof. Among the pad regions P of the gate patterns 158, pad regions of the gate patterns, which may be the above-described ground select line (GSL in FIGS. 1A and 1B), the word lines (WL in FIGS. 1A and 1B), and the string select lines (SSL in FIGS. 1A and 1B), may be pad regions to which an electrical signal may be applied, and pad regions of the above-described dummy gate patterns and the floating gate patterns 158F may be pad regions to which no electrical signal is applied.

The first region A1 may be a memory array region (MA in FIG. 1A) in which the memory cells (MCT in FIG. 1B) and the plurality of cell strings (CSTR in FIG. 1B) are arranged. The gate patterns 158, which may be the ground select line (GSL in FIGS. 1A and 1B), the word lines (WL in FIGS. 1A and 1B), and the string select lines (SSL in FIGS. 1A and 1B) may be disposed in the first region A1 and may extend into the second region A2.

Throughout the description and the claims, the first region A1 may be replaced with a 'memory array region' and the second region A2 may be replaced with an 'extended region' or a 'stepped region' etc.

A first capping insulation layer 116 and a second capping insulation layer 133 may be disposed on a substrate having the stacked structure 160. The first and second capping insulation layers 116 and 133 may have upper surfaces positioned on substantially the same level. The first capping insulation layer 116 may overlap the first upper gate pattern 158Ua positioned at the uppermost position among the upper gate patterns 158Ua and 158Ub, and the second capping insulation layer 133 may cover a portion of the stacked structure 160, positioned outside of the first upper gate pattern 158Ua.

Vertical channel structures 146 passing through the stacked structure 160 may be disposed on the lower structure 40. The vertical channel structures 146 may pass through the stacked structure 160 and extend in an upward direction to pass through the first capping insulation layer 116. The vertical channel structures 146 may have a side surface facing the gate patterns 158.

A third capping insulation layer 149, a fourth capping insulation layer 172, and a fifth capping insulation layer 174, which are sequentially stacked on the first and second capping insulation layers 116 and 133, may be disposed. The first to fifth capping insulation layers 116, 133, 149, 172, and 174 may be formed of an insulating material such as silicon oxide or the like.

Separation structures 169 passing through the stacked structure 160 may be disposed on the lower structure 40. The separation structures 169 may pass through the third capping insulation layer 149 and extend in a downward direction to pass through the stacked structure 160.

The separation structures 169 may have a linear shape extending in a first direction X. The first direction X may be parallel to the upper surface 40s of the lower structure 40 and may be a direction from the first region A1 to the second region A2.

The separation structures 169 may include block separation structures 169a and dummy separation structures 169b. The separation structures 169 may be disposed in separation trenches 152 passing through the stacked structure 160 and exposing the lower structure 40. For example, the block separation structures 169a may be disposed in block separation trenches 152a, and the dummy separation structures 169b may be disposed in dummy separation trenches 152b.

Throughout the specification and claims, the term 'block' of the block separation structures 169a and the term 'dummy' of the dummy separation structures 169b may be used to distinguish components from each other. The present disclosure is not limited by expressions such as 'block' and 'dummy' For example, throughout the specification and claims, the block separation structures 169a and the dummy separation structures 169b may be replaced with and referred to by the expressions 'first separation structures 169a' and 'second separation structures 169b,' respectively.

The block separation structures 169a may cross the first region A1 and the second region A2. Therefore, the block separation structures 169a may space apart or separate the memory blocks BLK described above from each other. The block separation structures 169a may include a first block separation structure 169a1 and second block separation structures 169a2. The first block separation structure 169a1 may be disposed between the second block separation structures 169a2.

The stacked structure 169 may be separated in the second direction Y by the block separation structures 169a. For example, the stacked structure 160 may include a first stacked structure 160a and a second stacked structure 160b positioned on both side surfaces of the first block separation structure 169a1. The first stacked structure 160a and the second stacked structure 160b may be mirror-symmetrical with respect to the first block separation structure 169a1.

Each of the dummy separation structures 169b may be disposed in the memory blocks BLK and may have a shorter length than each of the block separation structures 169a. The block separation structures 169a and the dummy separation structures 169b may be formed of the same material and may have upper surfaces of the same height.

Between the pair of neighboring block separation structures 169a, for example, between the first and second block separation structures 169a1 and 169a2, the dummy separation structures 169b may have opposing end portions, and may include a plurality of separation portions 169b1, 169b2, 169b3, and 169b4, which may be spaced apart from each other.

Portions of the gate patterns 158 of the stacked structure 160 between the neighboring first and second block separation structures 169a1 and 169a2 may be separated by the dummy separation structures 169b in the second direction Y. The portions of the gate patterns 158 separated in this way may be connected to each other between the opposing end portions of the dummy separation structures 169b. Between the neighboring first and second block separation structures 169a1 and 169a2, each of the intermediate gate patterns 158M, which may be the word lines (WL in FIGS. 1A and 1B), among the gate patterns 158 may include line portions separated by the dummy separation structures 169b in the second direction Y, and connection portions positioned between the dummy separation structures 169b and connecting the line portions.

The second direction Y may be parallel to the upper surface 40s of the lower structure 40, and may be perpendicular to the first direction X.

The dummy structures 169b may include first separation portions 169b1 that may cross the first region A1 and may extend into a portion of the second region A2, and second separation portions 169b2, third separation portions 169b3, and fourth separation portions 169b4 that may be disposed in the second region A2. The first separation portions 169b1 and the second separation portions 169b2 may have opposing end portions and may be spaced apart from each other. The second separation portions 169b2 and the third separation portions 169b3 may have opposing end portions and may be spaced apart from each other. The third separation portions 169b3 and the fourth separation portions 169b4 may have opposing end portions and may be spaced apart from each other.

The block separation structures 169a and the dummy separation structures 169b may be formed of the same material and the same structure. For example, each of the block separation structures 169a and the dummy separation structures 169b may include a separation pattern (168 in FIG. 4C), and separation spacers (167 in FIG. 4C) on the side surfaces of the separation pattern 168. The separation pattern 168 may be formed of one or more among doped silicon, metal nitride (e.g., TiN), and metal (e.g., W). The separation spacers 167 may be formed of any one of silicon oxide and silicon nitride, or a combination thereof.

In an exemplary embodiment, insulating patterns 134 may be disposed on the intermediate gate patterns 158M and may pass through the upper gate patterns 158Ua and 158Ub. The insulating patterns 134 may be disposed between the separation structures 169.

Bit lines 190 may be disposed on the fifth capping insulation layer 174. Bit line contact plugs 180 electrically connecting the bit lines 190 and the vertical channel structures 146 may be disposed between the bit lines 190 and the vertical channel structures 146.

Figure 5A:
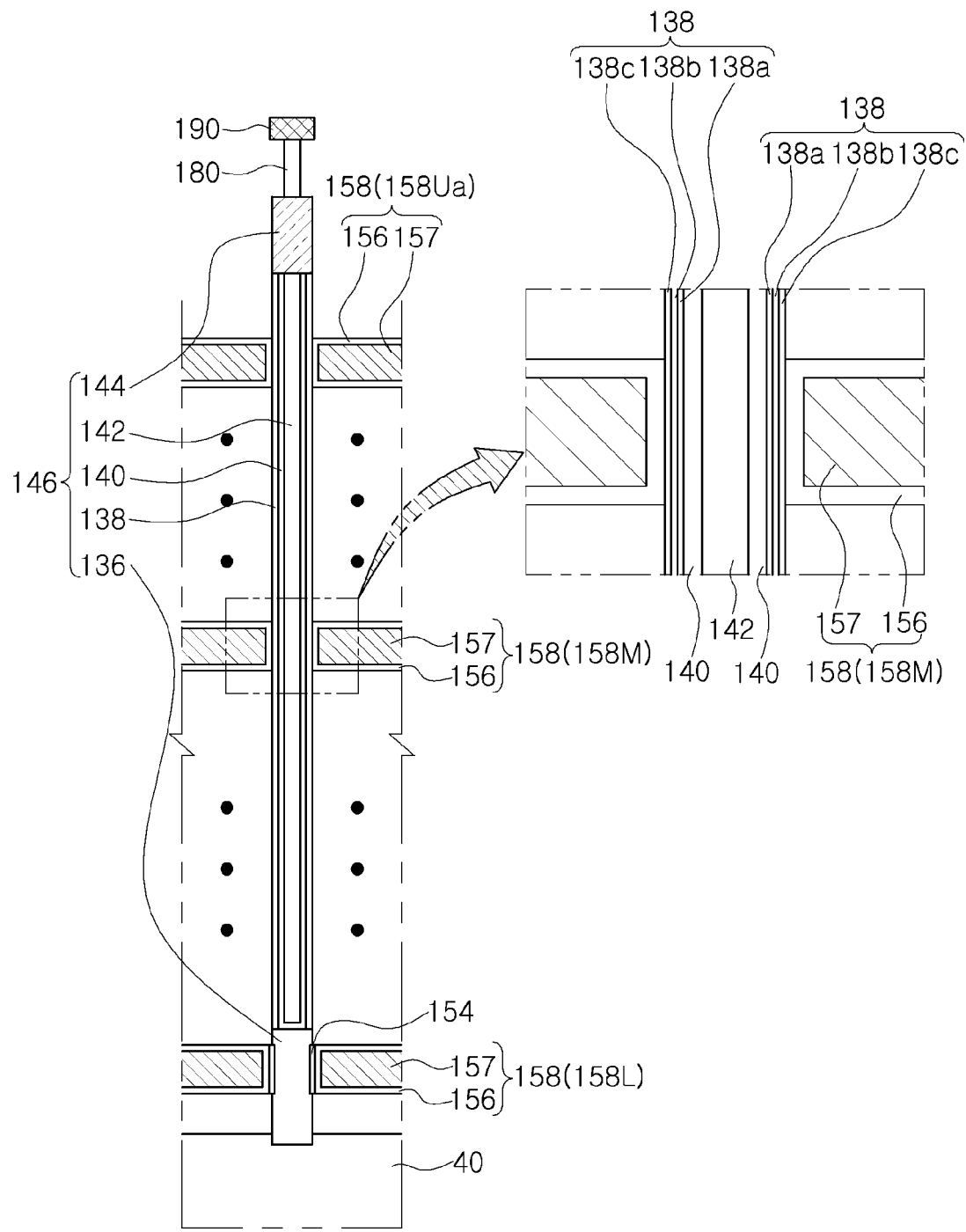
FIG. 5C is a view illustrating a modified embodiment of the three-dimensional semiconductor device according to an example embodiment.
FIG. 5D is a view illustrating a modified embodiment of the three-dimensional semiconductor device according to an example embodiment.

Exemplary embodiments of the above-described vertical structures 146 will be described with reference to FIG. 5A. FIG. 5A is a conceptual cross-sectional view illustrating a vertical channel structure 146 among the vertical channel structures 146, and the first upper gate pattern 158Ua, the one intermediate gate pattern 158M, and the lower gate pattern 158L among the gate patterns 158.

Referring to FIG. 5A, the vertical channel structure 146 may include a vertical channel semiconductor layer 140, and a gate dielectric structure 138 disposed between the vertical channel semiconductor layer 140 and the gate patterns 158.

The vertical channel structure 146 may further include a semiconductor pattern 136, a vertical core pattern 142 on the semiconductor pattern 136, and a pad pattern 144 on the vertical core pattern 142.

The vertical channel semiconductor layer 140 may be disposed to contact the semiconductor pattern 136 and surround an outer surface of the vertical core pattern 142. The gate dielectric structure 138 may be disposed to surround an outer surface of the vertical channel semiconductor layer 140. The semiconductor pattern 136 may be an epitaxial material layer that may be formed by a selective epitaxial growth (SEG) process. The vertical core pattern 142 may be formed of an insulating material (e.g., silicon oxide or the like). The pad pattern 144 may be formed of polysilicon having an N-type conductivity. The pad pattern 144 may be disposed on a level higher than the upper gate pattern 158U. The pad pattern 144 of the vertical channel structure 146 may be in contact with and electrically connected to the bit line contact plug 180 described above.

In an exemplary embodiment, the vertical channel semiconductor layer 140 may have a side surface facing the intermediate and upper gate patterns 158M and 158U. The vertical channel structure 146 may pass through the gate patterns 158L, 158M, and 158U.

When the vertical channel structures 146 includes the semiconductor pattern 136, the semiconductor pattern 136 may pass through the lower gate pattern 158L, and the vertical channel semiconductor layer 140 may pass through the intermediate and upper gate patterns 158M and 158U. The vertical channel semiconductor layer 140 may be formed of a polysilicon layer.

In an exemplary embodiment, the semiconductor pattern 136 may be referred to as a channel semiconductor layer. For example, the semiconductor pattern 136 may be referred to as a lower channel semiconductor layer positioned in a relatively lower portion, and the vertical channel semiconductor layer 140 may be referred to as an upper channel semiconductor layer positioned in a relatively upper portion. Therefore, the semiconductor pattern 136 together with the vertical channel semiconductor layer 140 may be referred to as a 'vertical channel semiconductor layer.'

In an exemplary embodiment, an additional dielectric layer 154 may be disposed between the semiconductor pattern 136 and the lower gate pattern 158L. The additional dielectric layer 154 may include silicon oxide.

In an exemplary embodiment, the gate dielectric structure 138 may include a tunnel dielectric layer 138a, a data storage layer 138b, and a blocking dielectric layer 138c.

The data storage layer 138b may be disposed between the tunnel dielectric layer 138a and the blocking dielectric layer 138c. The blocking dielectric layer 138c may be disposed between the data storage layer 138b and the gate patterns 158. The tunnel dielectric layer 138a may be disposed between the data storage layer 138b and the vertical channel semiconductor layer 140.

The tunnel dielectric layer 138a may include silicon oxide and/or impurity doped silicon oxide. The blocking dielectric layer 138c may include silicon oxide and/or a high-k dielectric. The data storage layer 138b may be formed of a material capable of storing data, for example, silicon nitride.

The data storage layer 138b may include regions capable of storing data between the vertical channel semiconductor layer 140 and the intermediate gate patterns 158M, which may be the word lines (WL in FIGS. 1A and 1B). For example, electrons injected from the vertical channel semiconductor layer 140 through the tunnel dielectric layer 138a may be trapped and retained, or the trapped electrons in the data storage layer 138b may be erased, according to operating conditions of a non-volatile memory device such as a flash memory device.

As described above, the regions of the data storage layer 138b (see FIG. 1B) positioned between the intermediate gate pattern 158M and the vertical channel semiconductor layer 140, which may be the word lines (WL in FIG. 1A and FIG. 1B), may be defined as data storage regions, and the data storage regions may constitute the memory cells (MCT in FIG. 3) as described in FIG. 3.

As described above, the intermediate gate patterns 158M, which may be the word lines (WL in FIG. 1A and FIG. 1B), and the areas of the storage layer 138b may be defined as data storage regions, which may constitute the memory cells described in FIG. 1B (MCT in FIG. 1B).

The pad pattern 144 may contact the bit line contact plug 180, and the bit line contact plug 180 may contact the bit line 190. Therefore, the pad pattern 144 of the vertical channel structure 146 may be electrically connected to the bit line 190 through the bit line contact plug 180.

Each of the gate patterns 158 may include a first material layer 156 and a second material layer 157, different from each other.

In an exemplary embodiment, the first material layer 156 may be formed of a dielectric such as aluminum oxide, and the second material layer 157 may be formed of a conductive material including one, or two or more of doped silicon, metal nitride (e.g., TiN), and metal (e.g., W). The first material layer 156 may cover upper and lower surfaces of the second material layer 157 and may extend to a portion of side surfaces of the second material layer 157. The side surfaces of the second material layer 157 facing the separation structures 169 may not be covered by the first material layer 156, as in FIG. 4C.

Figure 5B:
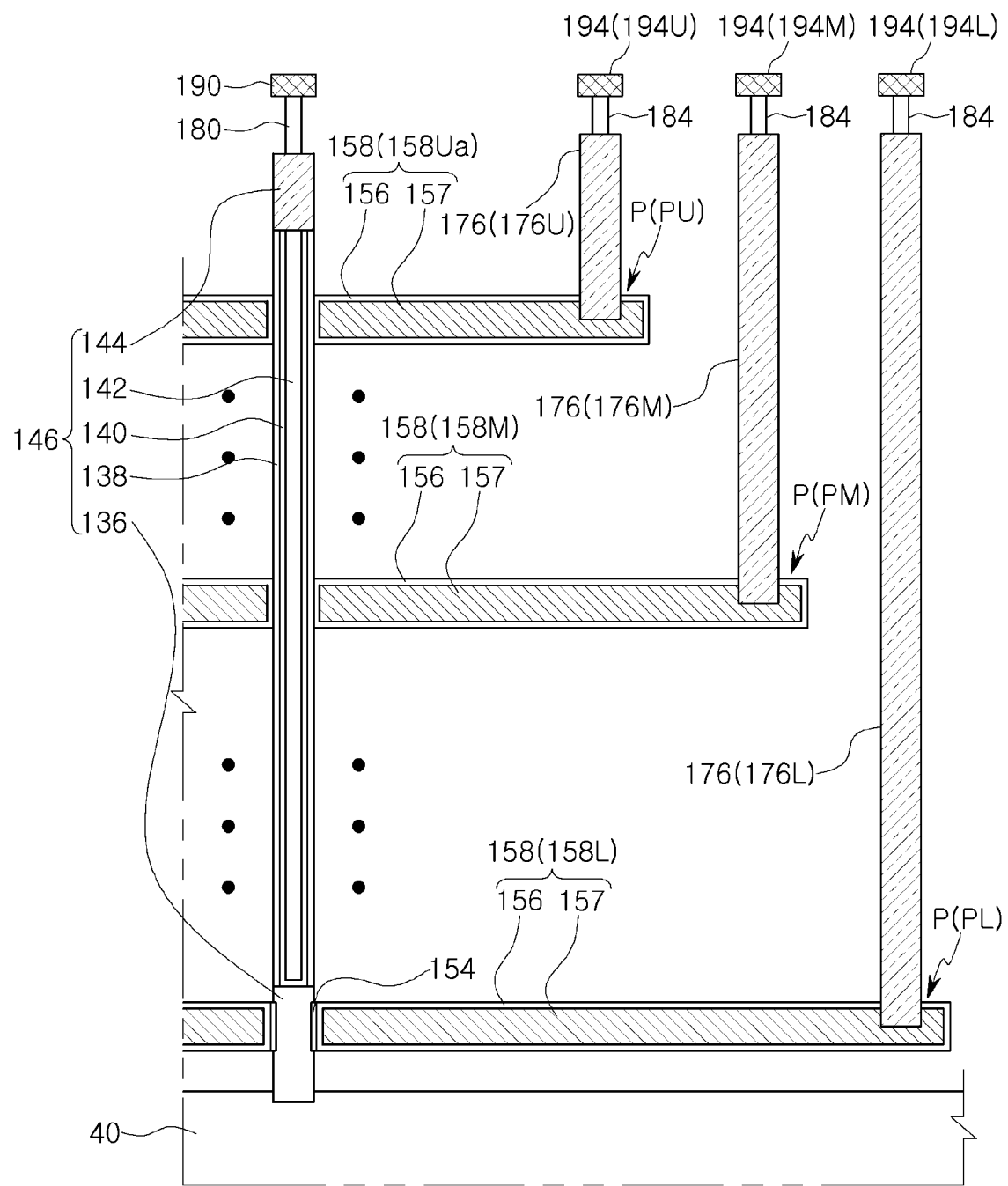

Next, a concept for electrically connecting the gate patterns 158 to the peripheral circuit described in FIG. 1A, for example, the row decoder (3 in FIG. 1A) will be described with reference to FIG. 5B. FIG. 5B is a conceptual cross-sectional view illustrating a connection structure of the first upper gate pattern 158Ua, the one intermediate gate pattern 158M, and the lower gate pattern 158L among the gate patterns 158, as illustrated in FIG. 5A.

Referring to FIG. 5B, the gate patterns 158 may have the pad regions P, which may be arranged in a stepped shape, as described above. For example, the first upper gate pattern 158Ua may have an upper pad region PU, the intermediate gate pattern 158M may have an intermediate pad region PM, and the lower gate pattern 158L may have a lower pad region PL.

Gate contact plugs 176 may be disposed on the pad regions P. For example, an upper gate contact plug 176U may be disposed on the upper pad region PU, an intermediate gate contact plug 176M may be disposed on the intermediate pad region PM, and a lower gate contact plug 176L may be disposed on the lower pad region PL.

Gate connection wiring lines 194 that may be electrically connected to the gate contact plugs 176 may be disposed. For example, an upper gate connection wiring line 194U may be disposed on the upper gate contact plug 176U, an intermediate gate connection wiring line 194M may be disposed on the intermediate gate contact plug 176M, and a lower gate connection wiring line 194L may be disposed on the lower gate contact plug 176L.

Connection plugs 184 electrically connecting the upper gate contact plug 176U and the upper gate connection wiring line 194U, electrically connecting the intermediate gate contact plug 176M and the intermediate gate connection wiring line 194M and electrically connecting the lower gate contact plug 176L and the lower gate connection wiring line 194L may be disposed.

The gate connection wiring line 194 may serve to electrically connect gate patterns, which may be the string select lines (SSL in FIGS. 1A and 1B), the word lines (WL in FIGS. 1A and 1B), and the ground select lines (GSL in FIGS. 1A and 1B), among the gate patterns 158, to the peripheral circuit.

In an exemplary embodiment, the pad regions P may have the same thickness as the other portions of the gate patterns 158, but an exemplary embodiment thereof is not limited thereto. For example, a portion or all of the pad regions P may be modified to have a different thickness than the other portions of the gate patterns 158. Modified embodiments of such pad regions will be described with reference to FIGS. 5C and 5D, respectively.

Figure 5C:
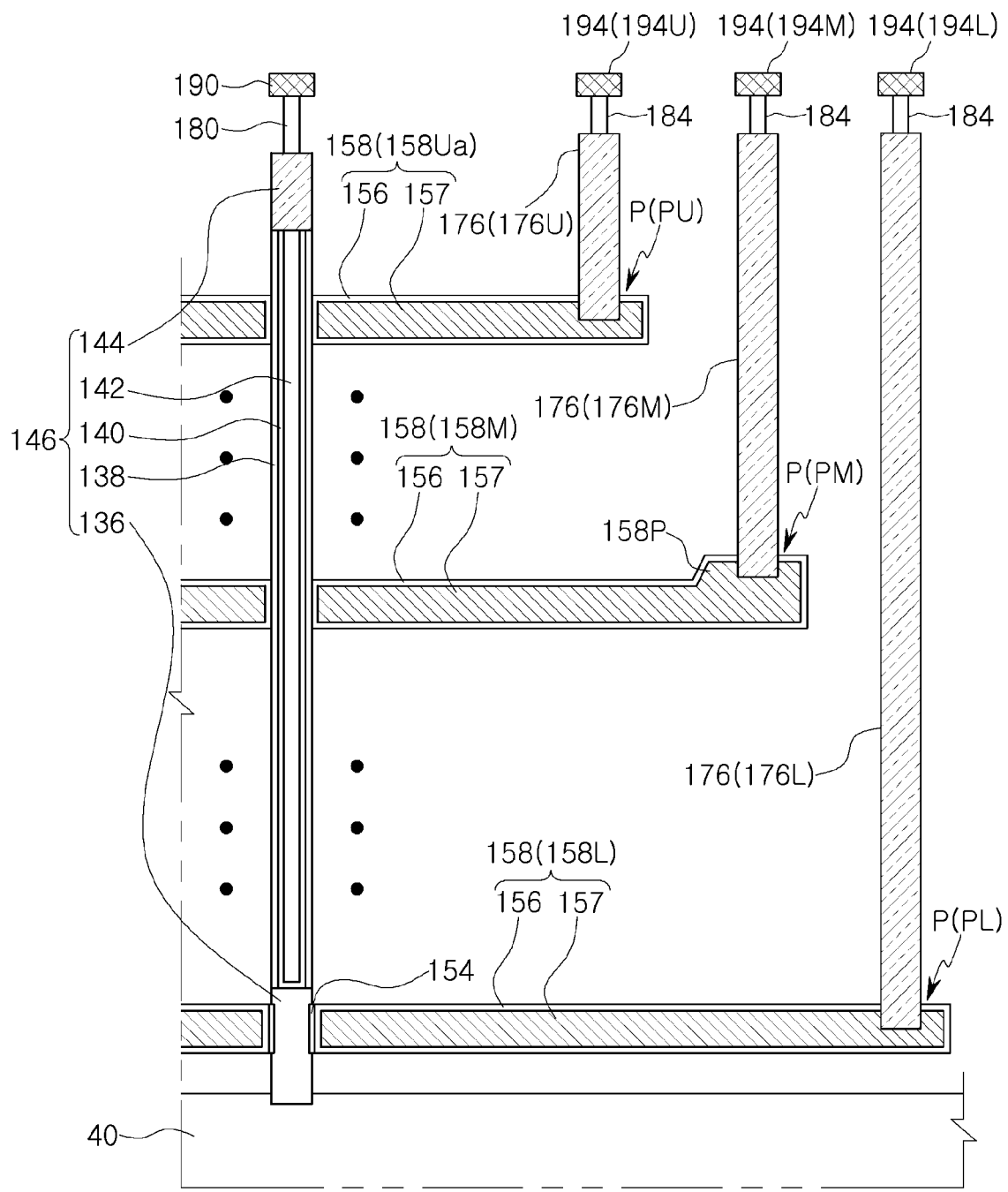

In a modified embodiment, referring to FIG. 5C, the upper pad region PU of the first upper gate pattern 158Ua positioned in an uppermost position and the lower pad region PL of the lower gate pattern 158L positioned at a lowermost position, among the gate patterns 158, may have the same thickness as the other portions of the first upper gate pattern 158Ua and the lower gate pattern 158L. The gate patterns positioned between the first upper gate pattern 158Ua and the lower gate pattern 158L, for example, the intermediate pad region PM of the intermediate gate pattern 158M, among the gate patterns 158, may have an increased thickness portion 158P. Therefore, the intermediate pad region PM may have a thickness greater than a thickness of remaining portion of the intermediate gate pattern 158M.

Figure 5D:
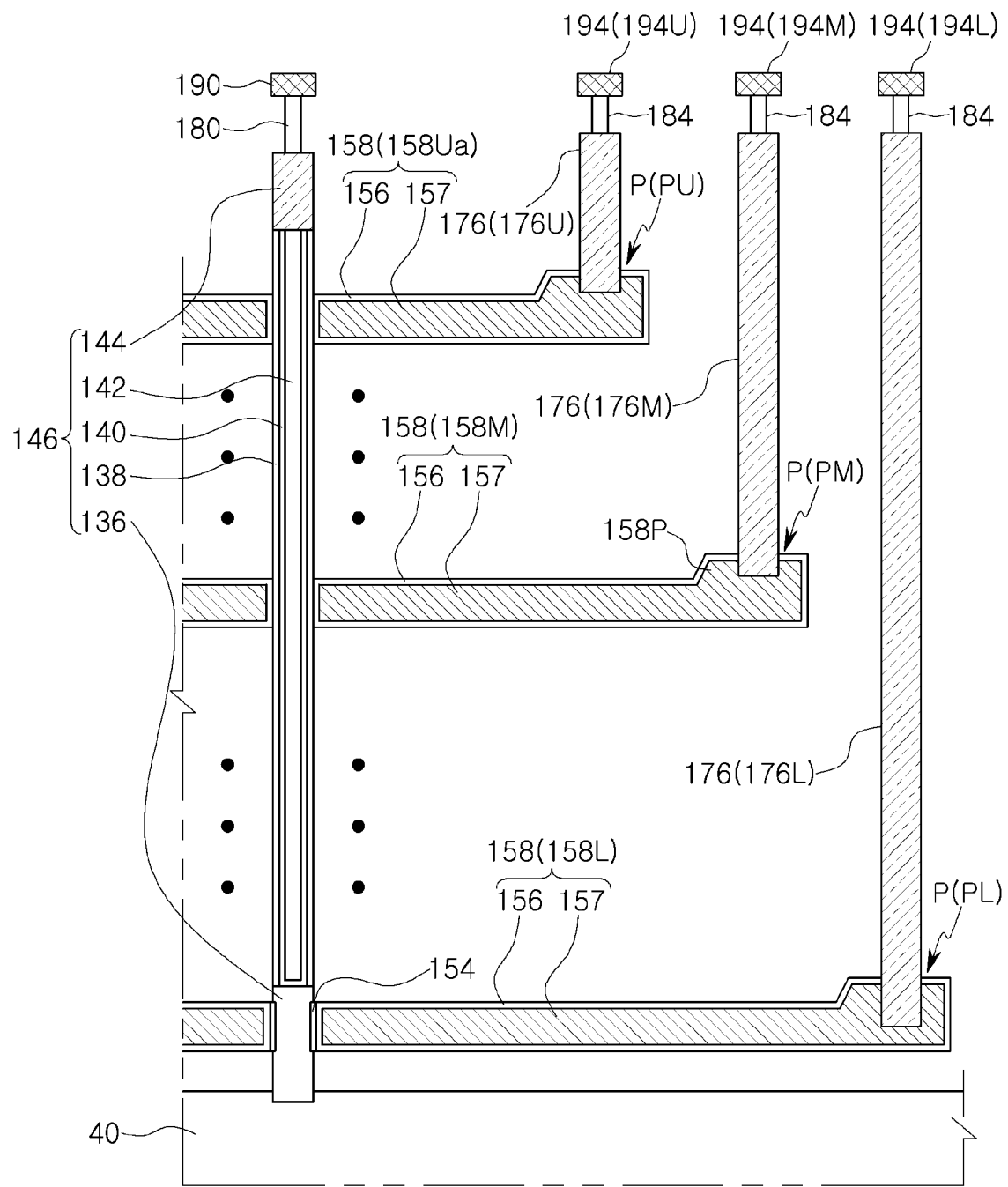

In another modified embodiment, referring to FIG. 5D, each of pad regions P of gate patterns 158 may have an increased thickness portion 158P. Therefore, each of the gate patterns 158 may have a pad region P that may have a thickness greater than a thickness of remaining portion of the gate patterns.

Referring again to FIGS. 2 to 4D, in the plan views of FIGS. 3A and 3B, reference numerals 'G0' to 'G120' may denote height information with which the gate patterns 158 are positioned on the lower structure 40. In the second region A2, regions indicated by reference numerals 'G0' to 'G120' may be regions of the gate patterns 158 having no other gate patterns thereon, and such regions may be referred to as the pad regions P. Therefore, the pad regions P may be viewed as regions indicated by the reference numerals 'G0' to 'G120,' in the plan views of FIGS. 3A and 3B.

Pad regions positioned on different height levels in the pad regions P may be viewed as stair treads of steps. Therefore, since the pad regions P positioned on different height levels may be the same as the stair treads of steps, the pad regions P may be viewed to be arranged in a stepped structure. Therefore, the 'stepped structure' of the stacked structure 160 to be described below may mean a stepped shape formed by a height difference between the pad regions P positioned on different height levels.

Figure 6A:
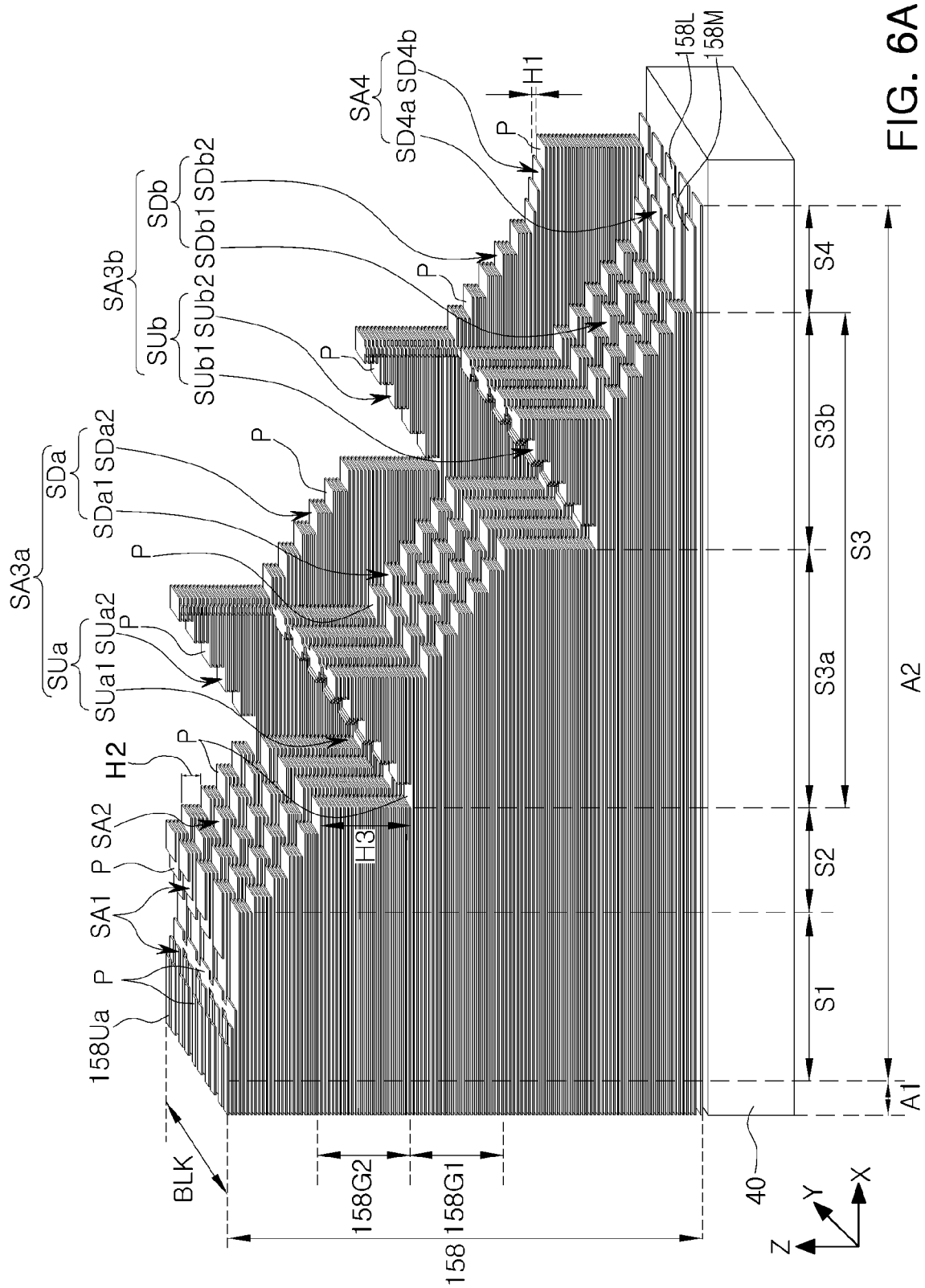
Figure 6B:
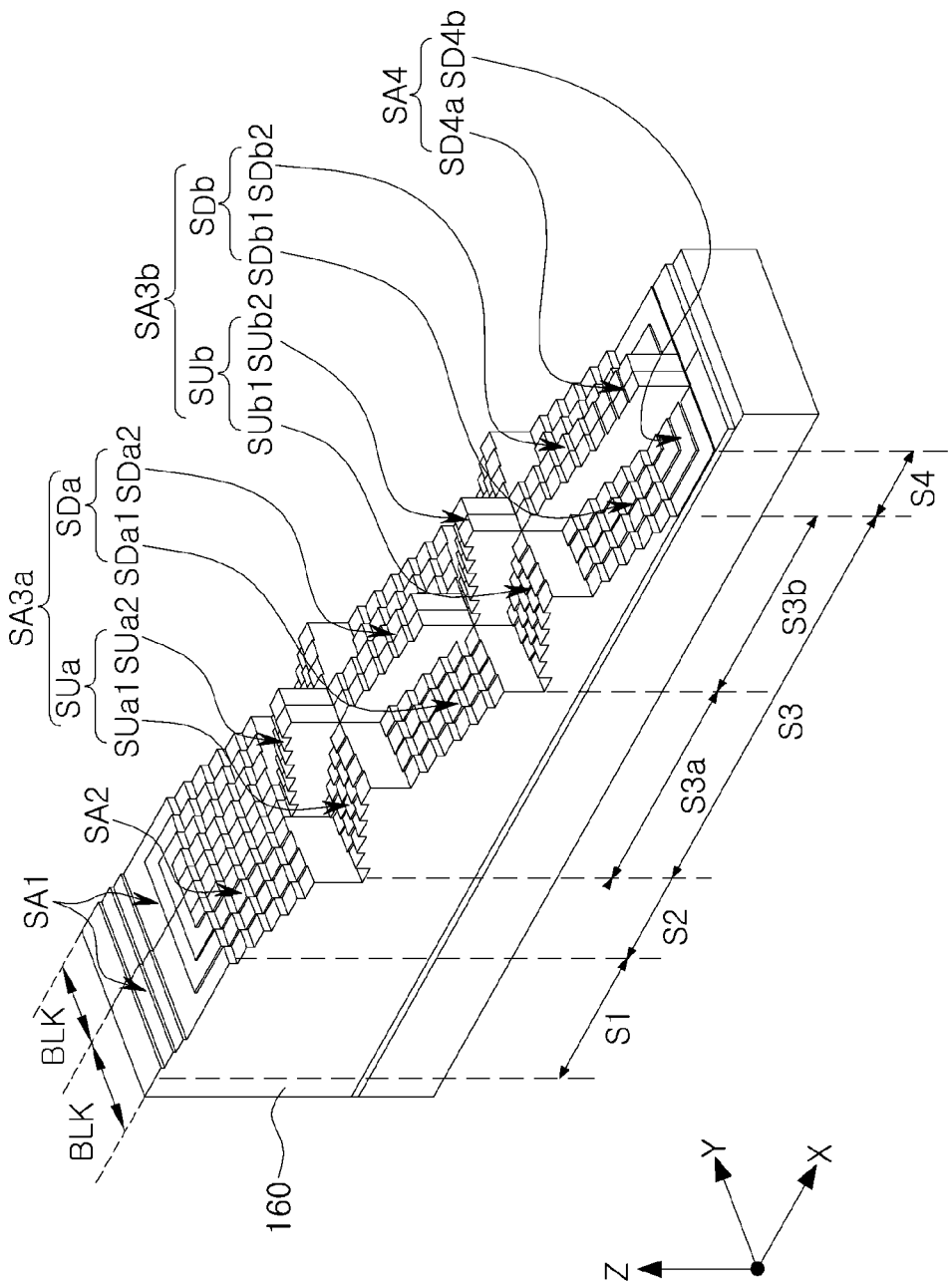

As described above, the stacked structure 160 may include the first stacked structure 160a and the second stacked structure 160b, which may be a mirror symmetric structure with respect to the first block separation structure 169a1. Therefore, the stepped structure of the stacked structure 160 may be mirror-symmetrical with respect to the first block separation structure 169a1. The gate patterns 158 of the stacked structure 160 will be described with reference to FIGS. 6A and 6B. FIG. 6A is a perspective view schematically illustrating a stepped structure of the stacked structure 160 positioned between the second block separation structures 169a2 to explain the stepped structure of the stacked structure 160. FIG. 6B is a perspective view schematically illustrating gate patterns 158 of the stacked structure 160 positioned between the first and second block separation structures 169a1 and 169a2, and the pad regions P of the gate patterns 158, to illustrate the stepped structure of the stacked structure 160.

Hereinafter, in the description of the stacked structure 160, FIG. 6A illustrating a stepped structure of the first stacked structure 160a positioned between the first and second block separation structures 169a1 and 169a2 will mainly be referred to, and FIG. 6B schematically illustrating a stepped structure of the first and second stacked structures 160a and 160b having a mirror symmetry structure with respect to the first block separation structure 169a1 will be supplementarily referred to.

Referring to FIGS. 6A and 6B together with FIGS. 2 to 4D, the first stacked structure 160a may include stacked regions having various stepped structures in the second region A2. For example, the stacked regions may include a first stacked region S1, a second stacked region S2, a third stacked region S3, and a fourth stacked region S4, which are sequentially arranged in the first direction X. The first to fourth stacked regions S1 to S4 may have different stepped structures.

In an exemplary embodiment, the first stacked region S1 of the first stacked structure 160a may include a first stepped region SA1 having a stepped structure changing in a unit of a first height H1. The first stepped region SA1 may have a stepped structure starting from the first region A1 and gradually lowering in a unit of the first height H1 in the first direction X, and then gradually raising in a unit of the first height H1 in the first direction X and the second direction Y.

In an exemplary embodiment, the second stacked region S2 may include a second stepped region SA2 having a stepped structure lowering in a unit of a second height H2, greater than the first height H1, in the first direction X. For example, the second stacked region S2 may include a second stepped region SA2 having a stepped structure starting from the first stacked region S1 and gradually lowering in a unit of a second height H2 in the first direction X, and then gradually raising in a unit of the first height H1 in the second direction Y.

In an exemplary embodiment, the third stacked region S3 may include one or a plurality of stacked portions. For example, the third stacked region S3 may include a first stacked portion S3a and a second stacked portion S3b. The first and second stacked portions S3a and S3b may include a third stepped region SA3a and SABb. The third stepped region SA3a and SA3b may include an upwardly stepped region SUa and SUb having a stepped structure raising in a unit of the second height H2 in the first direction X, and a downwardly stepped region SDa and SDb having a stepped structure lowering in a unit of the second height H2 in the first direction X.

The third stepped region SA3a and SA3b may include a third upper stepped region SA3a and a third lower stepped region SA3b. For example, the first stacked portion S3a may include the third upper stepped region SA3a. The third upper stepped region SA3a may have an upwardly stepped region SUa having a stepped structure raising in a unit of the second height H2 in the first direction X, and a downwardly stepped region SDa having a stepped structure lowering in a unit of the second height H2 in the first direction X. The second stacked portion S3b may include the third lower stepped region SA3b. The third lower stepped region SA3b may have an upwardly stepped region SUb having a stepped structure raising in a unit of the second height H2 in the first direction X, and a downwardly stepped region SDb having a stepped structure lowering in a unit of the second height H2 in the first direction X.

The upwardly stepped region SUa of the first stacked portion S3a and the downwardly stepped region SDa of the first stacked portion S3a may be sequentially arranged in the first direction X. The upwardly stepped region SUb of the second stacked portion S3b and the downwardly stepped region SDb of the second stacked portion S3b may be sequentially arranged in the first direction X.

The upwardly stepped region SUa of the first stacked portion S3a may include first and second upwardly stepped regions SUa1 and SUa2 positioned on different height levels, and the downwardly stepped region SDa of the first stacked portion S3a may include first and second downwardly stepped regions SDa1 and SDa2 positioned on different height levels.

The first upwardly stepped region SUa1 of the first stacked portion S3a may be positioned on a height level lower than the second upwardly stepped region SUa2 of the first stacked portion S3a.

The first upwardly stepped region SUa1 of the first stacked portion S3a may have a stepped structure starting from a portion of the second stacked region S2 and gradually lowering in a unit of the third height H3, gradually raising in a unit of the second height H2 in the first direction X, and gradually raising in a unit of the first height H1 in the second direction Y directing from the second block separation structure 169a2 toward the first block separation structure 169a1. The third height H3 may be greater than the second height H2.

The second upwardly stepped region SUa2 of the first stacked portion S3a may have a stepped structure starting from a portion of the second stacked region S2 and extending without a step difference in the first direction X, and gradually raising in a unit of the second height H2 in the first direction X. The step difference in the second direction Y between the first upwardly stepped region SUa1 of the first stacked portion S3a and the second upwardly stepped region SUa2 of the first stacked portion S3a may be the third height H3.

The first downwardly stepped region SDa1 of the first stacked portion S3a may have a stepped structure starting from the first upwardly stepped region SUa1 of the first stacked portion S3a and lowering in a unit of the third height H3, gradually lowering in a unit of the second height H2 in the first direction X, and gradually raising in a unit of the first height H1 in the second direction Y. The second downwardly stepped region SDa2 of the first stacked portion S3a may have a stepped structure starting from the second upwardly stepped region SUa2 of the first stacked portion S3a and lowering in a unit of the third height H3, and gradually lowering in a unit of the second height H2 in the first direction X. The step difference in the second upward direction Y between the first downwardly stepped region SDa1 of the first stacked portion S3a and the second downwardly stepped region SDa2 of the first stacked portion S3a may be the third height H3.

The second stacked portion S3b may have stepped regions having the same or similar stepped structure as the first stacked portion S3a. For example, the second stacked portion S3b may include a first upwardly stepped region SUb1 and a second upwardly stepped region SUb2 respectively corresponding to the first upwardly stepped region SUa1 and the second upwardly stepped region SUa2 of the first stacked portion S3a. The second stacked portion S3b may include a first downwardly stepped region SDb1 and a second downwardly stepped region SDb2 respectively corresponding to the first downwardly stepped region SDa1 and the second downwardly stepped region SDa2 of the first stacked portion S3a.

The first upwardly stepped region Sub1 of the second stacked portion S3b may have a stepped structure starting from the first downwardly stepped region SDa1 of the first stacked portion S3a and lowering in a unit of the third height H3, gradually raising in a unit of the second height H2 in the first direction X, and gradually lowering in a unit of the first height H1 in the second direction Y. The second upwardly stepped region Sub2 of the second stacked portion S3b may have a stepped structure starting from the second downwardly stepped region SDa2 of the first stacked portion S3a and lowering in a unit of the third height H3, and gradually raising in a unit of the first height H1 in the first direction X. The step difference in the second direction Y between the first upwardly stepped region SUb1 of the second stacked portion S3b and the second upwardly stepped region SUb2 of the second stacked portion S3b may be the third height H3.

The second downwardly stepped region SDb2 of the second stacked portion S3b may have a stepped structure starting from the second upwardly stepped region SUb2 of the second stacked portion S3a and lowering in a unit of the third height H3, and gradually lowering in a unit of the second height H2.

The first downwardly stepped region SDb1 of the second stacked portion S3b may have a stepped structure starting from the first upwardly stepped region SUa1 of the second stacked portion S3b and lowering in a unit of the third height H3, gradually lowering in a unit of the second height H2 in the first direction X, and gradually raising in a unit of the first height H1 in the second direction Y. The step difference in the second upward direction Y between the first downwardly stepped region SDb1 of the second stacked portion S3b and the second downwardly stepped region SDb2 of the second stacked portion S3b may be the third height H3.

In the embodiment, the third stacked region S3 is illustrated to include the first stacked portion S3a and the second stacked portion S3b, but an exemplary embodiment thereof is not limited thereto. For example, the third stacked region S3 may include only one stacked portion of the first stacked portion S3a and the second stacked portion S3b having a stepped structure having the same tendency to each other or may further include one or more stacked portions having a stepped structure having the same tendency as the first stacked portion S3a, disposed between the first stacked portion S3a and the second stacked portion S3b.

The plurality of stacked portions of the third stacked region S3 may include the first stacked portion S3a adjacent to the second stacked region S2 and an $n^{th}$ stacked portion positioned at an $n^{th}$ position from the first stacked portion S3a in the first direction, the first stacked portion S3a may include an upwardly stepped region in which pad regions P starting from the second stacked region S2 and lowering in a unit of the third height H3, and then raising in a unit of the second height H2 are positioned, the $n^{th}$ stacked portion may include an upwardly stepped region in which pad regions starting from a downwardly stepped region of an $(n-1)^{th}$ stacked portion and lowering in a unit of the third height H3, and then raising in a unit of the second height H2 are positioned, and 'n' may be a positive integer greater than 2.

In an exemplary embodiment, a slope of a region lowering in a unit of the third height H3, between the first stacked portion S3a and the second stacked region S2, may be different from a slope of a region lowering in a unit of the third height H3, between the $(n-1)^{th}$ stacked portion and the $n^{th}$ stacked portion.

The fourth stacked region S4 may include a fourth stepped region SA4. The fourth stepped region SA4 may include first and second downwardly stepped regions SD4a and SD4b having a stepped structure changing in a unit of the first height H1. The first downwardly stepped region SD4a of the fourth stepped region SA4 of the fourth stacked region S4 may be a stepped structure lowering in a unit of the first height H1 in the first direction X and raising in a unit of the first height H1 in the second direction Y at the same time. The second downwardly stepped region SD4b of the fourth stepped region SA4 of the fourth stacked region S4 may be disposed on a level higher than the first downwardly stepped region SD4a of the fourth stacked region S4, and may be a stepped structure lowering in a unit of the first height H1 in the first direction X.

The gate patterns 158 of the stacked structure 160 may include the first upwardly stepped region SUa1 of the first stacked portion S3a in the third stacked region S3, having a stepped structure in which the pad regions P raising in a unit of the second height H2 in the first direction X are disposed and formed, and the first downwardly stepped region SDa1 of the first stacked portion S3a in the third stacked region S3, having a stepped structure in which the pad regions P lowering in a unit of the second height H2 in the first direction X are disposed and formed.

Figure 7A:
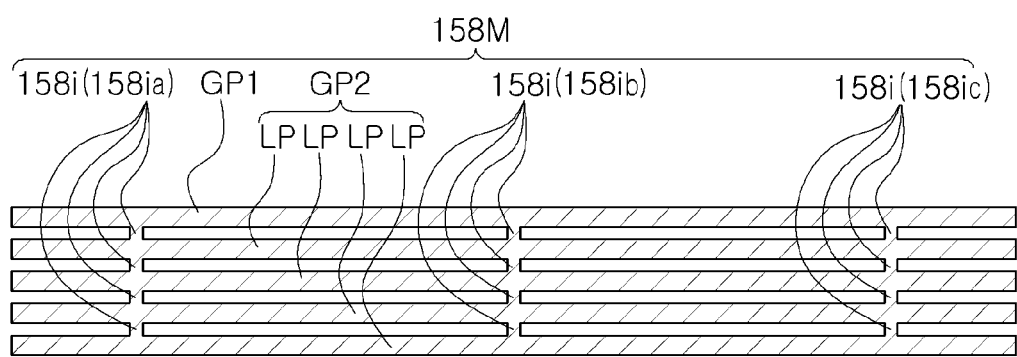
Figure 7B:
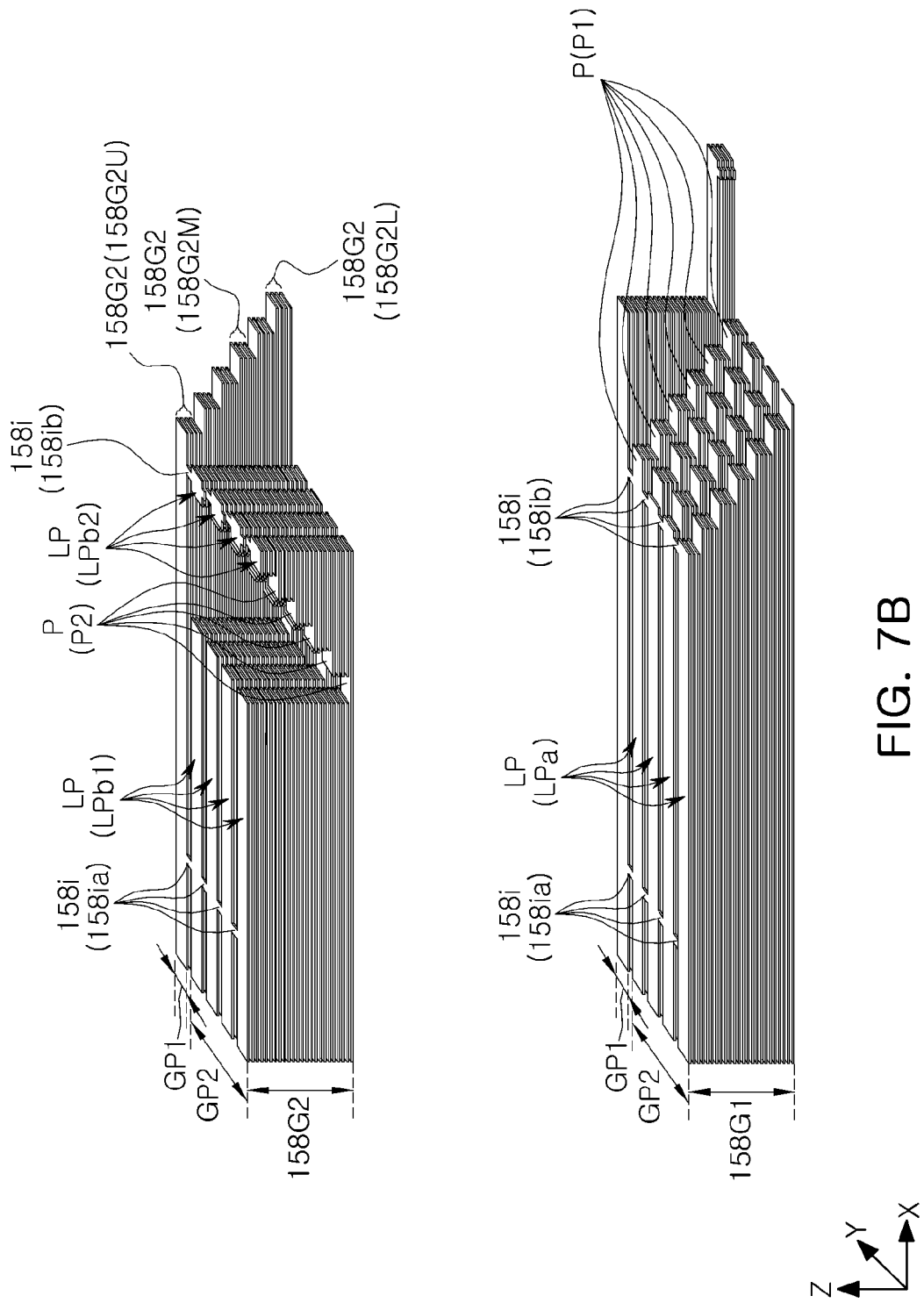
Figure 8A:
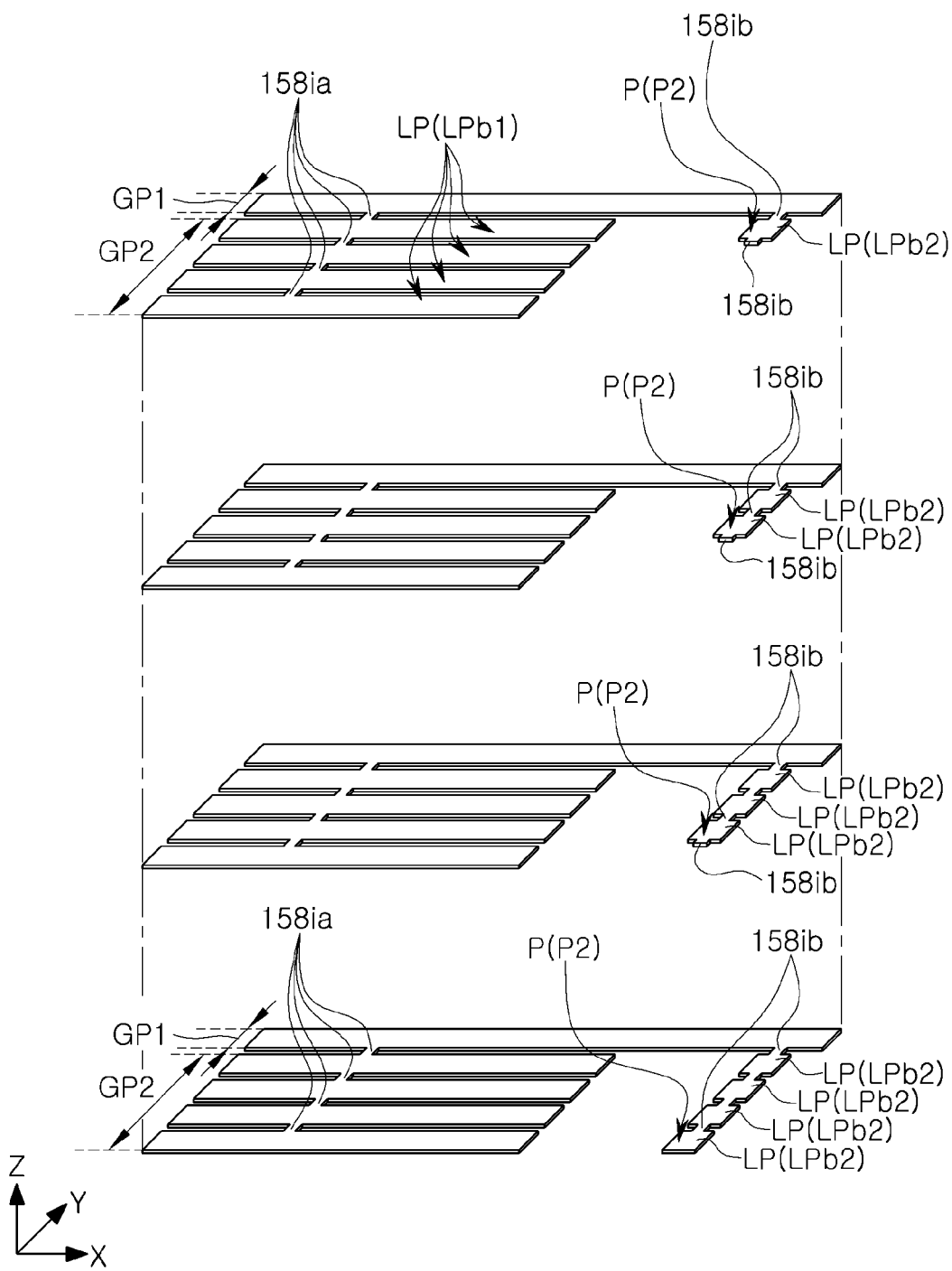
Figure 8B:
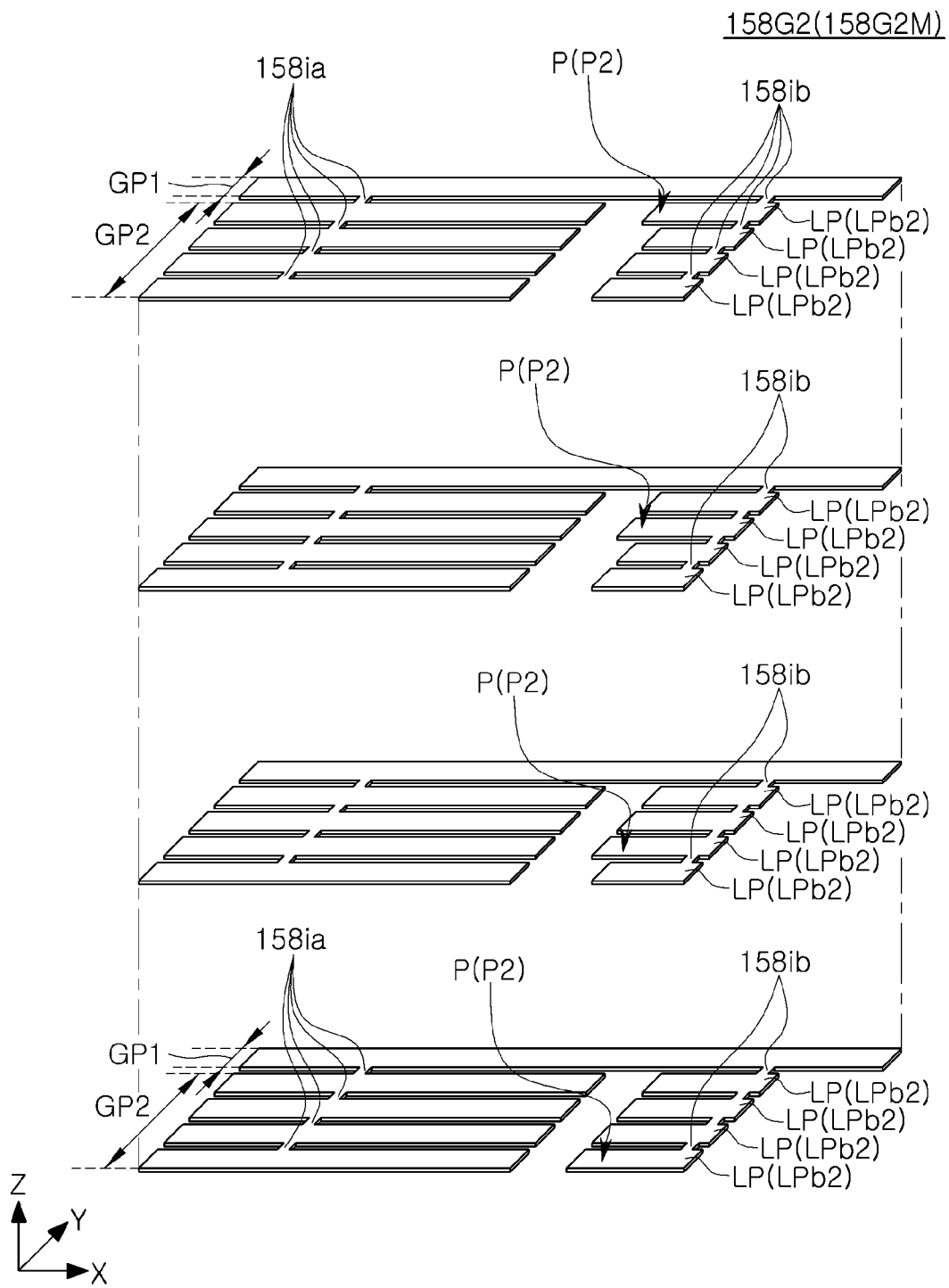
Figure 8C:
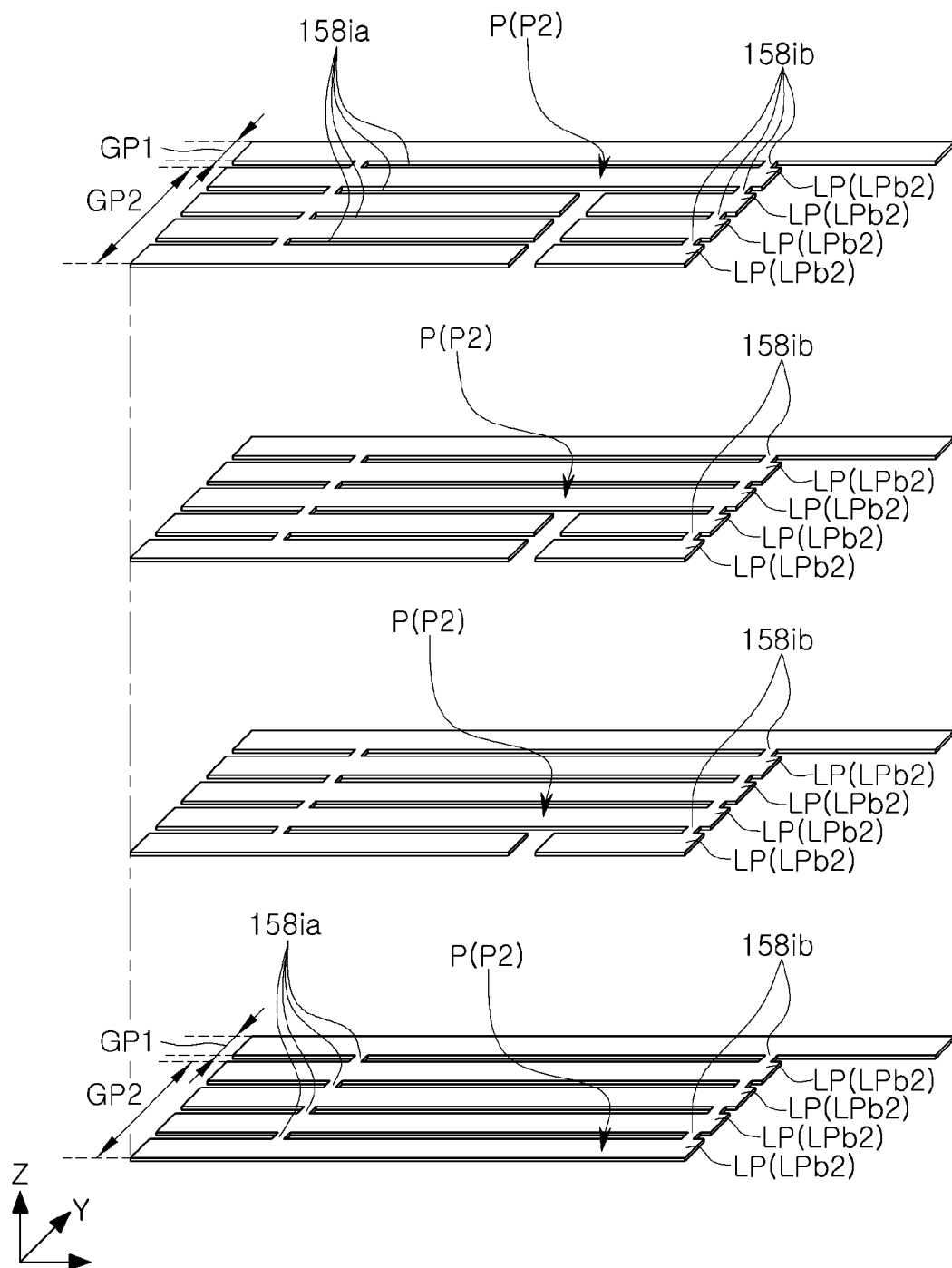

Hereinafter, the intermediate gate patterns 158M will be described with reference to FIGS. 7A and 7B. Intermediate gate patterns including the pad regions P forming the first downwardly stepped region SDa1 of the first stacked portion S3a in the third stacked region S3 may be defined as a first gate group 158G1, and intermediate gate patterns including the pad regions P forming the first upwardly stepped region SUa1 of the first stacked portion S3a in the third stacked region S3 may be defined as a second gate group 158G2. Therefore, the second gate group 158G2 may be disposed on the first gate group 158G1. The intermediate gate patterns 158M, which may include the first and second gate groups 158G1 and 158G2, will be described with reference to FIGS. 6A to 6C, 7A and 7B. FIG. 7A is a plan view schematically illustrating the intermediate gate patterns 158M positioned between the first and second block separation structures 169a1 and 169a2 without distinguishing the pad regions P. FIG. 7B is an exploded perspective view illustrating the first gate group 158G1 and the second gate group 158G2. FIG. 8A is an exploded perspective view illustrating four gate patterns 158G2U positioned in an upper portion of the second gate group 158G2. FIG. 8B is an exploded perspective view illustrating four gate patterns 158G2M positioned in an intermediate portion of the second gate group 158G2. FIG. 8C is an exploded perspective view illustrating four gate patterns 158G2L positioned in a lower portion of the second gate group 158G2.

Referring to FIGS. 7A, 7B, 8A, 8B, and 8C, the intermediate gate patterns 158M positioned between the first and second block separation structures 169a1 and 169a2 may include a first gate portion GP1, a second gate portion GP2, and connection patterns 158i electrically connecting the first gate portion GP1 and the second gate portion GP2, present on the same plane. In an exemplary embodiment, the connection patterns 158i may include first connection patterns 158ia, second connection patterns 158ib, and third connection patterns 158ic.

The second gate portion GP2 of the intermediate gate patterns 158M may include a plurality of line patterns LP spaced apart from each other in the second direction Y. For example, the second gate portion GP2 may be composed of four line patterns LP parallel to each other. The connection patterns 158i may electrically connect the plurality of line patterns LP positioned on the same plane and adjacent to each other.

Among the first gate portion GP1, the second gate portion GP2, and the connection patterns 158i, each of the first gate portion, the second gate portion, and the connection pattern, positioned on the same plane with each other, may be an intermediate gate pattern to be electrically connected, for example, the word line (WL in FIGS. 1A and 1B).

Each of the first and second gate groups 158G1 and 158G2 may include the first gate portion GP1, the second gate portion GP2, and the connection patterns 158i.

In the first gate group 158G1, pad regions P forming the first downwardly stepped region SDa1 of the first stacked portion S3a in the third stacked region S3 may be defined as first pad regions P1, and pad regions P forming the first upwardly stepped region SUa1 of the first stacked portion S3a in the third stacked region S3 may be defined as second pad regions P2.

The first gate portion GP1 of the first gate group 158G1 may extend further than the second gate portion GP2 of the first gate group 158G1 in the first direction X. The second gate portion GP2 of the first gate group 158G1 may include a plurality of line patterns LPa spaced apart from each other in the second direction Y.

The second gate portion GP2 of the first gate group 158G1 may include the first pad regions P1. The first pad regions P1 may be disposed to form a stepped structure lowering in a unit of the second height H2 in the first direction X and raising in a unit of the first height H1 in the second direction Y, as described above.

The first gate portion GP1 of the second gate group 158G2 may extend further than the second gate portion GP2 of the second gate group 158G2 in the first direction X. The second gate portion GP2 of the second gate group 158G2 may include the second pad regions P2. The second pad regions P2 may be disposed to form a stepped structure raising in a unit of the second height H2 in the first direction X, as described above.

The second gate portion GP2 of the second gate group 158G2 may include line patterns LP spaced apart from each other in the second direction Y. The line patterns LP of the second gate portion GP2 of the second gate group 158G2 include line portions LPb1, and connection portions LPb2 facing the line portions LPb1.

The connection patterns 158i of the second gate group 158G2 may include first connection patterns 158ia electrically connecting the line portions LPb1 and the first gate portion GP1 of the second gate group 158G2 to each other, and second connection patterns 158ib electrically connecting the connection portions LPb2 of the second gate group 158G2 and the first gate portion GP1 of the second gate group 158G2. The connection portions LPb2 of the second gate group 158G2 may have the second pad regions P2.

Among the second pad regions P2 disposed in the first direction X, a distance between second pad region P2 positioned on a relatively low level and the second connection patterns 158ib may be longer than a distance between second pad region P2 positioned on a relatively high level and the second connection patterns 158ib.

Figure 9:
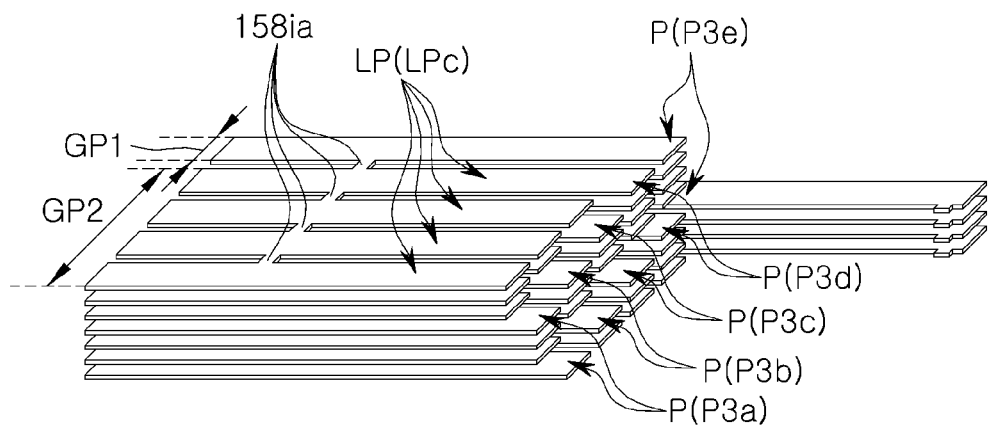

Next, an exemplary embodiment of the intermediate gate patterns 158M having the pad regions P positioned in the second stacked region S2 will be described with reference to FIG. 9. FIG. 9 is a perspective view illustrating intermediate gate patterns 158M positioned on a relatively low level, among the intermediate gate patterns 158M having pad regions P positioned in the second stacked region S2.

Referring to FIGS. 6A, 6B, 7A, 7B, and 9, the intermediate gate patterns 158M having the pad regions P positioned in the second stacked region S2 may include the first gate portion GP1, as described above, the second gate portion GP2 stacked and spaced apart from each other in the vertical direction Z, and the connection patterns 158i electrically connecting the first gate portion GP1 and the second gate portion GP2, present on the same plane. The second gate portion GP2 of the intermediate gate patterns 158M having the pad regions P positioned in the second stacked region S2 may include line patterns LPc spaced apart from each other in the second direction Y.

In the intermediate gate patterns 158M having pad regions P positioned in the second stacked region S2, the first and second gate portions GP1 and GP2 may be electrically connected to each other through the first connection patterns 158ia among the connection patterns 158i.

Among the intermediate gate patterns 158M having the pad regions P positioned in the second stacked region S2, the line patterns LPc may have pad regions P3a, P3b, P3c, and P3d gradually raising in a unit of the first height H1 in the second direction Y, and the first gate portion GP1 may have pad regions P3e positioned on the same height level as the pad region P3d of line patterns LPc adjacent to the first gate portion GP1 among the line patterns LPc.

Referring again to FIGS. 6A and 6B together with FIGS. 2 to 4D, as described above, portions lowering in a unit of the third height H3, in the first direction X from the first region A1 to the second region A2, may be included. For example, the first upwardly stepped region SUa1 of the first stacked portion S3a may be started from a portion of the second stacked region S2, lowered in a unit of the third height H3, and gradually raised in a unit of the second height H2 in the first direction X, and the first downwardly stepped region SDa1 of the first stacked portion S3a may be started from the first upwardly stepped region SUa1 of the first stacked portion S3a, lowered in a unit of the third height H3, and gradually lowered in a unit of the second height H2 in the first direction X. Further, the first upwardly stepped region SUb1 of the second stacked portion S3b may be started from the first downwardly stepped region SDa1 of the first stacked portion S3a, lowered in a unit of the third height H3, and gradually raised in a unit of the second height H2 in the first direction X, and the second downwardly stepped region SDb2 of the second stacked portion S3b may be started from the stepped region SUb2 of the second stacked portion S3a, lowered in a unit of the third height H3, and gradually lowered in a unit of the second height H2.

Therefore, a first sidewall SW1 having the third height H3 may be formed between a portion of the second stacked region S2 and the first upwardly stepped region SUa1 of the first stacked portion S3a, a second sidewall SW2 having the third height H3 may be formed between the first upwardly stepped region SUa1 of the first stacked portion S3a and the first downwardly stepped region SDa1 of the first stacked portion S3a, a third sidewall SW3 having the third height H3 may be formed between the first downwardly stepped region SDa1 of the first stacked portion S3a and the first upwardly stepped region SUb1 of the second stacked portion S3b, and a fourth sidewall SW4 having the third height H3 may be formed the first upwardly stepped region SUb1 of the second stacked portion S3b and the first downwardly stepped region SDb1 of the second stacked portion S3b.

The upwardly stepped region SUa of the first stacked portion S3a may have a stepped structure in which the pad regions P raising in a unit of the second height H2 in the first direction X are disposed, and the upwardly stepped region SUb of the second stacked portion S3b may have a stepped structure in which the pad regions P raising in a unit of the second height H2 in the first direction X are disposed.

In describing modified or other examples of a three-dimensional semiconductor device according to an embodiment of the present disclosure, a description overlapping the above-mentioned contents, or a description capable of being known from the above description may be omitted, and modified portions will be mainly described throughout all embodiments.

Figure 10:
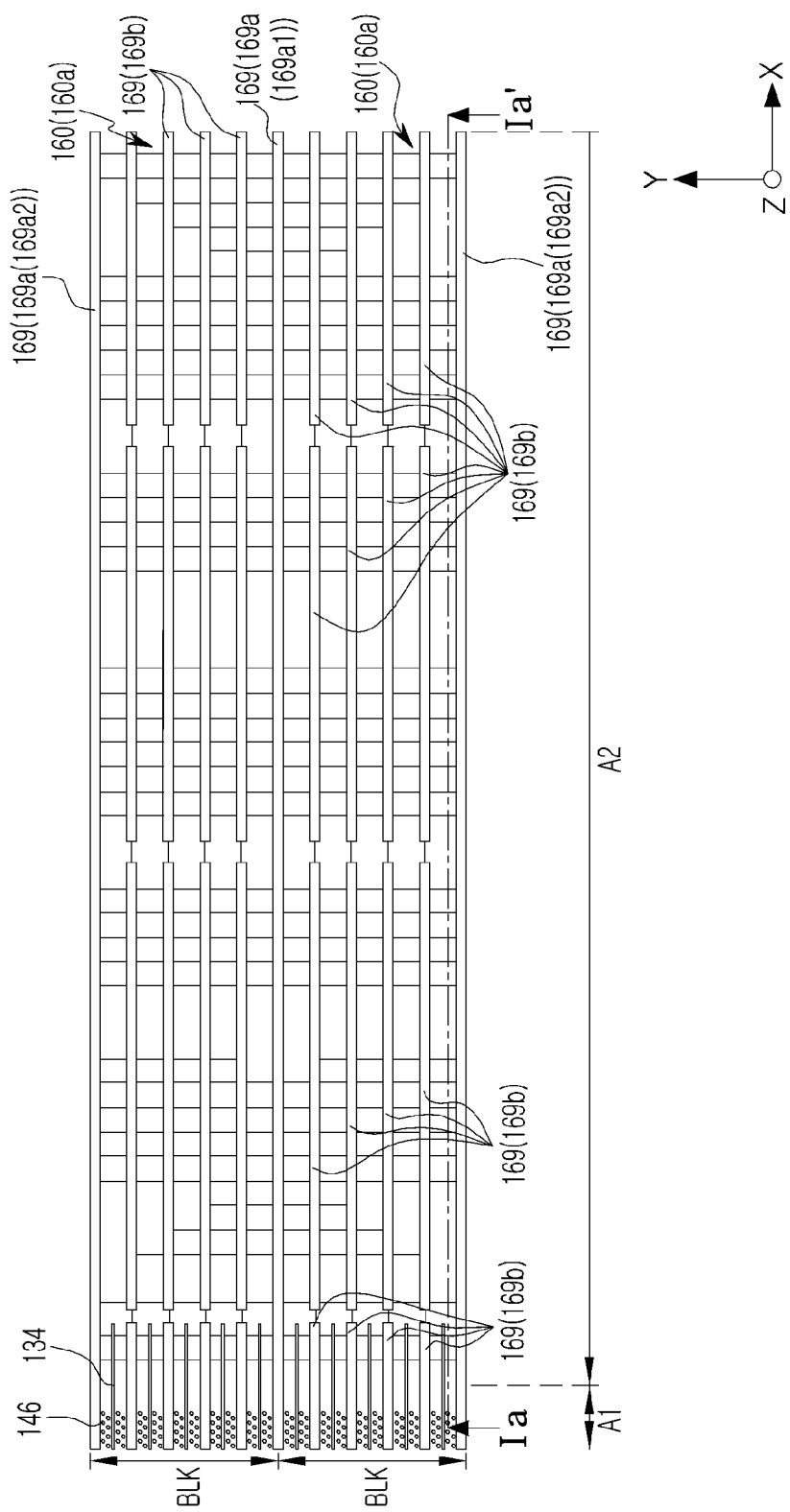
FIGS. 10 to 13 are views illustrating a modified embodiment of the three-dimensional semiconductor device according to an example embodiment.
Figure 11:
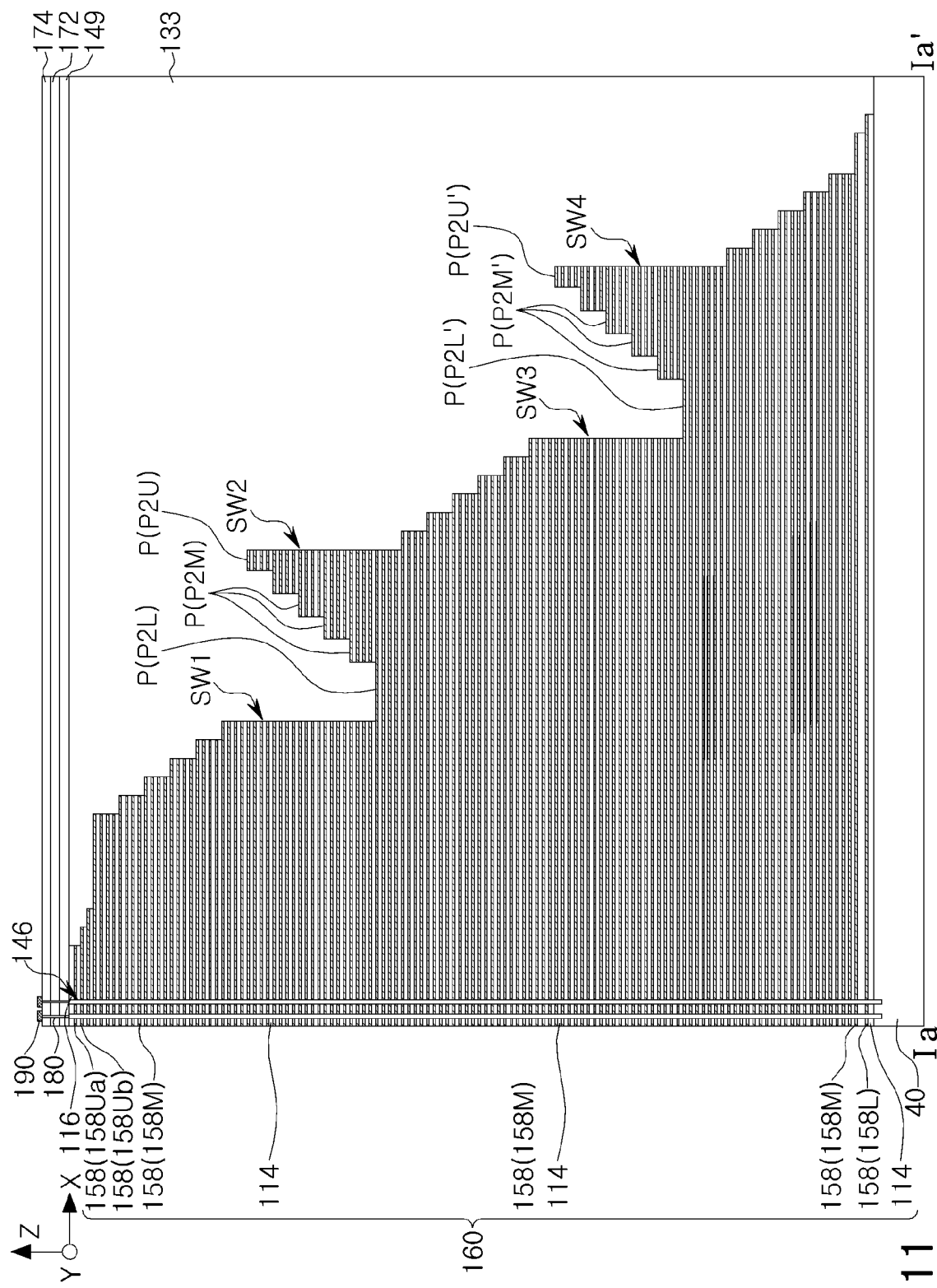

In an exemplary embodiment, the pad regions P constituting the upwardly stepped region SUa of the first stacked portion S3a may have the same width as each other in the first direction X, and the pad regions P constituting the upwardly stepped region SUb of the second stacked portion S3b may have the same width as each other in the first direction X, but an exemplary embodiment thereof is not limited thereto. Referring to FIGS. 10 and 11, a modified embodiment of the pad regions P constituting the upwardly stepped region SUa of the first stacked portion S3a, and a modified embodiment of the pad regions P constituting the upwardly stepped region SUb of the second stacked portion S3b will be described.

FIG. 10 is a plan view illustrating a modified embodiment of pad regions P constituting the upwardly stepped region SUa of the first stacked portion S3a and a modified embodiment of pad regions P constituting the upwardly stepped region SUb of the second stacked portion S3b, and FIG. 11 is a cross-sectional view illustrating a region taken along line Ia-Ia' in FIG. 10. Referring to FIGS. 10 and 11, in describing a modified embodiment of pad regions P constituting the upwardly stepped region SUa of the first stacked portion S3a and a modified embodiment of pad regions P constituting the upwardly stepped region SUb of the second stacked portion S3b, the components described above will be explained directly by quoting them without further explanation.

Referring to FIGS. 10 and 11, the upwardly stepped region SUa of the first stacked portion S3a may include pad regions P raising in a unit of the second height H2 in the first direction X, and the upwardly stepped region SUb of the second stacked portion S3b may include pad regions P raising in a unit of the second height H2 in the first direction X.

Among the pad regions P of the upwardly stepped region SUa of the first stacked portion S3a, raising in a unit of the second height H2 in the first direction X, a lowermost pad region P2L positioned on the lowest height level and an uppermost pad region P2U positioned on the highest height level may have a wider width than remaining pad regions P2M in the first direction X.

In a similar manner to the above, among the pad regions P of the upwardly stepped region SUb of the second stacked portion S3b, raising in a unit of the second height H2 in the first direction X, a lowermost pad region P2L' positioned on the lowest height level and an uppermost pad region P2U' positioned on the highest height level may have a wider width than remaining pad regions P2M' in the first direction X.

As described above, the first sidewall SW1 having the third height H3, formed between a portion of the second stacked region S2 and the first upwardly stepped region SUa1 of the first stacked portion S3a, the second sidewall SW2 having the third height H3, formed between the first upwardly stepped region SUa1 of the first stacked portion S3a and the first downwardly stepped region SDa1 of the first stacked portion S3a, the third sidewall SW3 having the third height H3, formed between the first downwardly stepped region SDa1 of the first stacked portion S3a and the first upwardly stepped region SUb1 of the second stacked portion S3b, and the fourth sidewall SW4 having the third height H3, formed between the first upwardly stepped region SUb1 of the second stacked portion S3b and the first downwardly stepped region SDb1 of the second stacked portion S3b, may be arranged.

In an exemplary embodiment, the first to fourth sidewalls SW1, SW2, SW3, and SW4 may have the same sidewall slope, or width in the first direction X.

Figure 12:
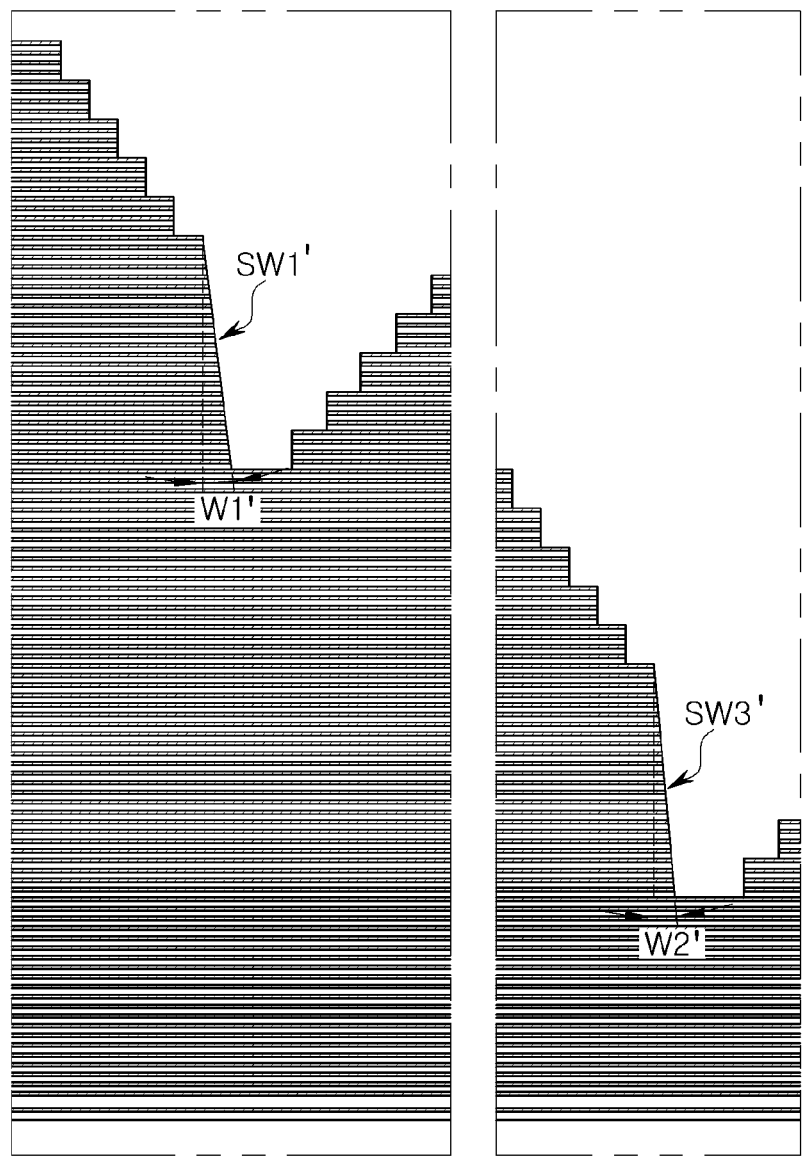
Figure 13:
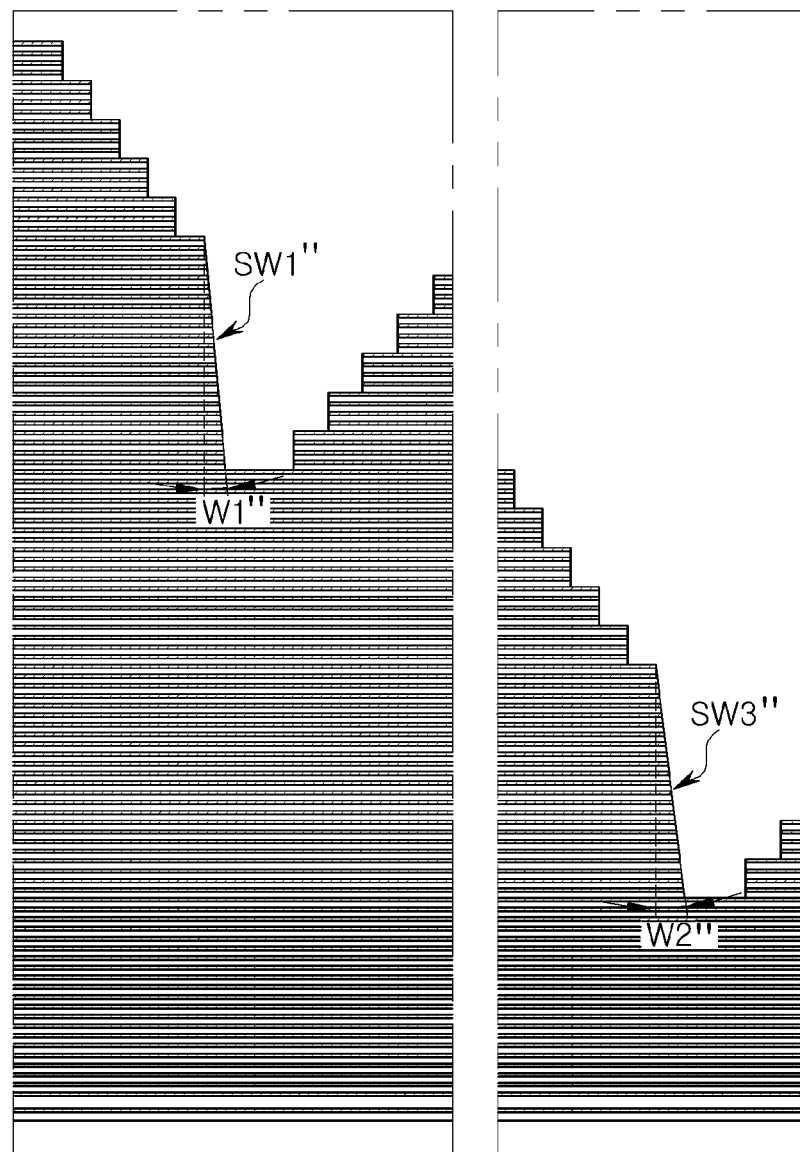

In a modified embodiment, at least two sidewalls of the first through fourth sidewalls SW1, SW2, SW3, and SW4 may have different sidewall slopes or different widths of the first direction X. Hereinafter, an exemplary embodiment of modified sidewalls having different sidewall slopes or different widths in the first direction X will be described with reference to FIGS. 12 and 13, respectively. FIGS. 12 and 13 are partially enlarged cross-sectional views schematically illustrating a modified first sidewall of the first sidewall SW1 and a modified third sidewall of the third sidewall SW3.

First, referring to FIG. 12, a width W1' of a bottom portion of a modified first sidewall SW1' in the first direction X may be wider than a width W2' of a bottom portion of a modified third sidewall SW3' in the first direction X. The modified third sidewall SW3' may have a steeper slope than the modified first sidewall SW1'.

In a modified embodiment, a slope of a region lowering in a unit of the third height H3, between the first stacked portion S3a of FIG. 6A and the second stacked region S2 of FIG. 6A, may be a slope of the modified first sidewall SW1' of FIG. 12, and a slope of a region lowering in a unit of the third height H3, between the first stacked portion S3a of FIG. 6A and the second stacked portion S3b of FIG. 6A, may be a slope of the modified third sidewall SW3' of FIG. 12.

Next, referring to FIG. 13, a width W1" of a bottom portion of a modified first sidewall SW1" in the first direction X may be narrower than a width W2" of a bottom portion of a modified third sidewall SW3" in the first direction X. The modified first sidewall SW1" may have a steeper slope than the modified third sidewall SW3".

In a modified embodiment, a slope of a region lowering in a unit of the third height H3, between the first stacked portion S3a of FIG. 6A and the second stacked region S2 of FIG. 6A, may be a slope of the modified first sidewall SW1" of FIG. 13, and a slope of a region lowering in a unit of the third height H3, between the first stacked portion S3a of FIG. 6A and the second stacked portion S3b of FIG. 6A, may be a slope of the modified third sidewall SW3" of FIG. 13.

Figure 14:
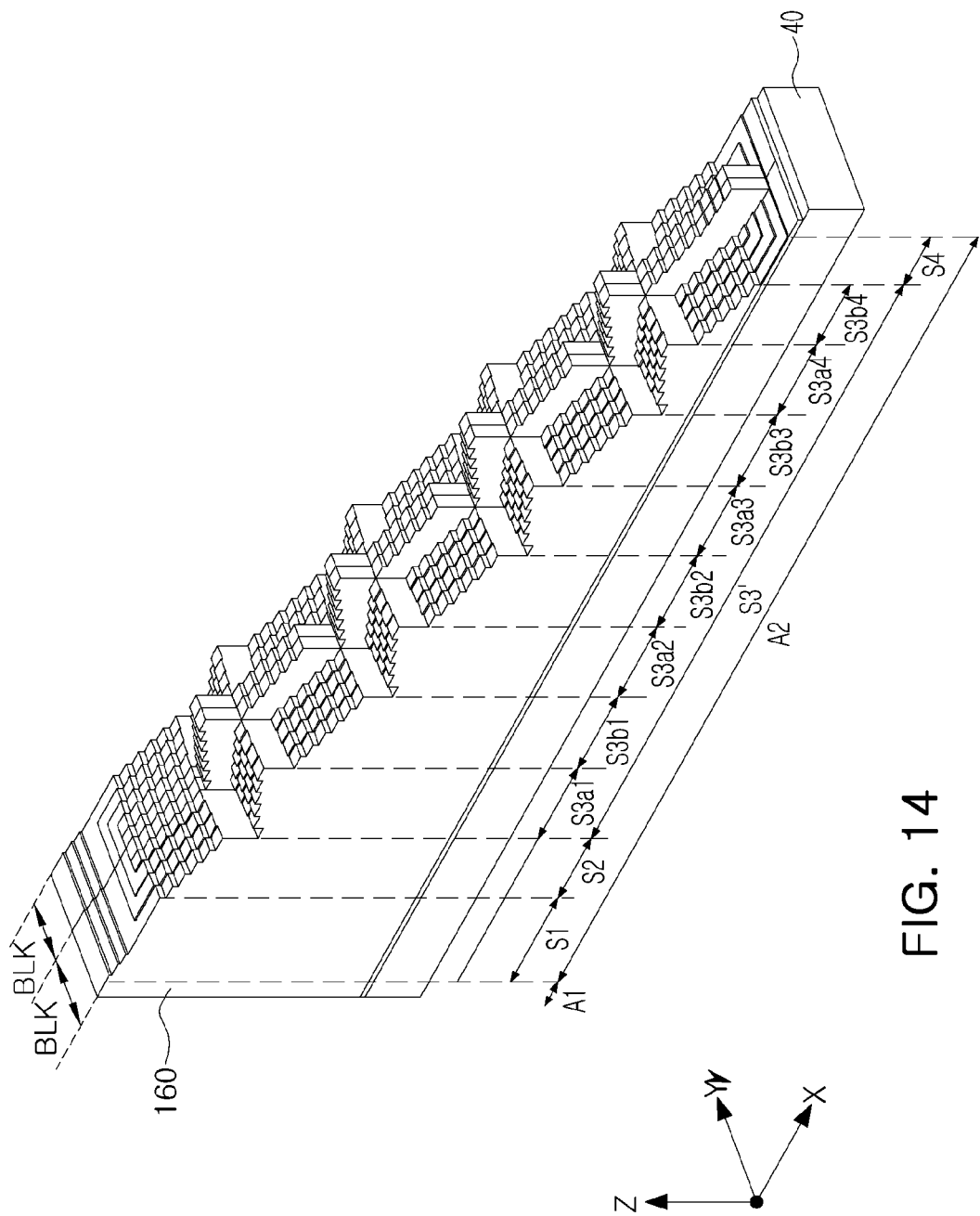
FIG. 14 is a view illustrating a modified embodiment of a three-dimensional semiconductor device according to an example embodiment.

Referring to FIGS. 6A and 6B together with FIGS. 2 to 4D, the third stacked region S3 is illustrated to include two (2) stacked portions S3a and S3b, but an exemplary embodiment thereof is not limited thereto. For example, the third stacked region S3 may include a plurality of stacked portions of more than two (2). A modified embodiment of the third stacked region S3 including a plurality of stacked portions will be described with reference to FIG. 14. FIG. 14 is a schematic perspective view illustrating a three-dimensional semiconductor device including a modifiable third stacked region S3' including a plurality of stacked portions.

Referring to FIG. 14, the third stacked region S3' may include a first stacked portion S3a1, a second stacked portion S3b1, a third stacked portion S3a2, a fourth stacked portion S3b2, a fifth stacked portion S3a3, a sixth stacked portion S3b3, a seventh stacked portion S3a4, and an eighth stacked portion S3b4. The first, third, fifth, and seventh stacked portions S3a1, S3a2, S3a3, and S3a4 may include upwardly stepped regions having a stepped structure raising in a unit of the second height H2 in the first direction X, and the second, fourth, sixth, and eighth stacked portions S3b1, S3b2, S3b3, and S3b4 may include downwardly stepped regions having a stepped structure lowering in a unit of the second height H2 in the first direction X. The upwardly stepped regions and the downwardly stepped regions of the third stacked region S3' can be understood from the upwardly stepped regions and the downwardly stepped regions of the third stacked region S3 described above. Therefore, detailed description of the upwardly stepped regions and the downwardly stepped regions of the third stacked region S3' will be omitted.

Figure 15A:
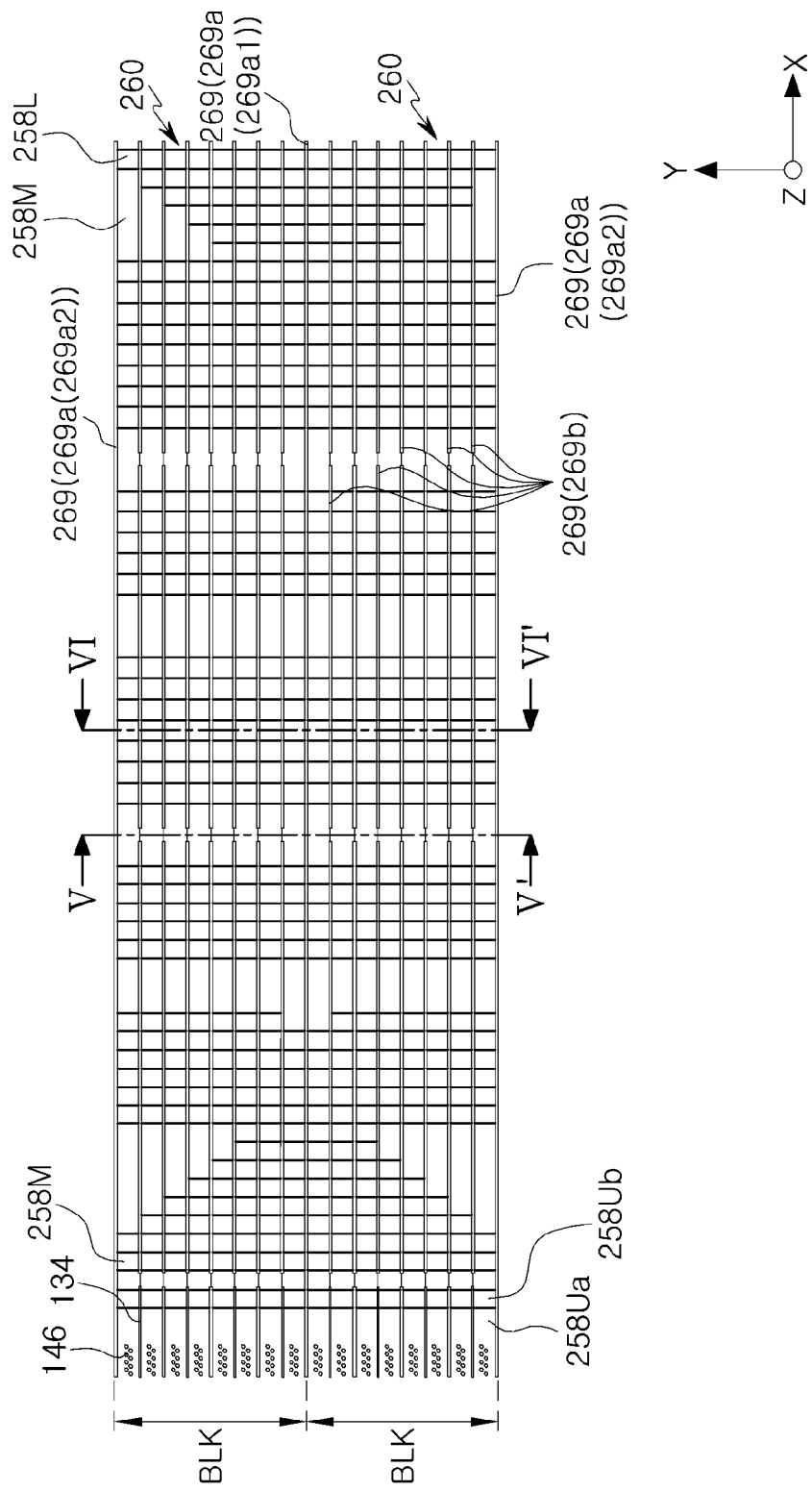
FIGS. 15A to 16B are views illustrating a modified embodiment of the three-dimensional semiconductor device according to an example embodiment.
Figure 15B:
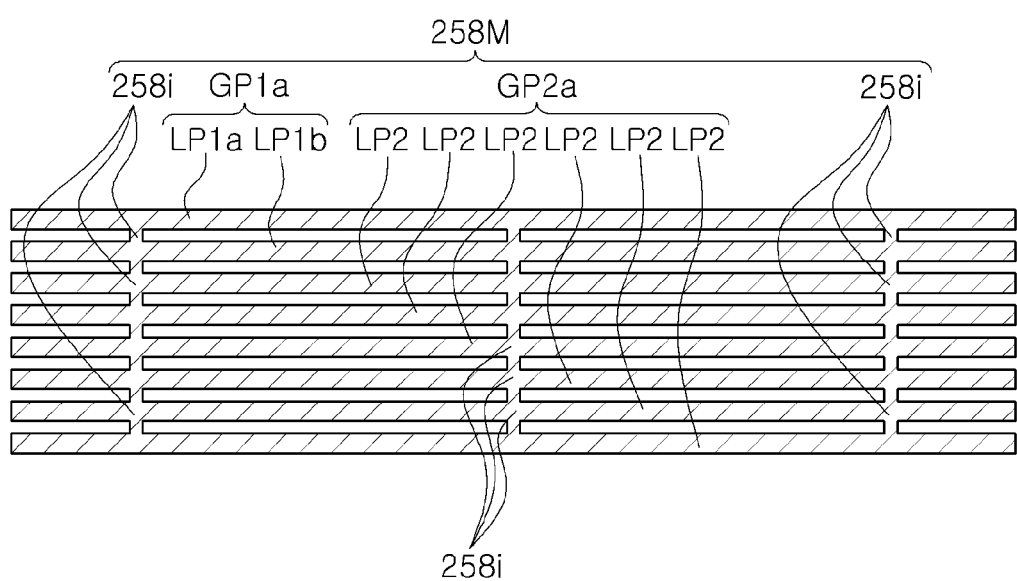
Figure 16A:
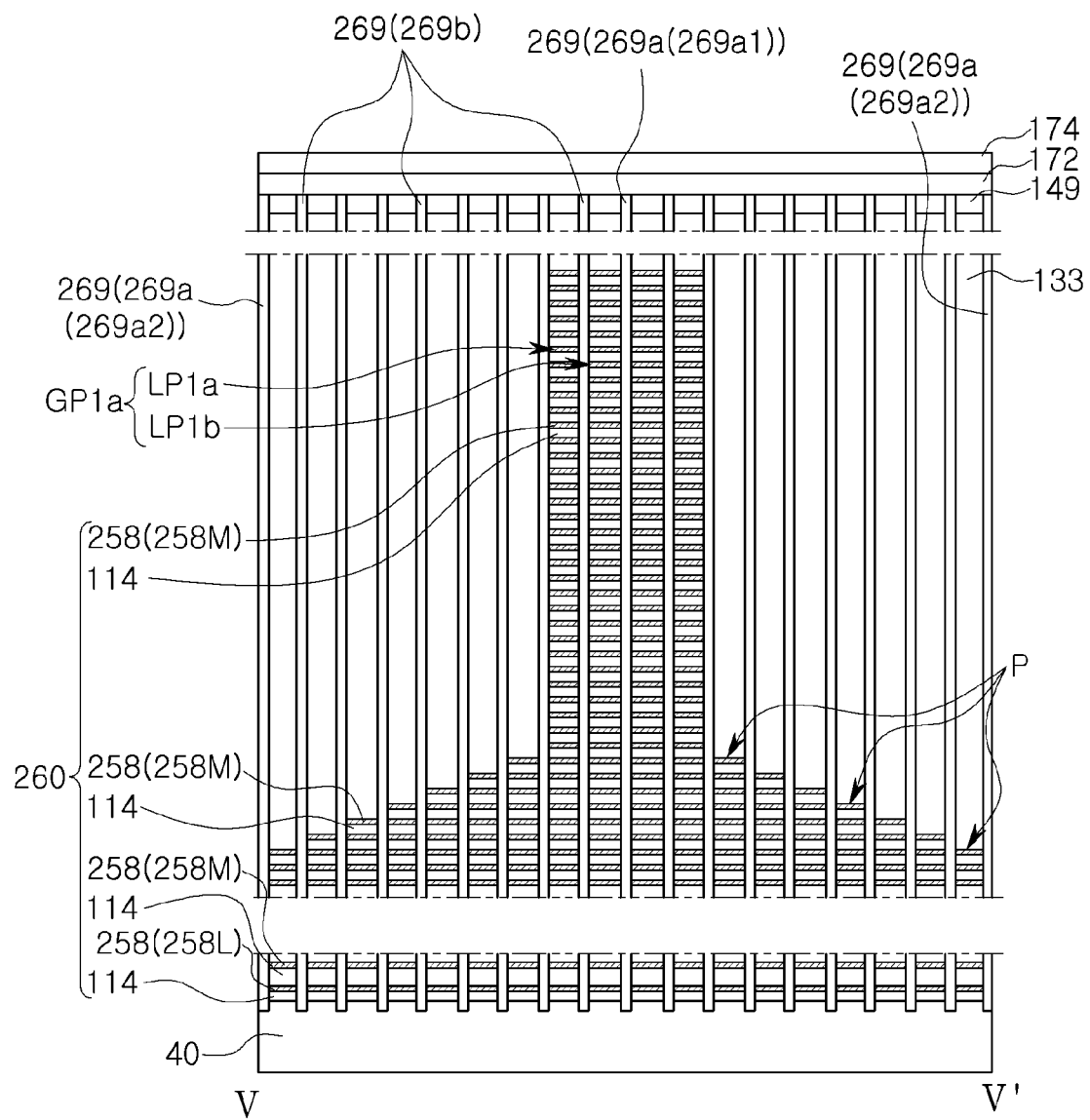
Figure 16B:
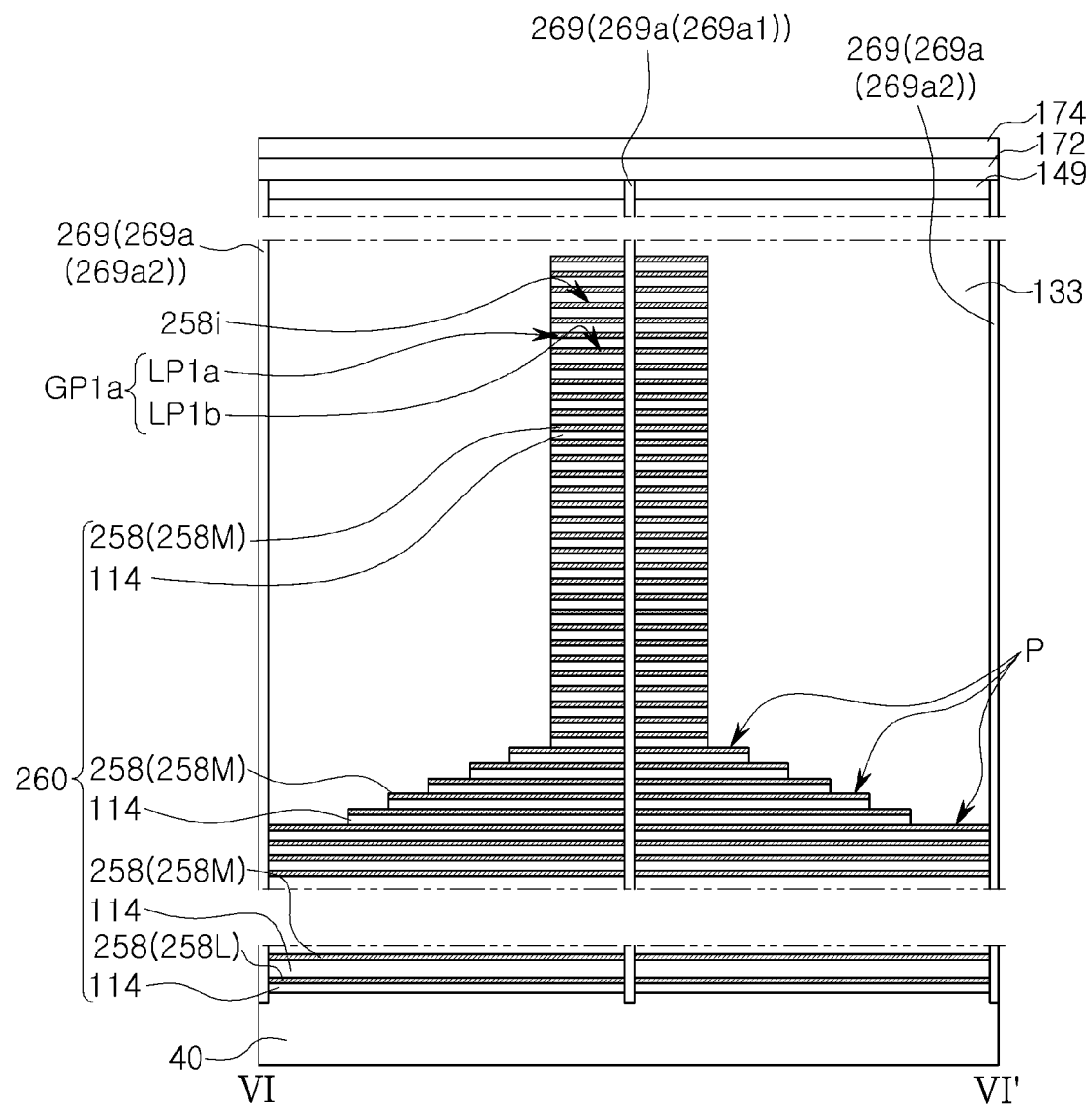

Referring to FIGS. 2 to 9 again, the first gate portion GP1 may be in the form of a single line extending from the first region A1 into the second region A2, but an exemplary embodiment thereof is not limited thereto. For example, the first gate portion GP1 may be modified into a first gate portion that may be comprised of a plurality of first line patterns spaced apart from each other. As described above, an exemplary embodiment of a semiconductor device including the first gate portion that may be composed of a plurality of first line patterns will be described with reference to FIGS. 15A to 16B. In FIGS. 15A to 16B, FIG. 15A is a conceptual plan view illustrating a three-dimensional semiconductor device according to an embodiment of the present disclosure, FIG. 15B is a conceptual plan view illustrating a three-dimensional semiconductor device according to an embodiment of the present disclosure, FIG. 16A is a cross-sectional view illustrating a region taken along line V-V' in FIG. 15A, and FIG. 16B is a cross-sectional view illustrating a region taken along line VI-VI' in FIG. 15A.

Referring to FIGS. 15A to 16B, the first gate portion GP1 of the intermediate gate patterns 158M described with reference to FIGS. 2 to 9 may be in the form of a single line extending from the first region A1 into the second region A2. The intermediate gate patterns 158M described above may be modified into intermediate gate patterns 258M including a first gate portion GP1a including a plurality of first line patterns LP1a and LP1b, as illustrated in FIGS. 15A to 16B. For example, the intermediate gate patterns 258M may include a pair of first line patterns LP1a and LP1b parallel to each other.

The intermediate gate patterns 258M may include a second gate portion GP2a parallel to the first gate portion GP1a. The second gate portion GP2a may include a plurality of second line patterns LP2. The first and second line patterns LP1a, LP1b, and LP2 of the intermediate gate patterns 258M may be connected to each other by connection patterns 258i.

Each of stacked structures 260 including the intermediate gate patterns 258M may be disposed. Each of the stacked structures 260 may include gate patterns 258 including the intermediate gate patterns 258M, a lower gate pattern 258L in a position lower than a position of the intermediate gate patterns 258M, and upper gate patterns 258Ua and 258Ub in a position higher than a position of the intermediate gate patterns 258M. Each of the stacked structures 260 may include the interlayer insulation layers 114 repeatedly stacked alternately with the gate patterns 258, as described above.

Separation structures 269, which may correspond to the separation structures 169 described above, may be disposed. The separation structures 269 may include block separation structures 269a, corresponding to the block separation structures 269a described above, and dummy separation structures 269b, corresponding to the dummy separation structures 169b described above. The block separation structures 269a may include a first block separation structure 269a1, and second block separation structures 269a2 on both side surfaces of the first block separation structure 269a1.

The intermediate gate patterns 258M positioned between the pair of neighboring first and second block separation structures 269a1 and 269a2 may include the first gate portion GP1a including the first line patterns LP1a and LP1b, the second gate portion GP2a including the second line patterns LP2, and the connection patterns 258i electrically connecting the first gate portion GP1a and the second gate portion GP2a, positioned on the same plane. The connection patterns 258i may be disposed between end portions of the dummy separation structures 269b facing each other, in a similar manner to the connection patterns 158i described above.

Figure 17A:
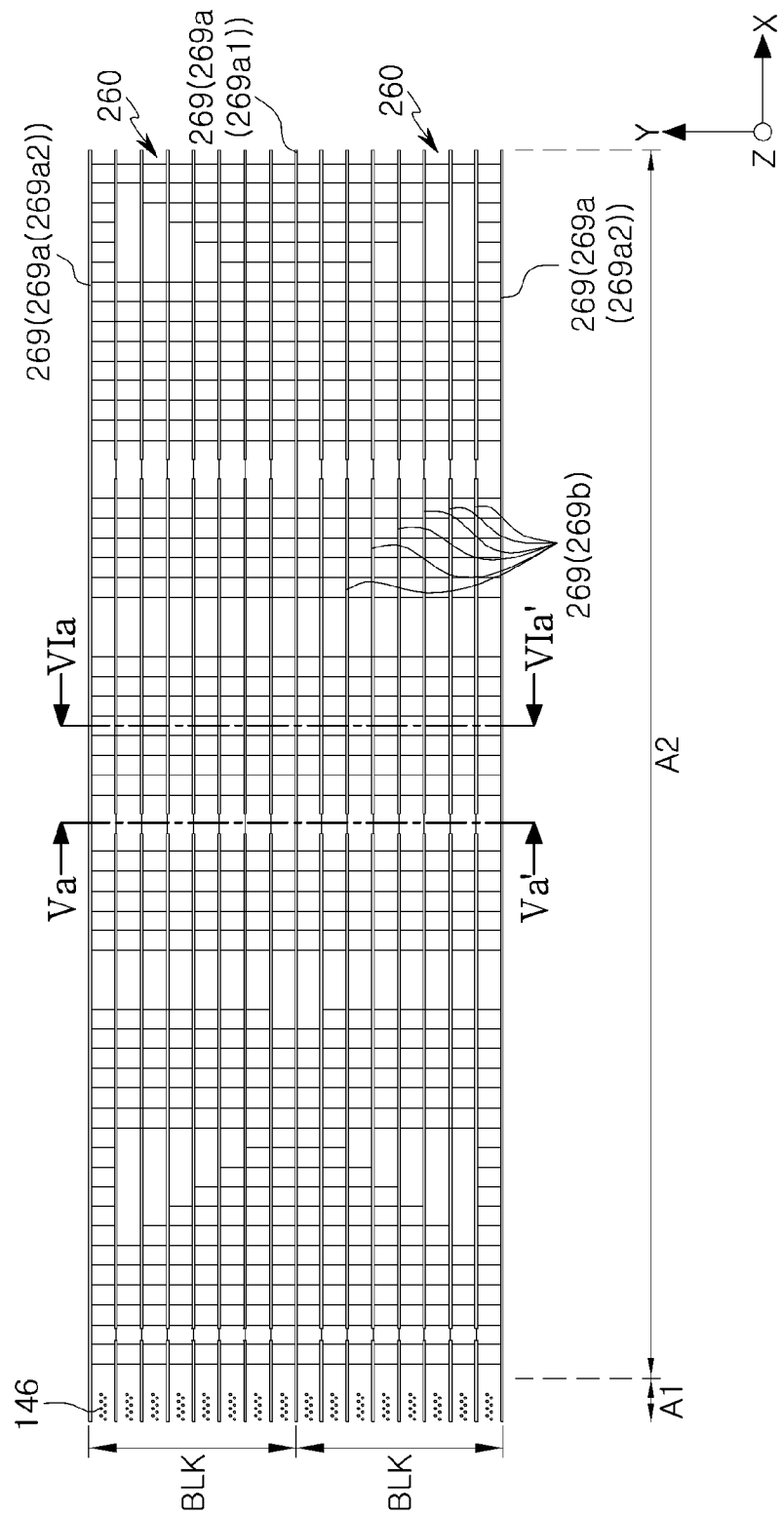
FIGS. 17A to 18B are views illustrating a modified embodiment of the three-dimensional semiconductor device according to an example embodiment.
Figure 17B:
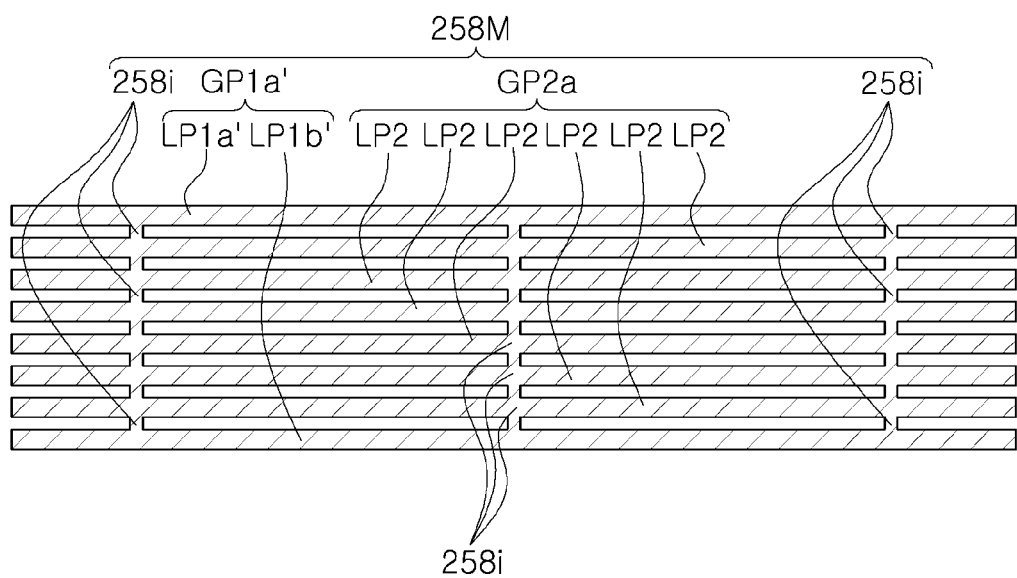
Figure 18A:
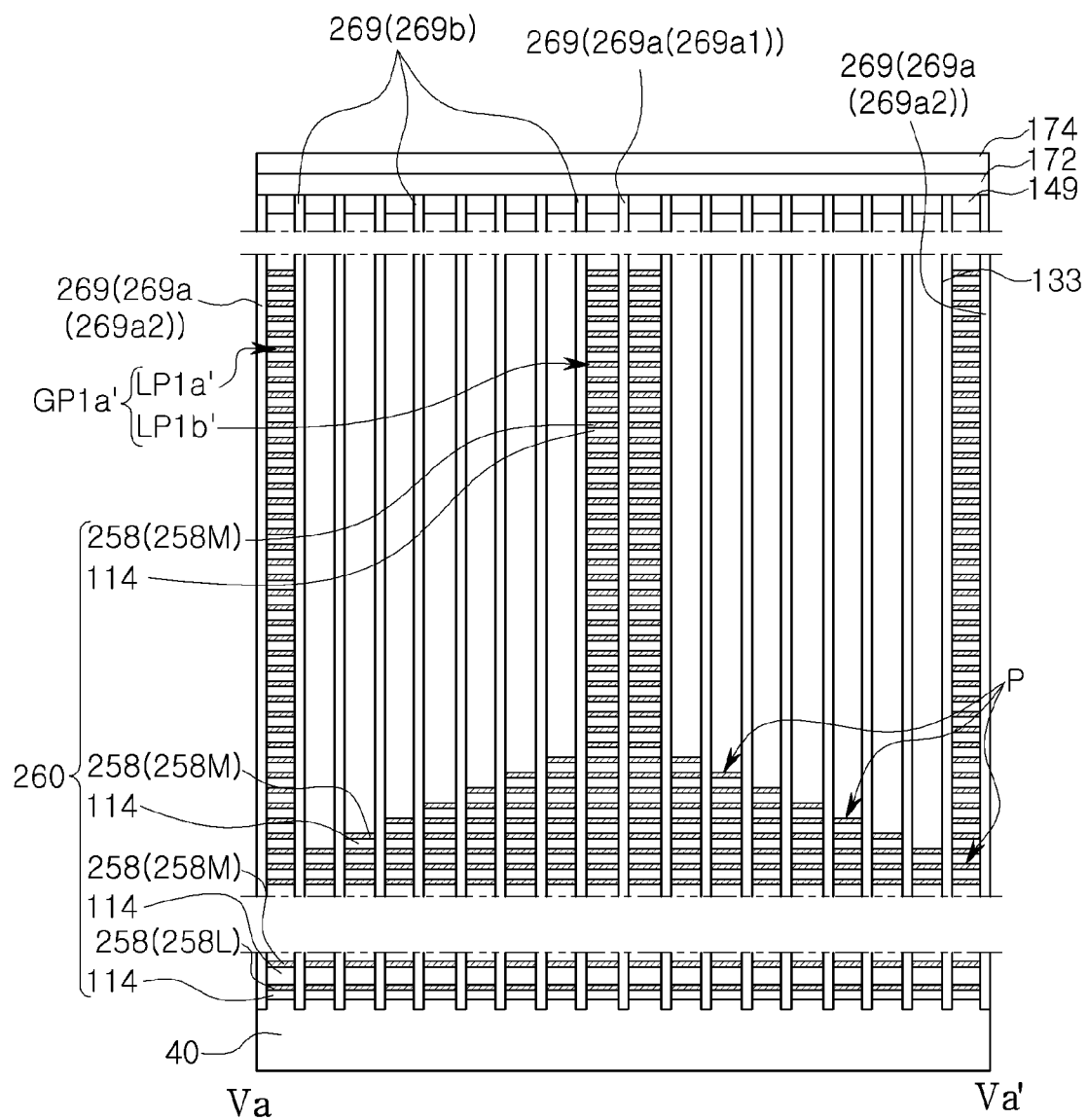
Figure 18B:
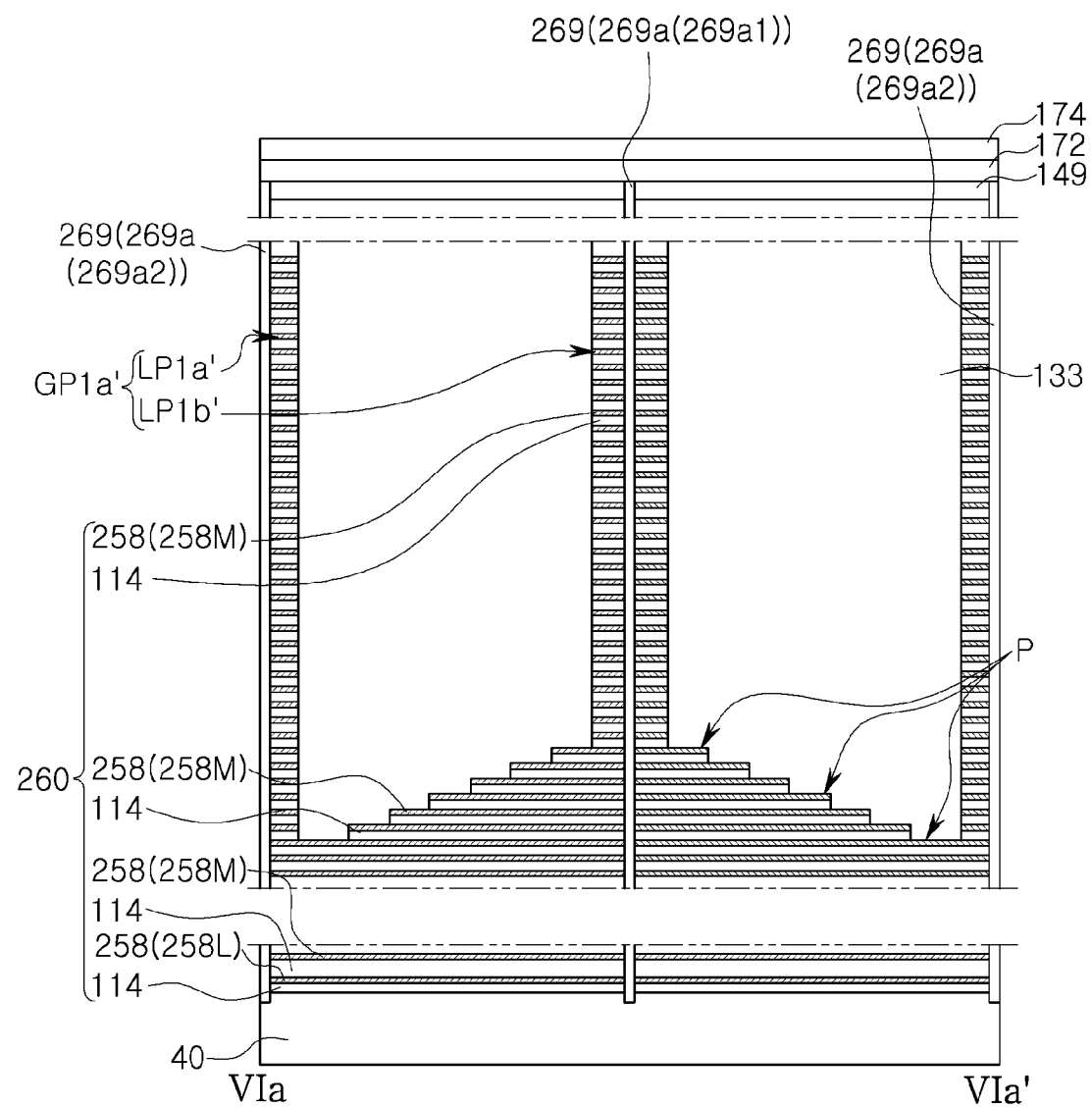

The first gate portion GP1a of the intermediate gate patterns 258M positioned between the pair of neighboring first and second block separation structures 269a1 and 269a2 may be connected to the first line patterns LP1a and LP1b and may be modified as illustrated in FIGS. 17A to 18B, but an exemplary embodiment thereof is not limited thereto. FIG. 17A is a conceptual plan view illustrating a three-dimensional semiconductor device according to an embodiment of the present disclosure, FIG. 17B is a plan view schematically illustrating an intermediate gate patterns positioned between first and second block separation structures without distinguishing pad regions, FIG. 18A is a cross-sectional view illustrating a region taken along line Va-Va' in FIG. 17A, and FIG. 18B is a cross-sectional view illustrating a region taken along line VIa-VIa' in FIG. 17A.

Referring to FIGS. 17A to 18B, the first gate portion GP1a including the first line patterns LP1a and LP1b adjacent to each other, as described with reference to FIGS. 15A to 16B, may be modified into a first gate portion GP1a' including first line patterns LP1a' and LP1b' spaced apart from each other, as in FIGS. 17A to 18B. The second line patterns LP2 of the second gate portion GP2a, as described with reference to FIGS. 15A to 16B, may be disposed between the first line patterns LP1a' and LP2a' of the first gate portion GP1a', spaced apart from each other. The first and second line patterns LP1a', LP1b', and LP2 positioned on the same plane, between the neighboring first and second block separation structures 269a1 and 269a2, as described above, may be electrically connected to each other by the connection patterns 258i as described above.

The lower structure 40 described above with reference to FIGS. 3A to 18B may be modified to include a first substrate, a peripheral circuit structure on the first substrate, and a second substrate on the peripheral circuit structure. Modified embodiments of the semiconductor device including a lower structure 40', which may be modified as described above, will be described with reference to FIGS. 19 to 26B.

Referring to FIGS. 19 to 26B, the lower structure 40' may include a first substrate 10, a peripheral circuit structure 20 on the first substrate 10, and a second substrate 30 on the peripheral circuit structure 20. The peripheral circuit structure 20 may include peripheral wiring lines 22 including peripheral pads 22P, and a peripheral insulation layer 24 covering the peripheral wiring lines 22. The first substrate 10 may be a semiconductor substrate. The second substrate 30 may be a semiconductor substrate that may be formed of polysilicon. A gap fill insulation layer 32 passing through the second substrate 30 may be disposed. The gap fill insulation layer 32 may include silicon oxide.

Figure 19:
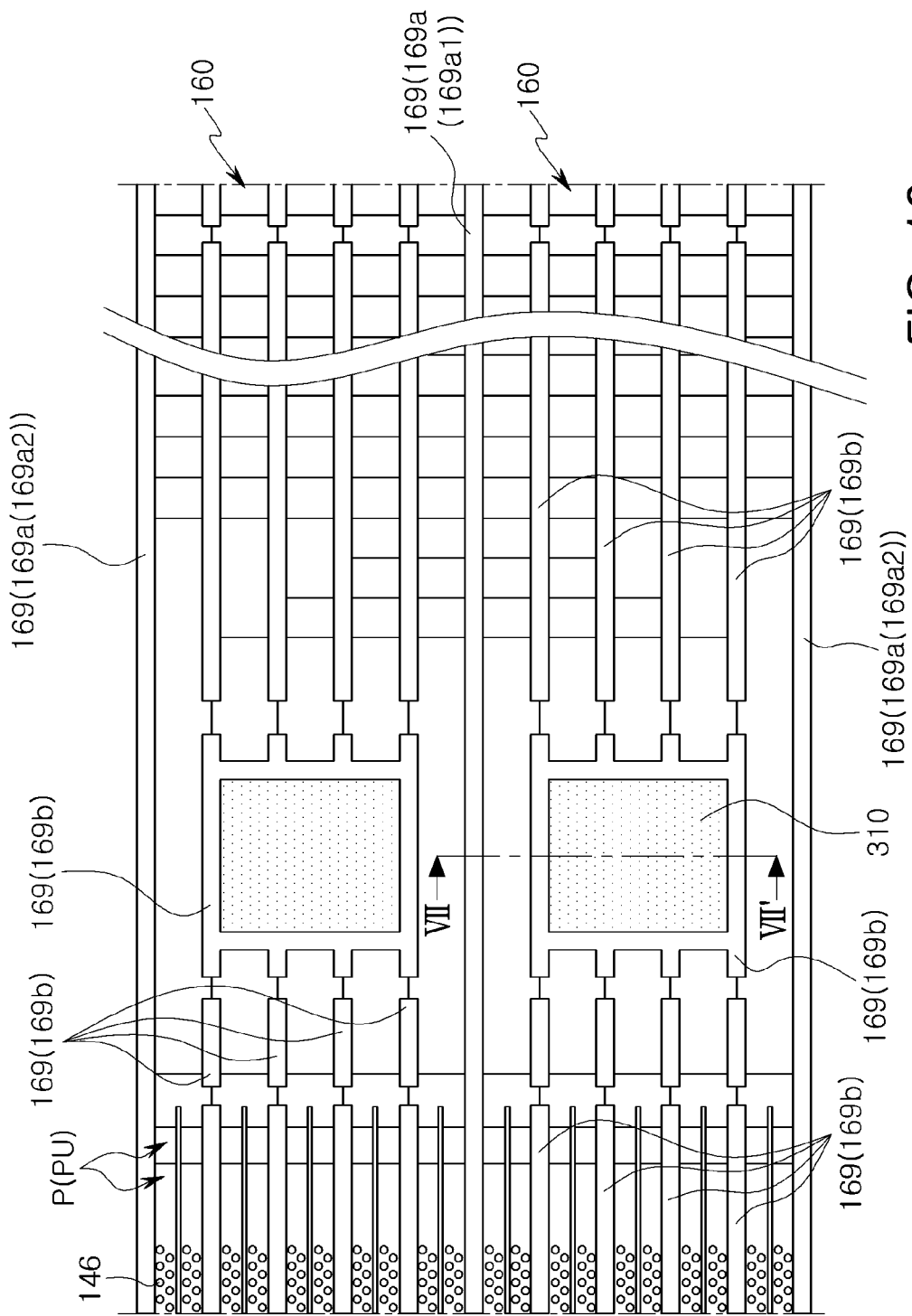
FIGS. 19 and 20 are views illustrating a modified embodiment of a three-dimensional semiconductor device according to an embodiment.

A modified embodiment of a three-dimensional semiconductor device according to an embodiment of the present disclosure will be described with reference to FIGS. 19 and 20 among FIGS. 19 to 26B. FIG. 19 is a conceptual plan view illustrating a three-dimensional semiconductor device according to an embodiment of the present disclosure, and FIG. 20 is a cross-sectional view illustrating a region taken along line VII-VII' in FIG. 19.

Figure 20:
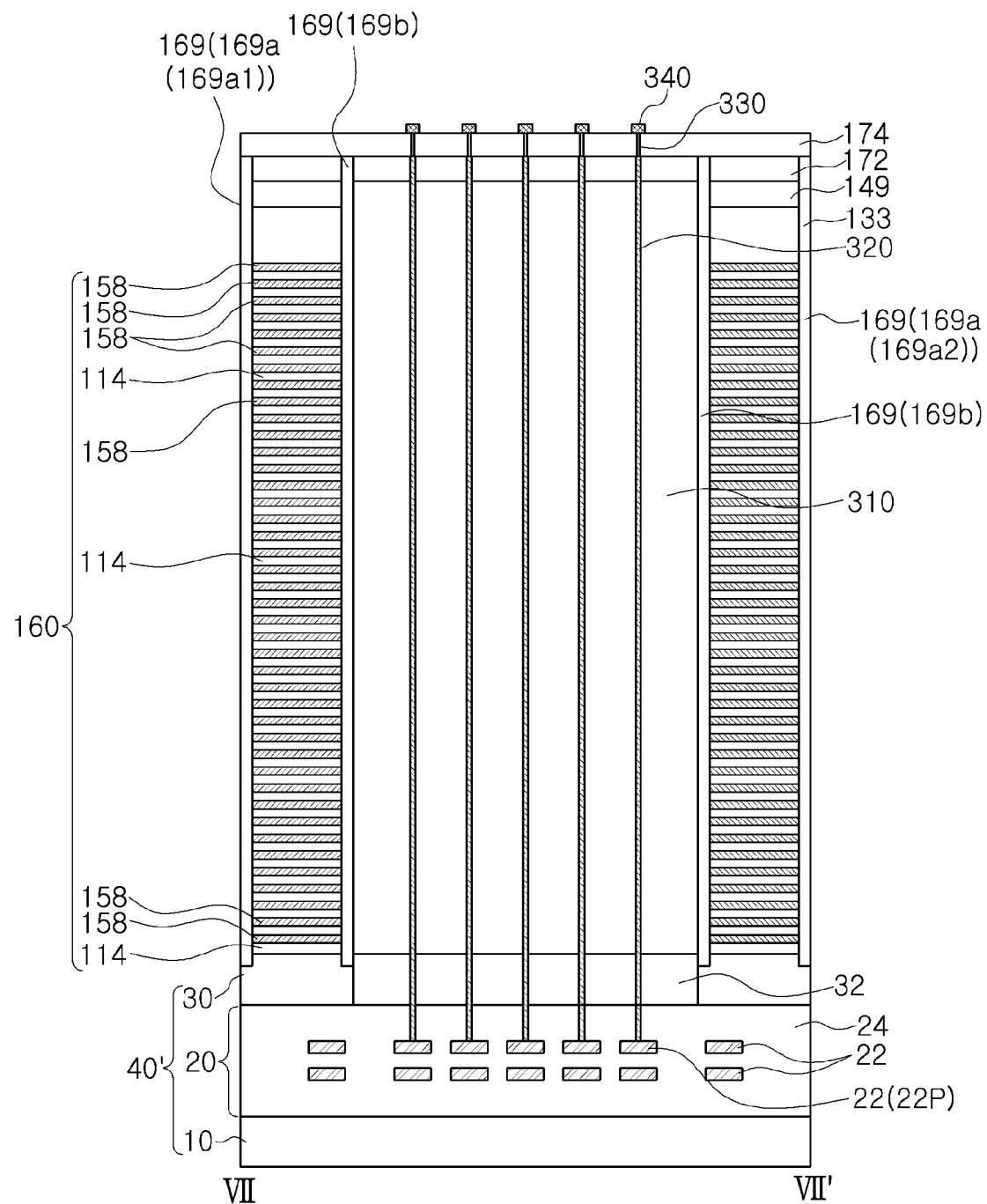

Referring to FIGS. 19 and 20, an insulation region 310 may be disposed on a second substrate 30. The insulation region 310 may overlap a gap fill insulation layer 32 and may extend upwardly to pass through a stacked structure 160. The insulation region 310 may be formed of an insulating material such as silicon. For example, the insulation region 310 may be in the form of an insulating pillar formed of a material such as silicon oxide.

In an exemplary embodiment, a portion of dummy separation structures 160b may surround side surfaces of the insulation region 310.

In an exemplary embodiment, when viewed in a vertical direction, the insulation region 310 may be disposed between pad regions of intermediate gate patterns among intermediate gate patterns 158M and pad regions of upper gate patterns 158Ua and 158Ub, that may be the word lines described above.

Peripheral contact structures 320 contacting peripheral pads 22P and extending upwardly to pass through the insulation region 310 may be disposed. Peripheral contact plugs 330 may be disposed on the peripheral contact structures 320. Peripheral connection wiring lines 340 may be disposed on the peripheral contact plugs 330. In an exemplary embodiment, the peripheral connection wiring lines 340 may be gate connection wiring lines.

Next, a modified embodiment of a three-dimensional semiconductor device according to an embodiment of the present disclosure will be described with reference to FIGS. 21 and 22. FIG. FIG. 21 is a conceptual plan view illustrating a three-dimensional semiconductor device according to an embodiment of the present disclosure, and FIG. 22 is a cross-sectional view illustrating a region taken along line VIII-VIII' in FIG. 21.

Figure 21:
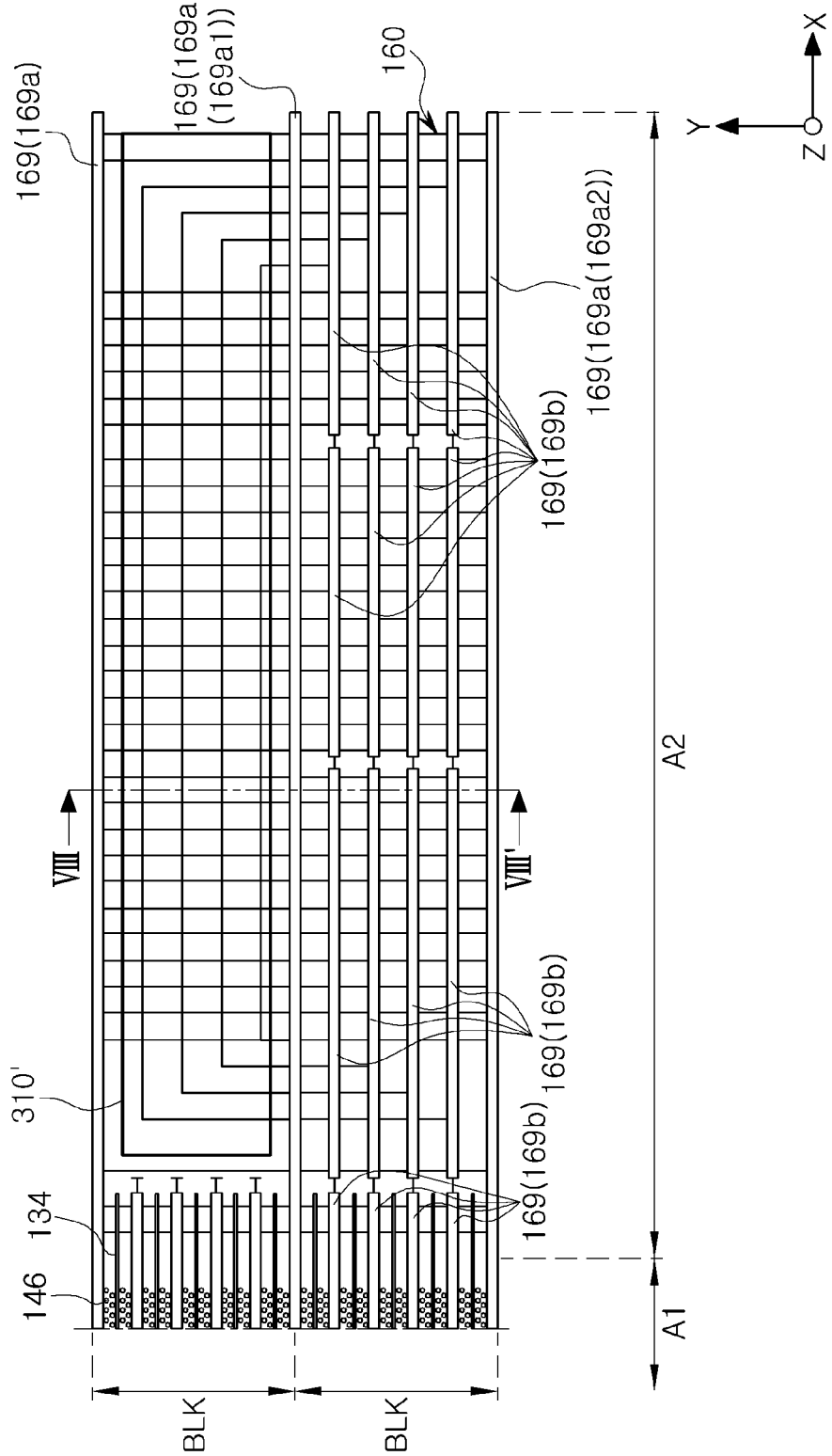
FIGS. 21 and 22 are views illustrating a modified embodiment of a three-dimensional semiconductor device according to an example embodiment.
Figure 22:
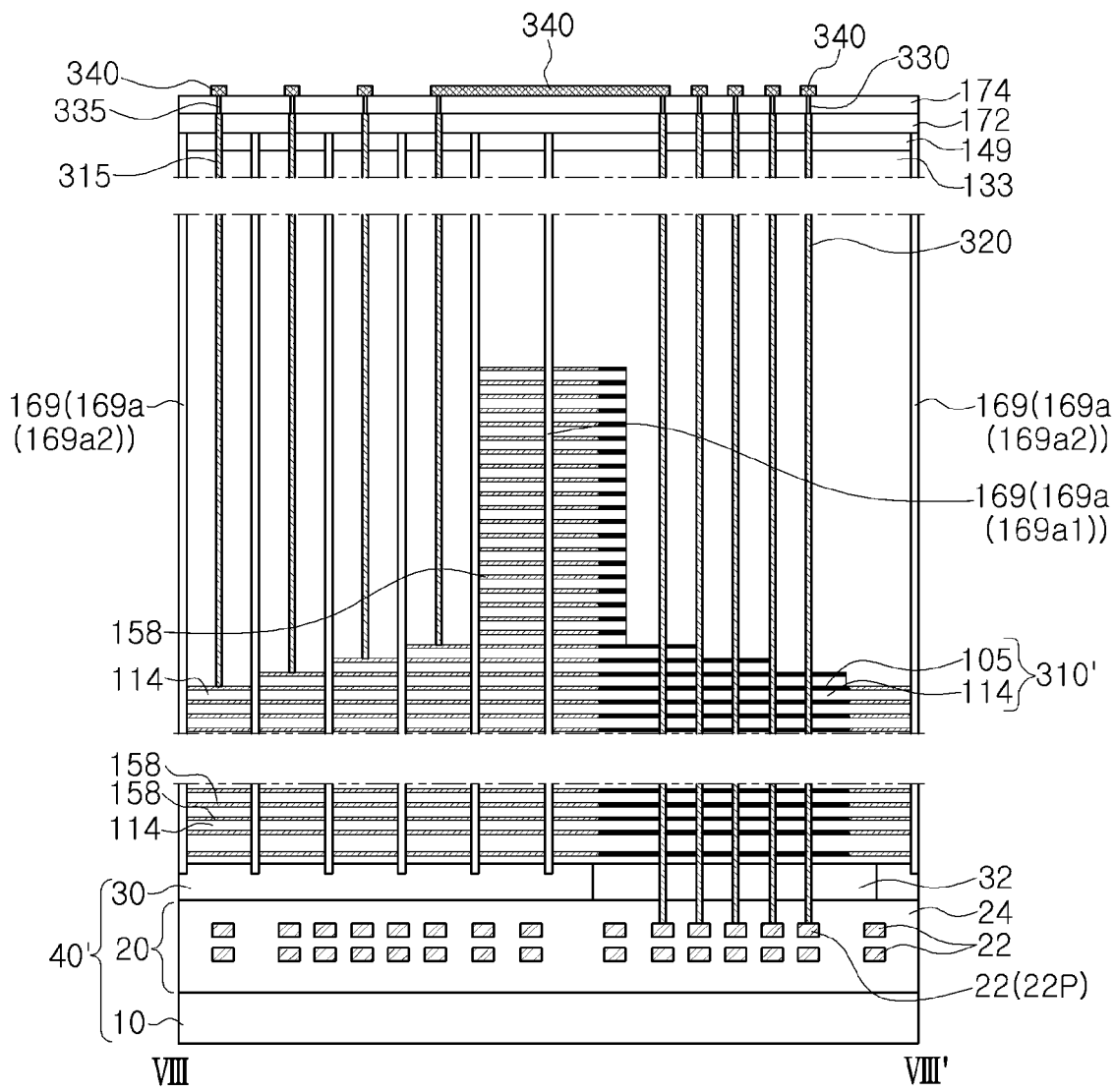

Referring to FIGS. 21 and 22, as described above, a first block separation structure 169a1 and second block separation structures 169a2 at both sides of the first block separation structure 169a1 may be disposed. In a second region A2, dummy separation structures 169b, as described above, may be disposed between any one of the second block separation structures 169a2 and the first block separation structure 169a1, and between any one of the second block separation structures 169a2 and the first block separation structure 169a1, the dummy separation structures 169b as described above may be omitted, but an insulation region 310' may be disposed.

The insulation region 310' may include dummy gate patterns 105 positioned at the same height as gate patterns 158. The dummy gate patterns 105 may be formed of an insulating material such as silicon nitride. Therefore, in the insulation region 310', interlayer insulation layers 114 and the dummy gate patterns 105 may be alternately and repeatedly stacked.

In the insulation region 310', the interlayer insulation layers 114 may be referred to as a first insulation layer, and the dummy gate patterns 105 may be referred to as a second insulation layer.

Peripheral contact structures 320 contacting peripheral pads 22P and extending upwardly to pass through the insulation region 310 may be disposed. Peripheral contact plugs 330 may be disposed on the peripheral contact structures 320. Connection wiring lines 340 may be disposed on the peripheral contact plugs 330. In an exemplary embodiment, the peripheral connection wiring lines 340 may be gate connection wiring lines.

Gate contact structures 315 may be disposed on the pad regions P of the gate patterns 158 described above. Gate contact plugs 335 may be disposed on the gate contact structures 315. The connection wiring lines 340 may be disposed on the gate contact plugs 335. The connection wiring lines 340 may electrically connect the gate patterns 158 and peripheral wiring lines 22.

Figure 23:
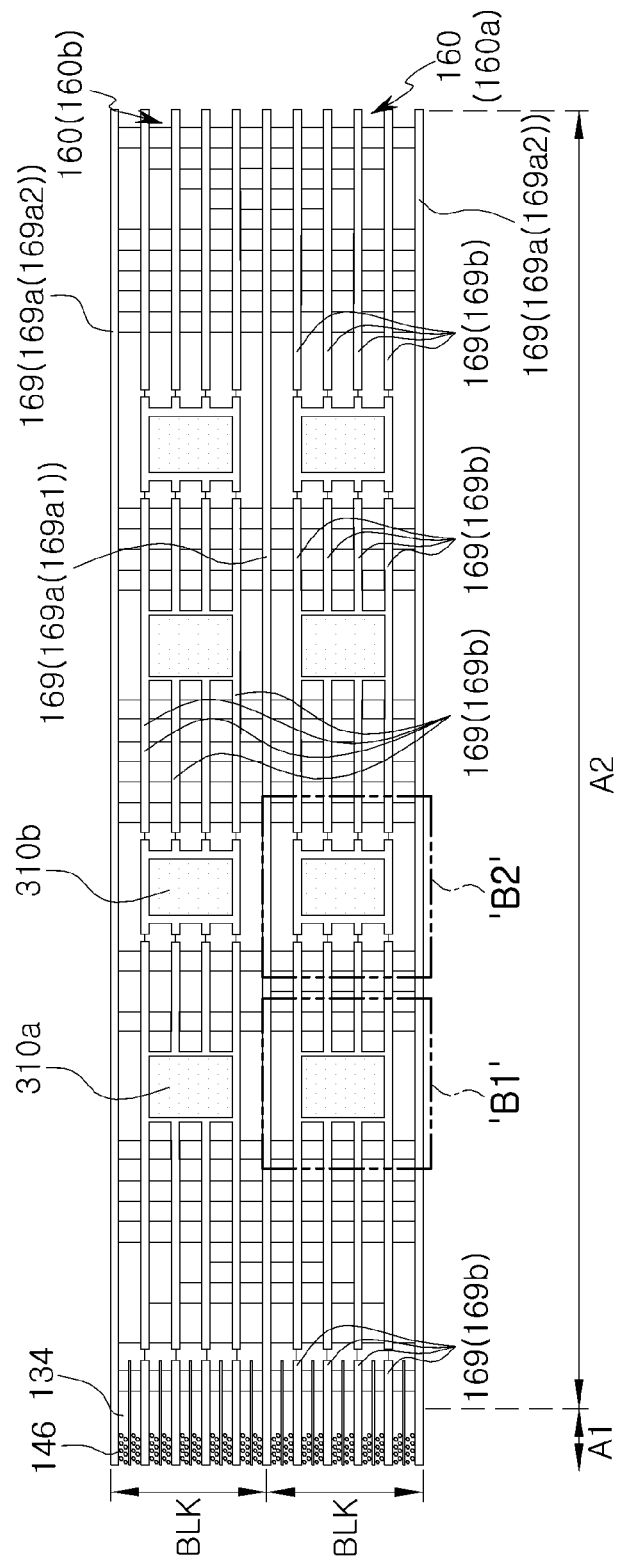
FIGS. 23 to 26B are views illustrating a modified embodiment of the three-dimensional semiconductor device according to an example embodiment.
Figure 24A:
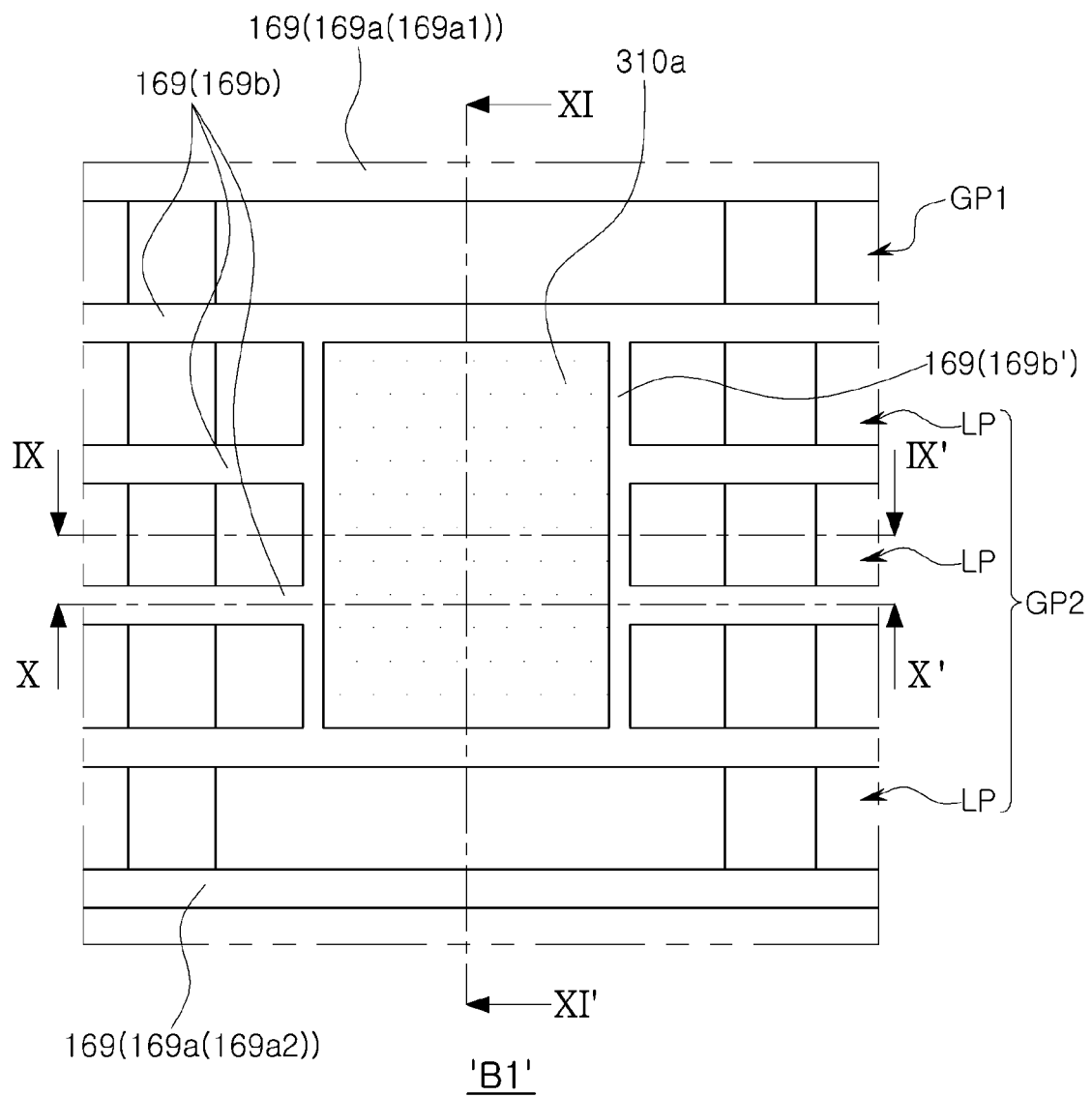
Figure 24B:
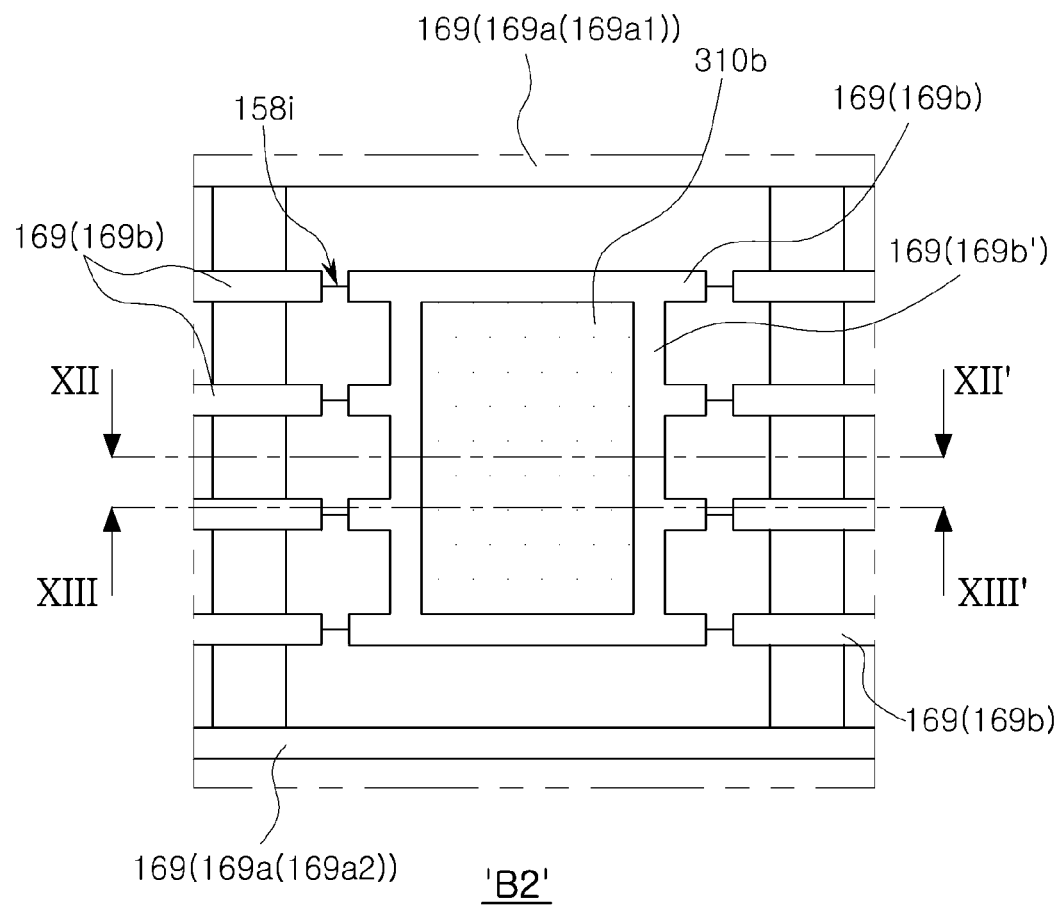
Figure 25A:
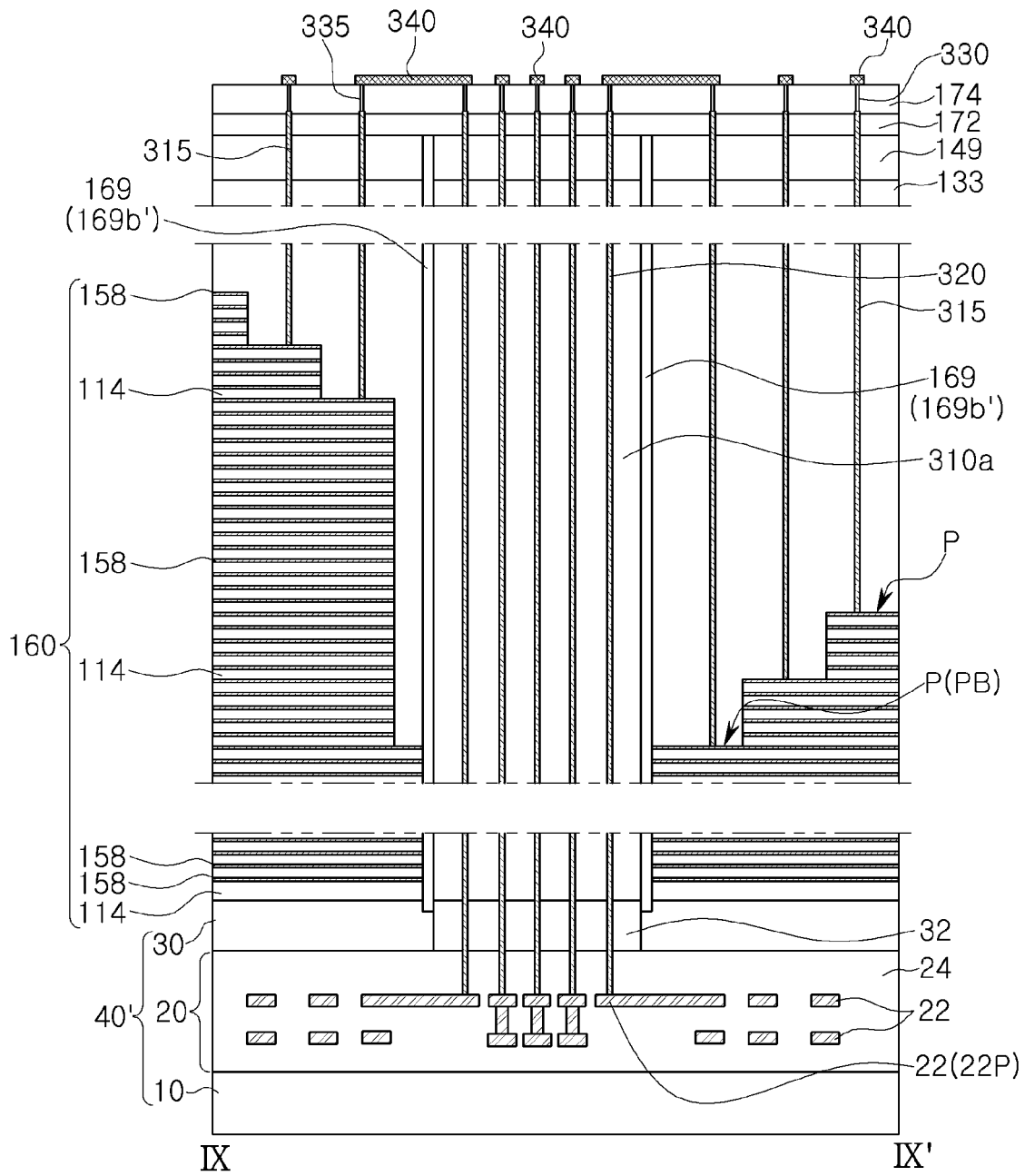
Figure 25B:
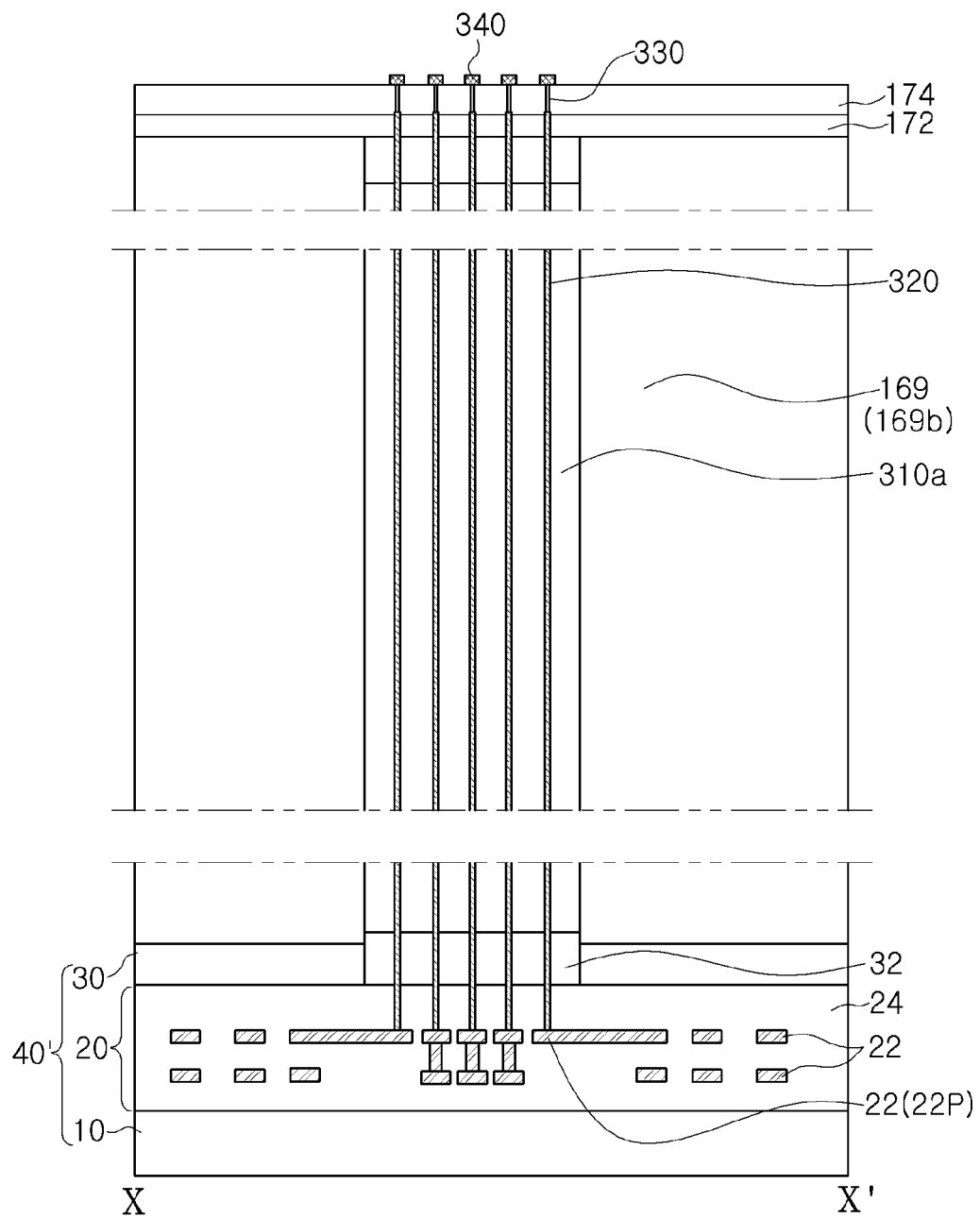
Figure 25C:
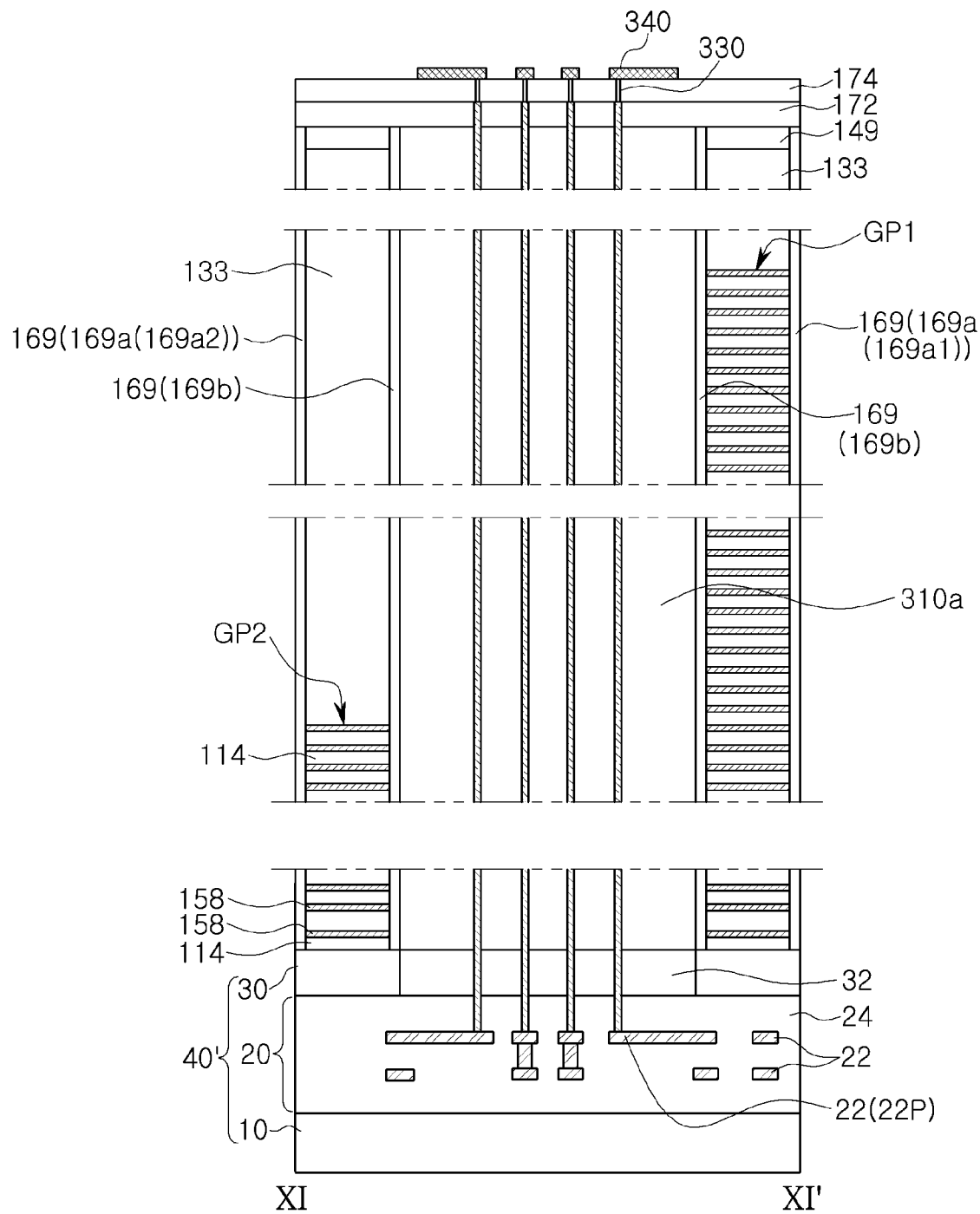
Figure 26A:
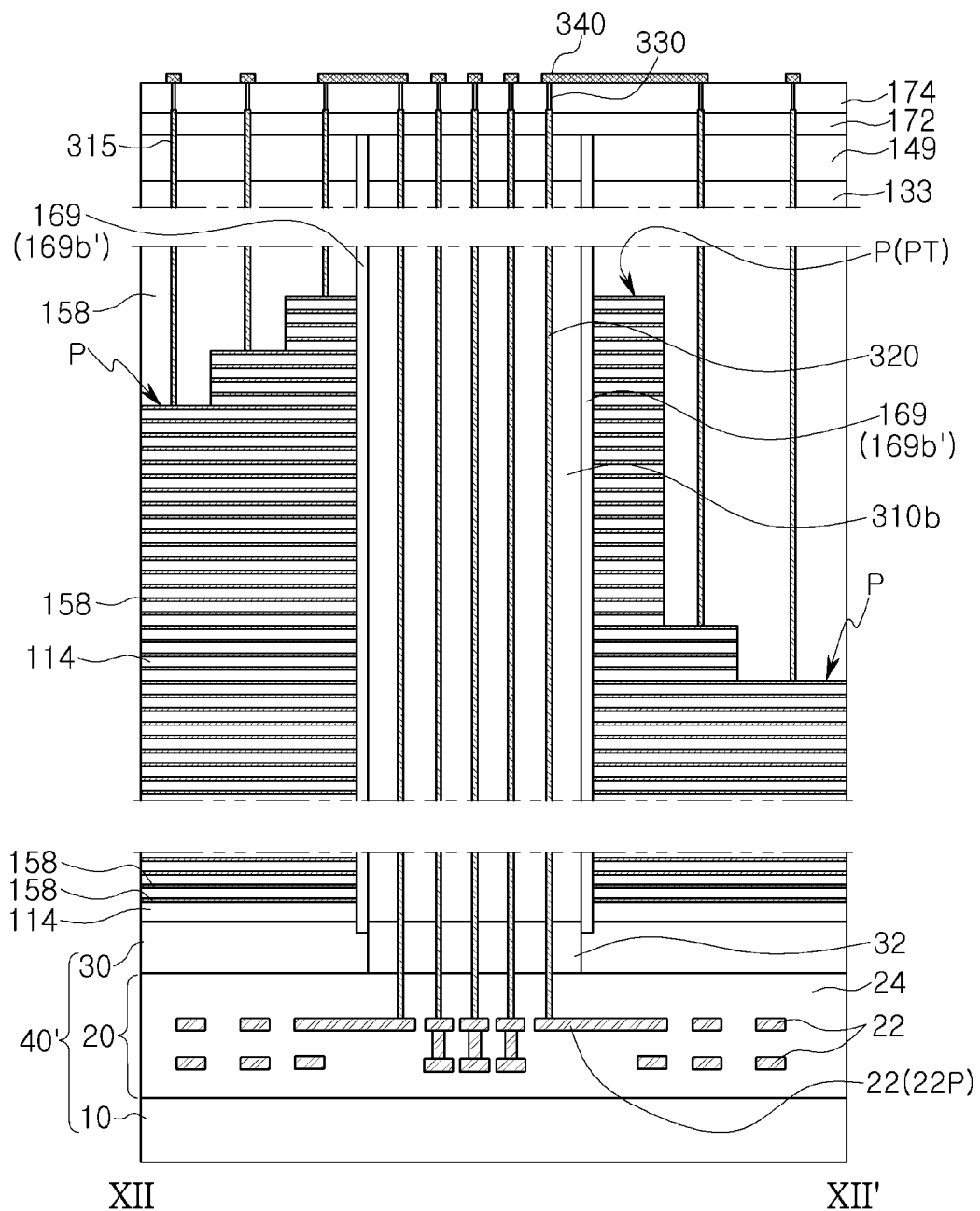
Figure 26B:
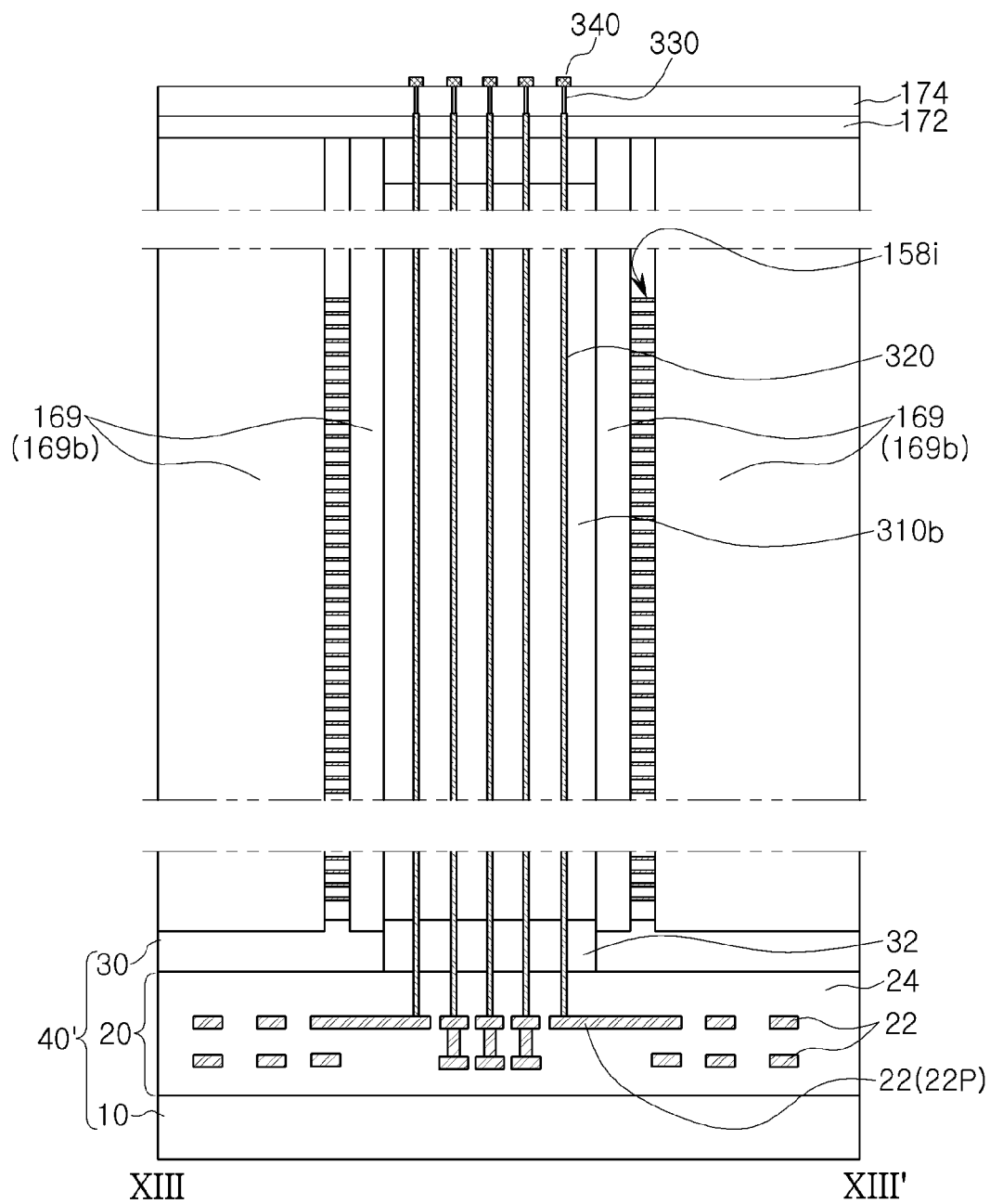

Next, a modified embodiment of a three-dimensional semiconductor device according to an embodiment of the present disclosure will be described with reference to FIGS. 23, 24A, 24B, 25A, 25B, 25C, 26A, and 26B. FIG. 23 is a conceptual plan view illustrating a three-dimensional semiconductor device according to an embodiment of the present disclosure, FIG. 24A is an enlarged view of portion B1' in FIG. 23, FIG. 24B is an enlarged view of portion B2' in FIG. 23, FIG. 25A is a cross-sectional view illustrating a region taken along line IX-IX' in FIG. 24A, FIG. 25B is a cross-sectional view illustrating a region taken along line X-X' in FIG. 24A, FIG. 25C is a cross-sectional view illustrating a region taken along line XI-XI' in FIG. 24A, FIG. 26A is a cross-sectional view illustrating a region taken along line XII-XII' in FIG. 24B, and FIG. 26B is a cross-sectional view illustrating a region taken along line XIII-XIII' in FIG. 24B.

Referring to FIGS. 23 to 26B, in the first upwardly stepped regions (SUa1 and SUb1 in FIG. 6A) of each of the above-described stacked structures 160, a lowermost pad region P in the first direction X may be modified into a lower pad region PB by modifying a length thereof in the first direction X to be increased. In each of the above-described first upwardly stepped regions (SUa1 and SUb1 in FIG. 6A), an uppermost pad region P in the first direction X may be modified into an upper pad region PT by modifying a length thereof in the first direction X to be increased.

A first insulation region 310a passing through the lower pad region PB and gate patterns 158 in a position lower than a position of the lower pad region PB may be disposed. The first insulation region 310a may overlap a gap fill insulation layer 32 passing through a second substrate 30.

A second insulation region 310b passing through the upper pad region PT and gate patterns 158 in a position lower than a position of the upper pad region PT may be disposed. The second insulation region 310b may overlap a gap fill insulation layer 32 passing through a second substrate 30.

In an exemplary embodiment, the first and second insulation regions 310a and 310b may be formed in the form of a pillar of an insulating material such as silicon oxide, but an exemplary embodiment thereof is not limited thereto. For example, when the first and second insulation regions 310a and 310b are formed of an insulating material, the first and second insulation regions 310a and 310b may be considered to be within the technical scope of the present disclosure. For example, each of the first and second insulation regions 310a and 310b may include insulation layers alternately and repeatedly stacked.

A portion of peripheral contact structures 320 may contact peripheral pads 22P and may extend upwardly to pass through the gap fill insulation layer 32 and the first insulation region 310a, and a portion of the first insulation layer 320 may contact peripheral pads 22P and may extend upwardly to pass through the gap fill insulation layer 32 and the second insulation region 310b.

As described above, gate contact structures 315 may be disposed on the pad regions P of the gate patterns 158. A portion of the gate contact structures 315 may be disposed on the lower pad region PB, and a portion thereof may be disposed on the upper pad region PT.

In an exemplary embodiment, a dummy separation structure 169b may include a portion 169b' extending in the second direction Y to surround a side surface of a first insulation region 310a and a side surface of a second insulation region 310b.

In an exemplary embodiment, dummy separation structures 169b and 169b' surrounding the side surface of the second insulation region 310b may be spaced apart from other dummy separation structures 169b in the upper pad region PT. Therefore, in the upper pad region PT, connection patterns 158i may be disposed. In the upper pad region PT, the connection patterns 158i arranged in the first direction X may oppose each other, with the second insulation region 310b interposed therebetween.

Next, a method of forming the stepped structure of the stacked regions S1, S2, S3', and S4 of the stacked structure 160 as described in FIG. 14 will be described with reference to FIGS. 27A to 27E. FIGS. 27A to 27E are conceptual perspective views illustrating a method of forming the stepped shapes of the pad regions P of the intermediate gate patterns 158M and the upper gate patterns 158Ua and 158Ub in the above-described stacked structure 160.

Figure 27A:
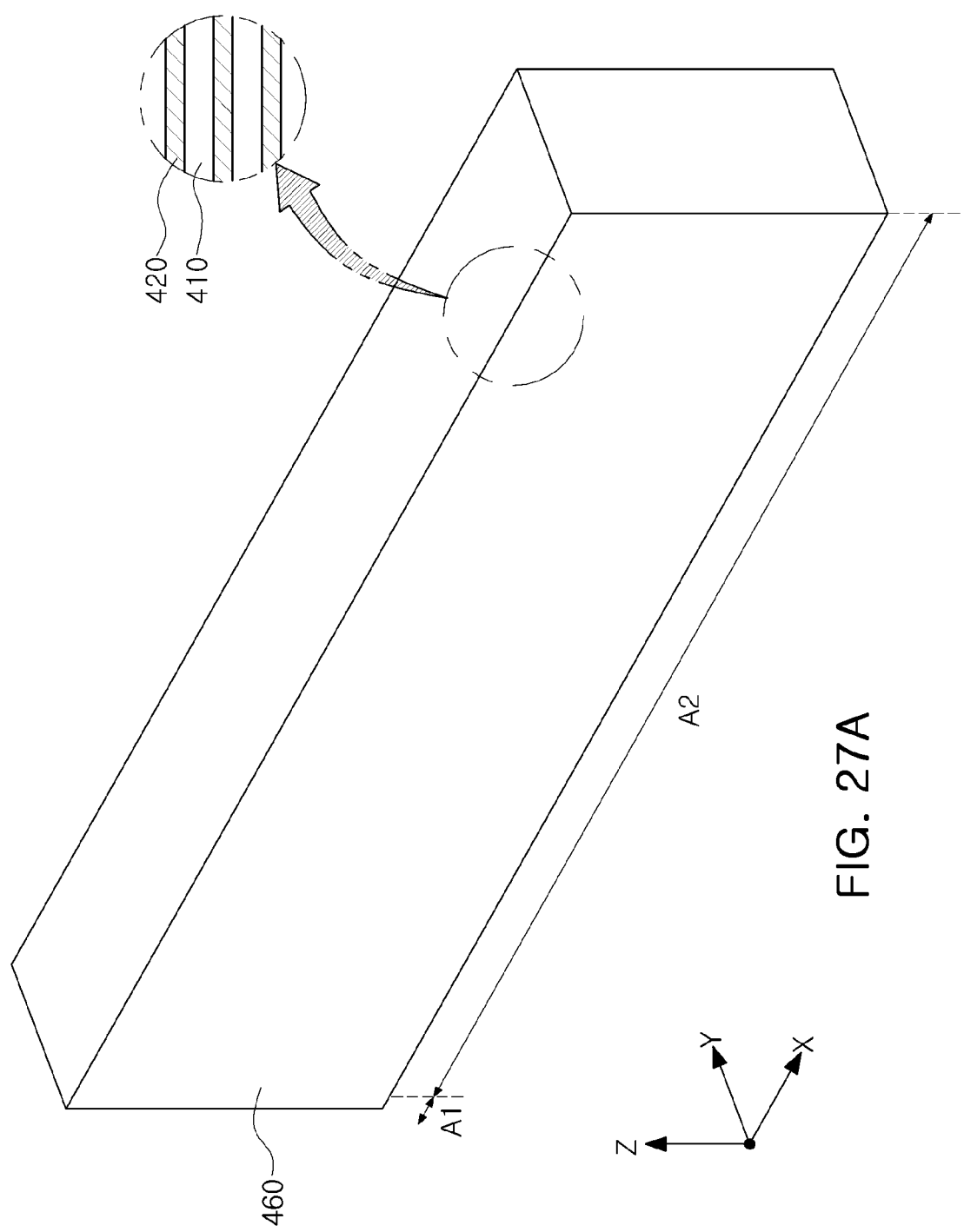
FIGS. 27A to 27E are perspective views illustrating an exemplary embodiment of a method of forming a three-dimensional semiconductor device according to an example embodiment.

Referring to FIG. 27A, a mold structure 460 may be formed. The mold structure 460 may be formed on the lower structure 40 described above. In the case where the stacked structure 160 described above includes the lower gate pattern 158L, a pattern having the same shape as the lower gate pattern 158L may be formed, and then the mold structure 460 may be formed. The mold structure 460 may include interlayer insulation layers 410 and gate layers 420, alternately and repeatedly stacked.

The interlayer insulation layers 410 may be formed of silicon oxide.

In an exemplary embodiment, the gate layers 420 may be formed of a conductive material, such as one of doped silicon of an N or P type, metal nitride (e.g., TiN, or the like), metal silicide (e.g., TiSi, WSi, or the like), and metal (e.g., W, or the like), or a combination thereof.

In another example, the gate layers 420 may be formed of an insulating material, for example, silicon nitride, other than the interlayer insulation layers 410.

Figure 27B:
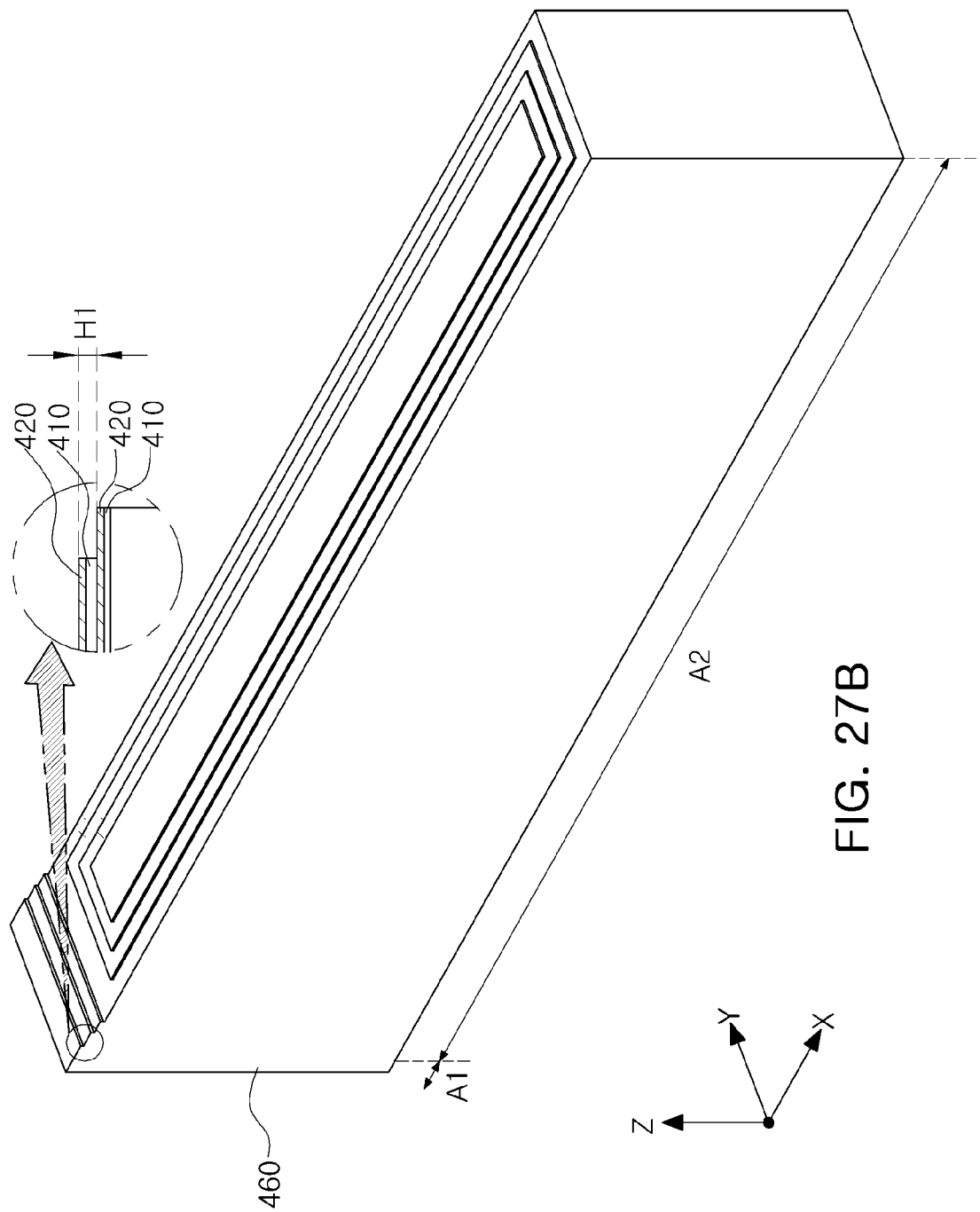

Referring to FIG. 27B, in the second region A2 described above, the mold structure 460 may be patterned to form stepped structures lowering in a unit of a first height HE Stepped structures lowering in a unit of the first region H1 in a region covering from the first region A1 to the second region A2 described above, and stepped structures having a square ring shape, spaced apart from the above stepped structures and lowering in a unit of the first height H1 in a center region of the second region A2, may be formed.

The first height H1 may refer to a height between an upper surface of one gate layer 420 and an upper surface of the other gate layer 420 adjacent thereto in a vertical direction Z.

Figure 27C:
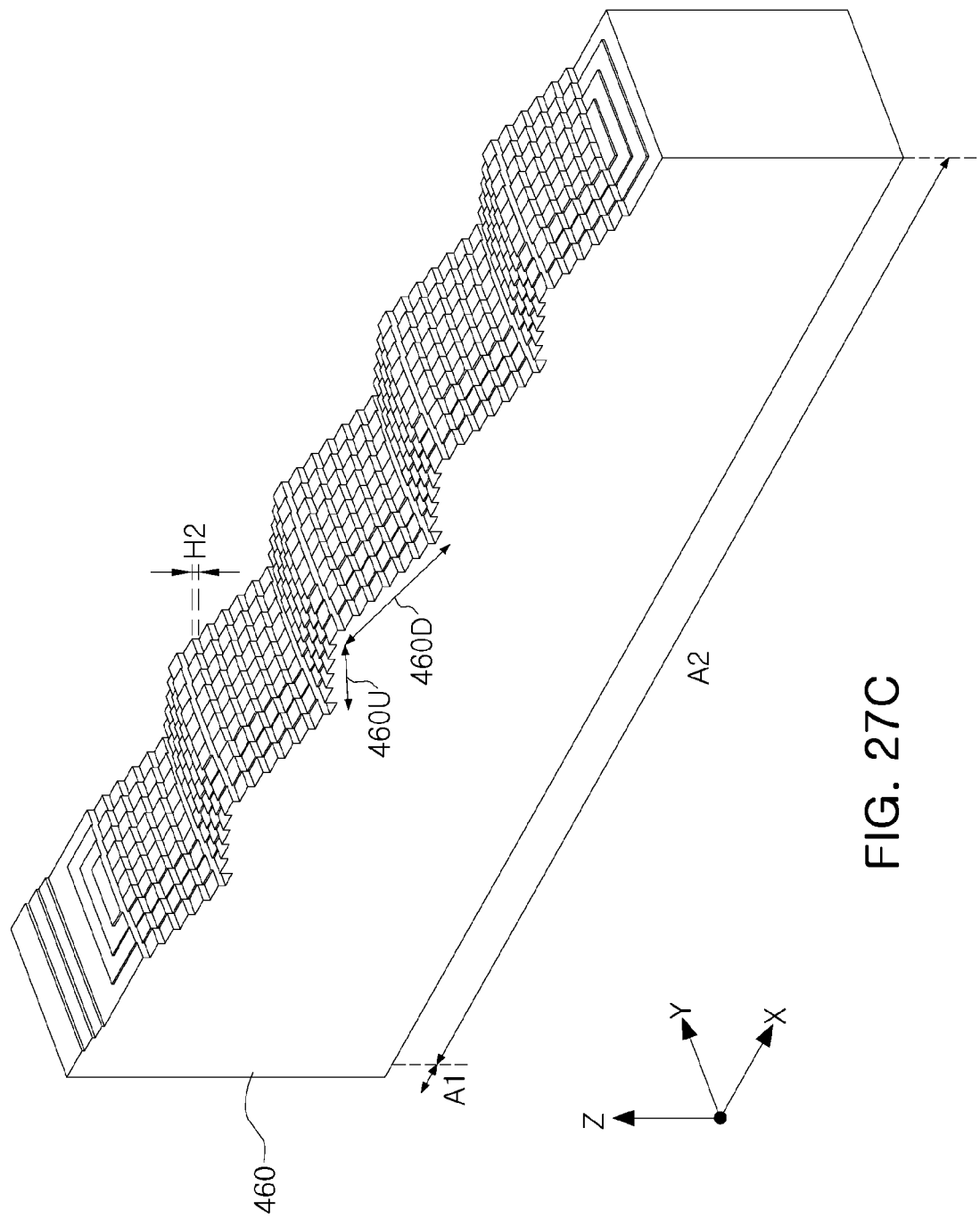

Referring to FIG. 27C, downwardly stepped regions 460D and upwardly stepped region 460U, which may be alternately and repeatedly arranged in the first direction X, may be formed by patterning the above-described stepped structures having a square ring shape and lowering in a unit of the first height H1. The downwardly stepped region 460D and the upwardly stepped region 460U, which may be alternately and repeatedly arranged, may start from a downwardly stepped region 460D and end with another downwardly stepped region 460D.

In an exemplary embodiment, the greater the number of downwardly stepped regions 460D and upwardly stepped regions 460U, which may be alternately and repeatedly arranged in the first direction X, the greater the number of stacked layers of the gate patterns 158 may be.

The downwardly stepped region 460D may be gradually lowered in a unit of a second height H2, greater than the first height H1, in the first direction X, and the upwardly stepped region 460U may be gradually lowered in a unit of the second height H2.

Figure 27D:
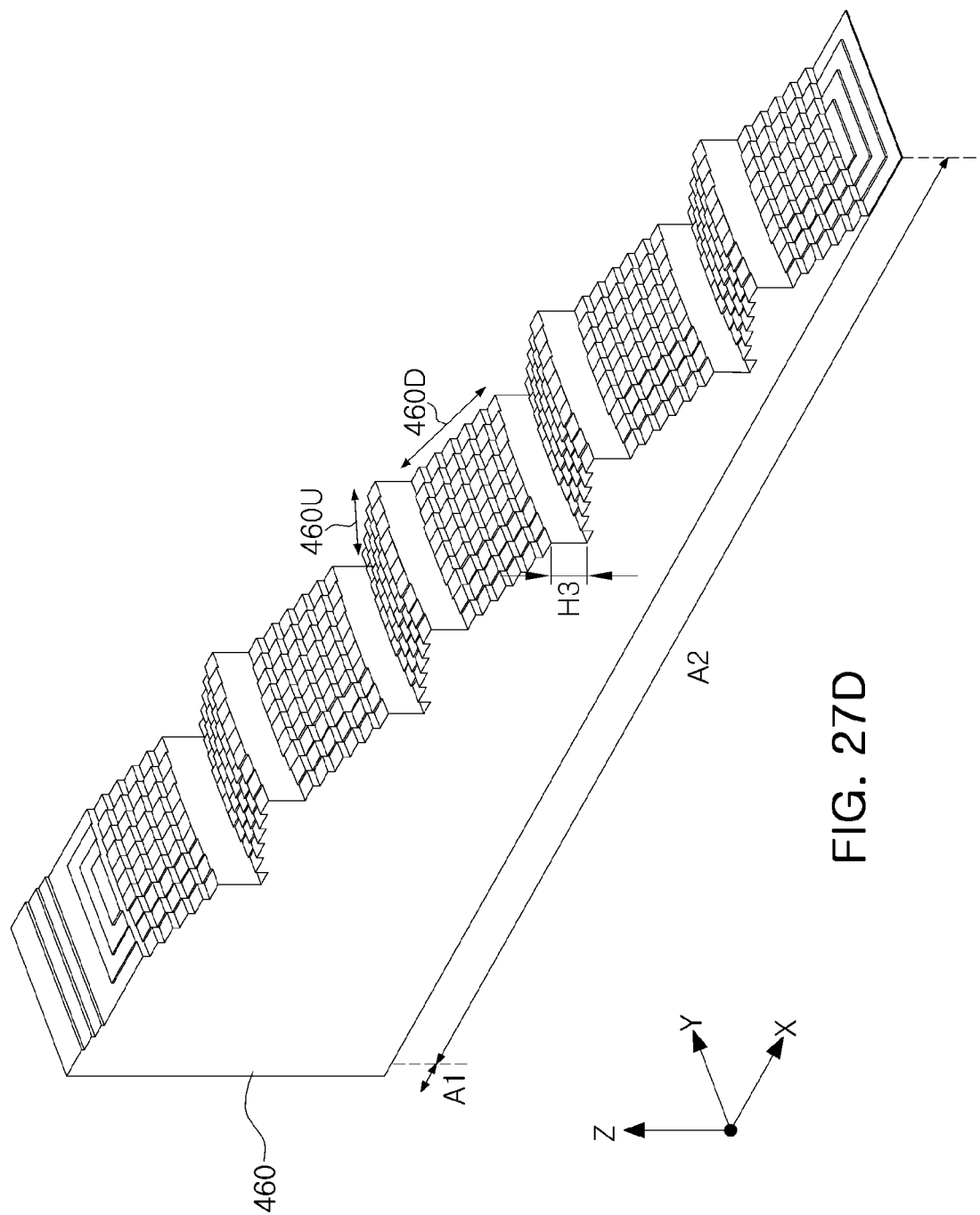

Referring to FIG. 27D, in the downwardly stepped regions 460D and the upwardly stepped regions 460U, which may be alternately and repeatedly arranged in the first direction X, the mold structure 460 may be patterned, such that a step difference between the downwardly stepped region 460D and the upwardly stepped region 460U may be formed in a unit of a third height H3, greater than the second height H2, in the first direction X.

Figure 27E:
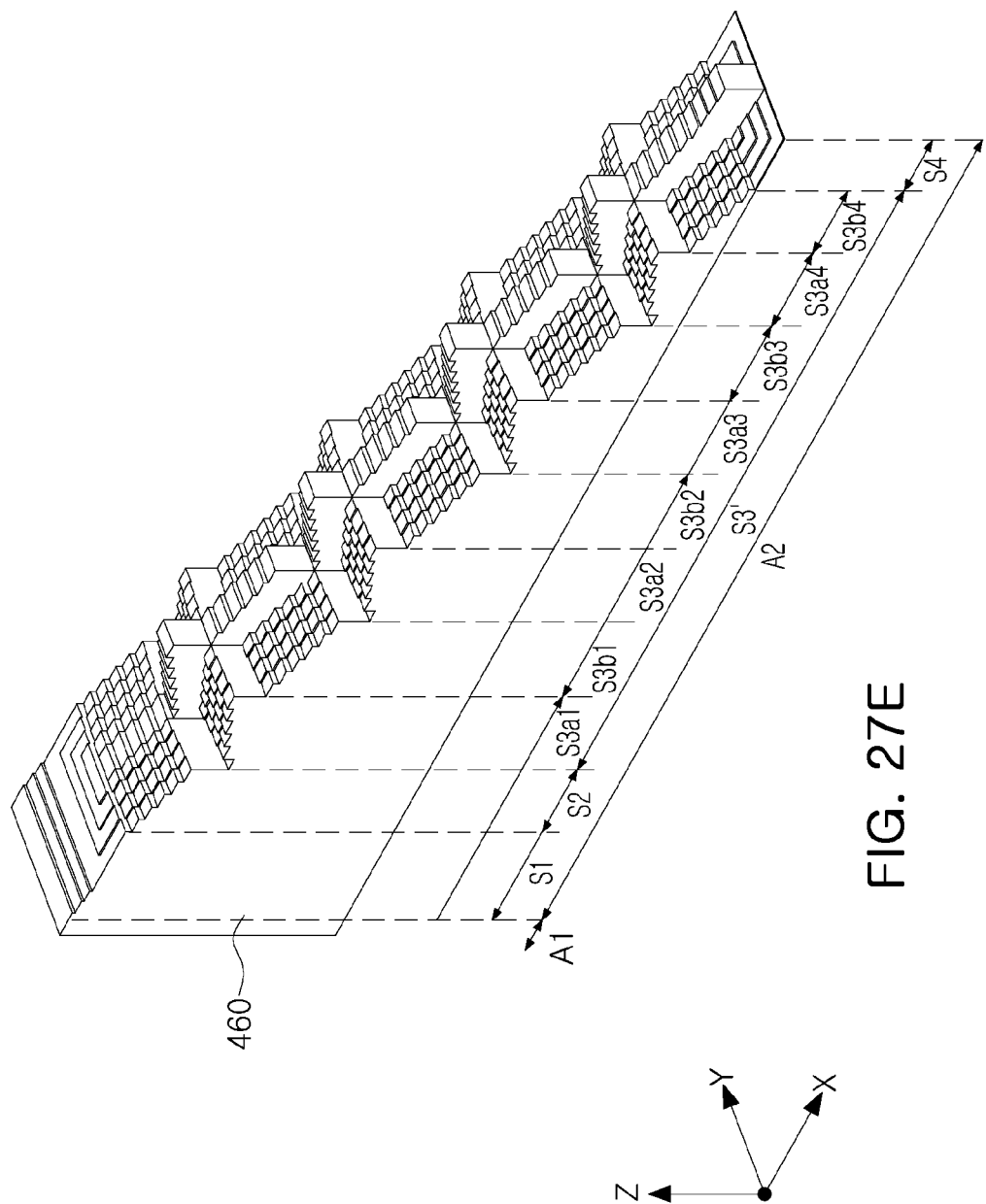

Referring to FIG. 27E, in a region covering from a first upwardly stepped region 460U to an end of the mold structure 460 among the downwardly stepped regions 460D and the upwardly stepped regions 460U, which may be alternately and repeatedly arranged in the first direction X, both sides about a central portion in the region covering from a first upwardly stepped region 460U to an end of the mold structure 460 may be etched in a unit of the third height H3. Therefore, the same stepped structure as that of the stacked regions S1, S2, S3', and S4 of the stacked structure 160 as described in FIG. 14 may be formed.

According to embodiments of the disclosure, by providing pad regions arranged in a new stepped structure, the number of gates stacked in the vertical direction may be increased. Therefore, a three-dimensional semiconductor device capable of improving the degree of integration may be provided.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While example embodiments have been shown and described above, it will be apparent to those skilled in the art that modifications and variations could be made without departing from the scope of the present disclosure as defined by the appended claims.

What is claimed is:

1. A three-dimensional semiconductor device comprising:
a lower structure;
a stacked structure disposed in a first region and a second region on the lower structure, the stacked structure including gate patterns stacked in a vertical direction, perpendicular to an upper surface of the lower structure, the gate patterns including pad regions disposed in a stepped structure in the second region; and
vertical channel structures disposed on the lower structure and having a side surface facing the gate patterns, wherein:
the stacked structure includes a first stacked region, a second stacked region and a third stacked region that are sequentially arranged in the second region in a first direction,
the first stacked region includes a first stepped region, having a stepped structure changing in a unit of a first height,
the second stacked region includes a second stepped region, having a stepped structure, lowered in a unit of a second height, greater than the first height in the first direction,
the third stacked region includes an upwardly stepped region and a downwardly stepped region,
the upwardly stepped region of the third stacked region has a stepped structure raising in a unit of the second height in the first direction, and
the downwardly stepped region of the third stacked region has a stepped structure lowered in a unit of the second height in the first direction.

2. The three-dimensional semiconductor device according to claim 1, wherein the upwardly stepped region of the third stacked region and the downwardly stepped region of the third stacked region are sequentially arranged in the first direction.

3. The three-dimensional semiconductor device according to claim 2, wherein:
the upwardly stepped region of the third stacked region includes a first upwardly stepped region and a second upwardly stepped region, positioned on different height levels and are sequentially arranged in a second direction,
the downwardly stepped region of the third stacked region includes a first downwardly stepped region and a second downwardly stepped region which are positioned on different height levels and are sequentially arranged in a second direction, and
the second direction is parallel to the upper surface of the lower structure and perpendicular to the first direction.

4. The three-dimensional semiconductor device according to claim 3, wherein:
the first upwardly stepped region of the third stacked region and the first downwardly stepped region of the third stacked region are sequentially arranged in the first direction,
the second upwardly stepped region of the third stacked region and the second downwardly stepped region of the third stacked region are sequentially arranged in the first direction,
pad regions of the first downwardly stepped region of the third stacked region are positioned on a lower level than pad regions of the first upwardly stepped region of the third stacked region, and
pad regions of the second downwardly stepped region of the third stacked region are positioned on a lower level than pad regions of the second upwardly stepped region of the third stacked region.

5. The three-dimensional semiconductor device according to claim 4, wherein:
the pad regions in the first upwardly stepped region of the third stacked region are disposed in a stepped structure in which the pad regions are raised in a unit of the first height in the second direction and in a unit of the second height in the first direction, and
the pad regions of the second upwardly stepped region of the third stacked region are disposed in a stepped structure in which the pad regions are raised in a unit of the second height in the first direction.

6. The three-dimensional semiconductor device according to claim 5, wherein:
the pad regions of the first downwardly stepped region of the third stacked region are disposed in a stepped structure in which the pad regions are raised in a unit of the first height in the second direction and lowered in a unit of the second height in the first direction, and
the pad regions of the second downwardly stepped region of the third stacked region are disposed in a stepped structure in which the pad regions are lowered in a unit of the second height in the first direction.

7. The three-dimensional semiconductor device according to claim 4, wherein:
the second stacked region includes a first downwardly stepped region in which the pad regions that are lowered in a unit of the second height in the first direction and raised in a unit of the first height in the second direction are positioned, and a second downwardly stepped region in which the pad regions that are lowered in a unit of the second height in the first direction are positioned, and
the pad regions of the second downwardly stepped region of the second stacked region are positioned on a same high level as the pad regions adjacent to the second downwardly stepped region of the second stacked region, among the pad regions of the first downwardly stepped region of the second stacked region.

8. The three-dimensional semiconductor device according to claim 7, wherein:
the pad regions of the first upwardly stepped region of the third stacked region are lowered from the first downwardly stepped region of the second stacked region in a unit of a third height, and then raised in a unit of the second height in the first direction,
the pad regions of the first downwardly stepped region of the third stacked region are lowered from the first upwardly stepped region of the third stacked region in a unit of the third height, and then lowered in a unit of the second height in the first direction,
the pad regions of the second downwardly stepped region of the third stacked region are lowered from the second upwardly stepped region of the third stacked region in a unit of the third height, and then lowered in a unit of the second height in the first direction, and
the third height is higher than the second height.

9. The three-dimensional semiconductor device according to claim 1, wherein:
the third stacked region includes a plurality of stacked portions, and
each of the stacked portions includes an upwardly stepped region of the third stacked region and a downwardly stepped region of the third stacked region which are sequentially arranged in the first direction.

10. The three-dimensional semiconductor device according to claim 9, wherein:
the plurality of stacked portions includes a first stacked portion adjacent to the second stacked region, and an nth stacked portion positioned 'nth' from the first stacked portion in the first direction,
the first stacked portion includes an upwardly stepped region in which the pad regions are lowered from the second stacked region in a unit of a third height, and then raised in a unit of a second height,
the nth stacked portion includes an upwardly stepped region in which the pad regions are lowered from the downwardly stepped region of the (n−1)th stacked portion in a unit of a third height, and then raised in a unit of a second height, and
where 'n' is a positive integer greater than 2.

11. The three-dimensional semiconductor device according to claim 10, wherein a slope of a region lowered in a unit of the third height between the first stacked portion and the second stacked region is different from a slope of a region lowered in a unit of the third height between the (n−1)th stacked portion and the nth stacked portion.

12. A three-dimensional semiconductor device comprising:
a lower structure;
a stacked structure disposed on the lower structure, and including gate patterns stacked in a vertical direction, perpendicular to an upper surface of the lower structure; and
vertical channel structures disposed on the lower structure and having a side surface facing the gate patterns, wherein:
the stacked structure includes an upwardly stepped region in which pad regions that are raised in a first direction are positioned, and a downwardly stepped region in which pad regions lowered in the first direction are positioned,
the upwardly stepped region and the downwardly stepped region are sequentially arranged in the first direction,
the upwardly stepped region includes a first upwardly stepped region and a second upwardly stepped region, positioned on different height levels and are sequentially arranged in a second direction,
the downwardly stepped region includes a first downwardly stepped region and a second downwardly stepped region, positioned on different height levels and are sequentially arranged in the second direction, and
the second direction is parallel to an upper surface of the lower structure and perpendicular to the first direction.

13. The three-dimensional semiconductor device according to claim 12, wherein:
the first upwardly stepped region is a region in which pad regions that are raised in a unit of a first height in the second direction and in a unit of a second height higher than the first height in the first direction are positioned, and
the second upwardly stepped region is a region in which pad regions that are positioned on a level higher than the first upwardly stepped region and are raised in a unit of the second height in the first direction are positioned.

14. The three-dimensional semiconductor device according to claim 13, wherein:
the first downwardly stepped region is a region in which pad regions that are raised in a unit of the first height in the second direction and lowered in a unit of the second height in the first direction are positioned, and
the second downwardly stepped region is a region in which the pad regions that are positioned on a level higher than the first downwardly stepped region and are raised in a unit of the second height in the first direction are positioned.

15. A three-dimensional semiconductor device comprising:
a first gate group on a lower structure; and
a second gate group on the first gate group, wherein:
the first gate group includes first pad regions lowered in a first direction, parallel to an upper surface of the lower structure and that are raised in a second direction, parallel to an upper surface of the lower structure and perpendicular to the first direction, and
the second gate group includes second pad regions that are sequentially raised in the first direction and are raised in the second direction.

16. The three-dimensional semiconductor device according to claim 15, wherein:
each of the first and second gate groups includes:
first gate portions stacked and spaced in a vertical direction;

second gate portions stacked and spaced in the vertical direction; and connection patterns connecting the first gate portions and the second gate portions, and the first gate portion, the second gate portion, and the connection pattern positioned on a same plane among the first gate portions, the second gate portions and the connection patterns are formed one conductor electrically connected to each other.

17. The three-dimensional semiconductor device according to claim 15, wherein:

the first pad regions are disposed in a stepped structure that are raised in a unit of a first height in the second direction and that are lowered in a unit of a second height, greater than the first height in the first direction, and the second pad regions are disposed in a stepped structure that are raised in a unit of the first height in the second direction and that are raised in a unit of the second height in the first direction.

18. The three-dimensional semiconductor device according to claim 17, further comprising:

peripheral contact structures passing through the first and second gate groups, wherein:

the lower structure includes a first substrate, a peripheral circuit structure including peripheral pads on the first substrate, and a second substrate on the peripheral circuit structure, and the peripheral contact structures contact the peripheral pads.

19. The three-dimensional semiconductor device according to claim 18, further comprising:

an insulation region passing through the first and second gate groups, wherein the peripheral contact structures pass through the insulation region.

20. The three-dimensional semiconductor device according to claim 19, wherein:

the first pad regions include first lower pad regions positioned on a lowest level and first upper pad regions positioned on a highest level among the first pad regions disposed in the first direction, and the insulation region includes one or both of a first insulation region passing through at least a portion of the first lower pad regions and a second insulation region passing through at least a portion of the first upper pad regions.

* * * * *